(12) United States Patent
Matsumoto et al.

(10) Patent No.: US 10,751,832 B2
(45) Date of Patent: Aug. 25, 2020

(54) OPTICAL NON-DESTRUCTIVE INSPECTION METHOD AND OPTICAL NON-DESTRUCTIVE INSPECTION APPARATUS

(71) Applicant: JTEKT CORPORATION, Osaka-shi, Osaka (JP)

(72) Inventors: Naoki Matsumoto, Okazaki (JP); Ryota Umezawa, Nishio (JP); Daisuke Kuroda, Okazaki (JP); Hiroshi Ohara, Chiryu (JP)

(73) Assignee: JTEKT CORPORATION, Osaka-shi (JP)

( * ) Notice: Subject to any disclaimer, the term of this patent is extended or adjusted under 35 U.S.C. 154(b) by 222 days.

(21) Appl. No.: 16/032,364

(22) Filed: Jul. 11, 2018

(65) Prior Publication Data
US 2019/0022792 A1    Jan. 24, 2019

(30) Foreign Application Priority Data

Jul. 18, 2017  (JP) .................................. 2017-139485
Feb. 23, 2018  (JP) .................................. 2018-031134

(51) Int. Cl.
*B23K 26/03* (2006.01)
*G01N 25/72* (2006.01)
(Continued)

(52) U.S. Cl.
CPC .......... *B23K 26/032* (2013.01); *B23K 26/034* (2013.01); *B23K 26/0626* (2013.01);
(Continued)

(58) Field of Classification Search
CPC .. B23K 26/032; B23K 26/211; B23K 26/034; B23K 26/0626; H01L 22/12;
(Continued)

(56) References Cited

U.S. PATENT DOCUMENTS

2010/0147328 A1   6/2010  Shindou
2014/0321497 A1*  10/2014 Matsumoto ............ G01R 31/71
                                                             374/1
2017/0199080 A1   7/2017  Matsumoto et al.

FOREIGN PATENT DOCUMENTS

JP   2014-228478 A    12/2014
WO   2012/172524 A1   12/2012

OTHER PUBLICATIONS

Jan. 2, 2019 Extended Search Report issued in European Patent Application No. 18183718.8.

* cited by examiner

*Primary Examiner* — Phuong T Nguyen
(74) *Attorney, Agent, or Firm* — Oliff PLC

(57) ABSTRACT

An optical non-destructive inspection method includes: a heating laser emission step; an information acquisition step of acquiring measurement point information and heating laser information; a joint state determination step of determining the joint state on the basis of the measurement point information and the heating laser information; and a preliminary heating step, which is performed before the heating laser emission step, of causing thermal distortion in a first member by irradiating a measurement point, or a preliminary heating range that includes the measurement point, or a preliminary heating point set in the preliminary heating range, with preliminary heating laser adjusted to a thermal distortion generation intensity, which is a constant output intensity, and an irradiation time such that the thermal distortion is caused without destroying the first member.

10 Claims, 44 Drawing Sheets

(51) Int. Cl.
*H01L 23/00* (2006.01)
*H01L 21/66* (2006.01)
*B23K 26/211* (2014.01)
*B23K 26/06* (2014.01)

(52) U.S. Cl.
CPC ............ *B23K 26/211* (2015.10); *G01N 25/72* (2013.01); *H01L 22/12* (2013.01); *H01L 24/48* (2013.01); *H01L 24/85* (2013.01); *H01L 24/29* (2013.01); *H01L 24/32* (2013.01); *H01L 24/45* (2013.01); *H01L 2224/2919* (2013.01); *H01L 2224/29078* (2013.01); *H01L 2224/32227* (2013.01); *H01L 2224/45124* (2013.01); *H01L 2224/48227* (2013.01); *H01L 2224/48472* (2013.01); *H01L 2224/73265* (2013.01); *H01L 2224/859* (2013.01); *H01L 2224/85447* (2013.01)

(58) Field of Classification Search
CPC ......... H01L 24/48; H01L 24/85; H01L 24/29; H01L 24/32; H01L 24/45; H01L 2224/29078; H01L 2224/2919; H01L 2224/32227; H01L 2224/45124; H01L 2224/48227; H01L 2224/48472; H01L 2224/73265; H01L 2224/85447; H01L 2224/859
USPC ............ 219/121.62, 121.63, 121.64, 121.78, 219/121.83, 121.85
See application file for complete search history.

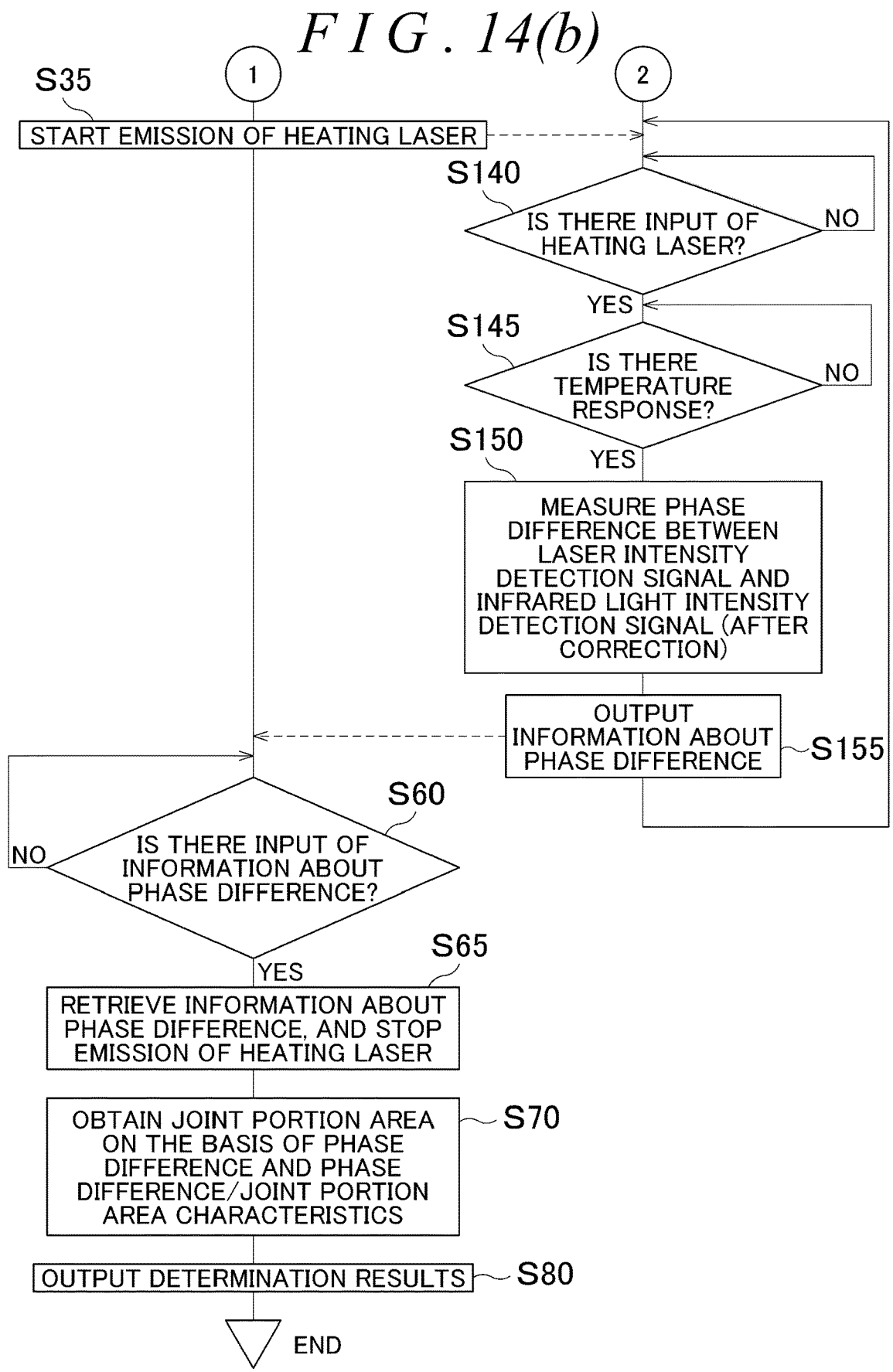

FIG. 15

| PRODUCT NUMBER | PRELIMINARY HEATING PATTERN | PRELIMINARY HEATING LASER OUTPUT [W] | PRELIMINARY HEATING TIME [ms] | STAND-BY TIME [ms] | HEATING LASER OUTPUT [W] | HEATING LASER FREQUENCY [Hz] | MEASUREMENT TIME [ms] | PHASE DIFFERENCE/JOINT PORTION AREA CHARACTERISTICS | MINIMUM ALLOWABLE AREA | MAXIMUM ALLOWABLE AREA |
|---|---|---|---|---|---|---|---|---|---|---|
| A | PATTERN 1 | A1 | A2 | A3 | A4 | A5 | A6 | CHARACTERISTICS A7 | A8 | A9 |
| B | PATTERN 2 | B1 | B2 | B3 | B4 | B5 | B6 | CHARACTERISTICS B7 | B8 | B9 |
| C | PATTERN 3 | C1 | C2 | C3 | C4 | C5 | C6 | CHARACTERISTICS C7 | C8 | C9 |
| ‥ | ‥ | ‥ | ‥ | ‥ | ‥ | ‥ | ‥ | ‥ | ‥ | ‥ |

| PRODUCT NUMBER | PRELIMINARY HEATING PATTERN | PRELIMINARY HEATING LASER OUTPUT [W] | PRELIMINARY HEATING TIME [ms] | STAND-BY TIME [ms] | HEATING LASER OUTPUT [W] | MEASUREMENT TIME [ms] | NORMALIZED SATURATION TEMPERATURE | NORMALIZED TEMPERATURE RISE CHARACTERISTICS |
|---|---|---|---|---|---|---|---|---|
| A | PATTERN 1 | A1 | A2 | A3 | A11 | A12 | A13 | CHARACTERISTICS A14 |
| B | PATTERN 2 | B1 | B2 | B3 | B11 | B12 | B13 | CHARACTERISTICS B14 |
| C | PATTERN 3 | C1 | C2 | C3 | C11 | C12 | C13 | CHARACTERISTICS C14 |
| ⋮ | ⋮ | ⋮ | ⋮ | ⋮ | ⋮ | ⋮ | ⋮ | ⋮ |

H2

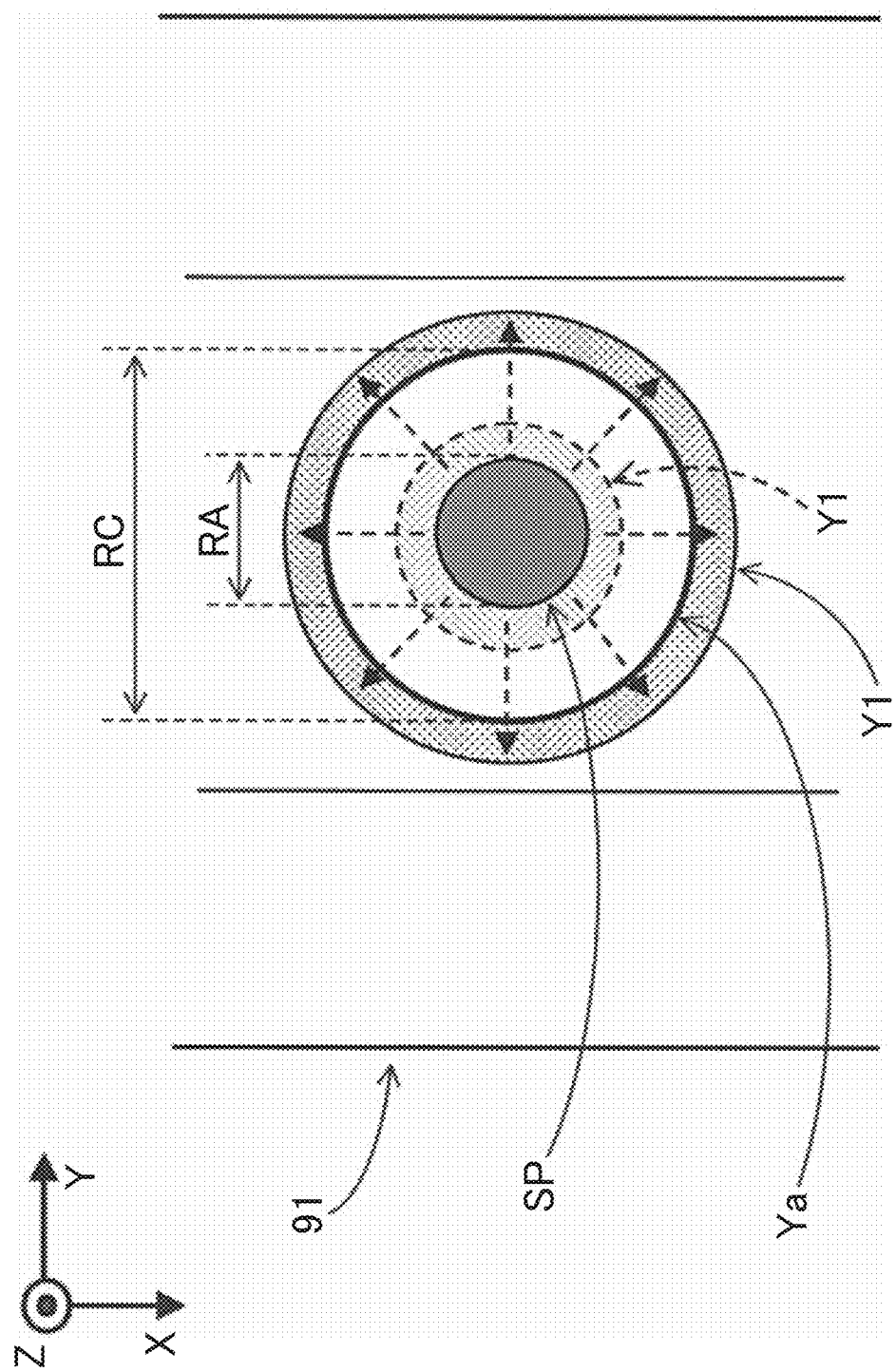

FIG. 37

| PRODUCT NUMBER | SURFACE FOREIGN MATTER REMOVAL LASER OUTPUT [W] | SURFACE FOREIGN MATTER REMOVAL LASER IRRADIATION TIME [ms] | SURFACE FOREIGN MATTER REMOVAL LASER IRRADIATION DIAMETER [μm] | STANDBY TIME 1 [ms] | PRELIMINARY HEATING PATTERN | PRELIMINARY HEATING LASER OUTPUT [W] | PRELIMINARY HEATING TIME [ms] | STANDBY TIME [ms] | HEATING LASER OUTPUT [W] | HEATING LASER FREQUENCY [Hz] | MEASUREMENT TIME [ms] | PHASE DIFFERENCE/JOINT PORTION AREA CHARACTERISTICS | MINIMUM ALLOWABLE AREA | MAXIMUM ALLOWABLE AREA |
|---|---|---|---|---|---|---|---|---|---|---|---|---|---|---|
| A | A01 | A02 | A03 | A04 | PATTERN 1 | A1 | A2 | A3 | A4 | A5 | A6 | CHARACTERISTICS A7 | A8 | A9 |
| B | B01 | B02 | B03 | B04 | PATTERN 2 | B1 | B2 | B3 | B4 | B5 | B6 | CHARACTERISTICS B7 | B8 | B9 |
| C | C01 | C02 | C03 | C04 | PATTERN 3 | C1 | C2 | C3 | C4 | C5 | C6 | CHARACTERISTICS C7 | C8 | C9 |
| .. | .. | .. | .. | .. | .. | .. | .. | .. | .. | .. | .. | .. | .. | .. |

H01  
H01A

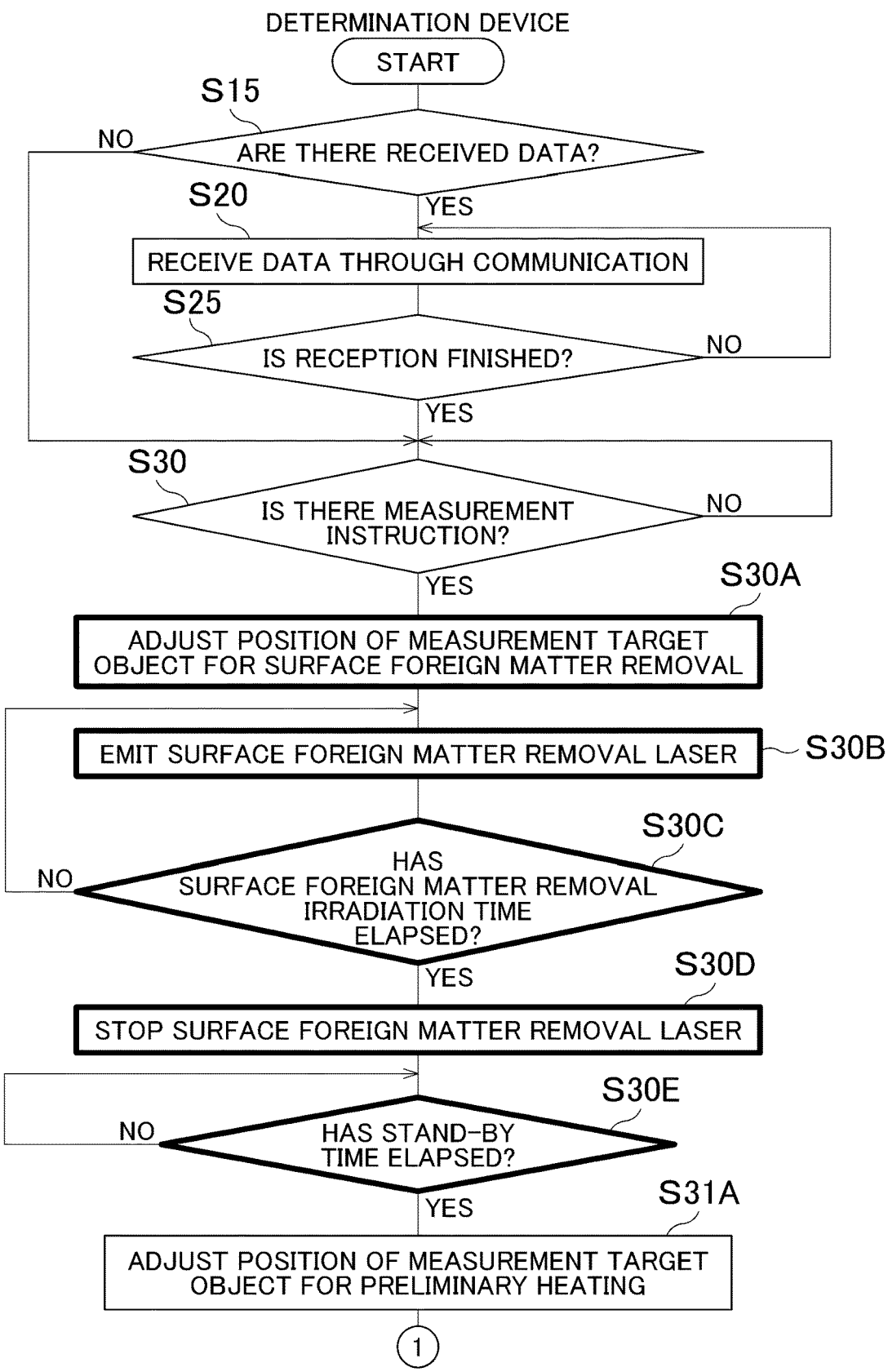

| PRODUCT NUMBER | SURFACE FOREIGN MATTER REMOVAL LASER OUTPUT [W] | SURFACE FOREIGN MATTER REMOVAL LASER IRRADIATION TIME [ms] | SURFACE FOREIGN MATTER REMOVAL LASER IRRADIATION DIAMETER [μm] | STANDBY TIME 1 [ms] | PRELIMINARY HEATING PATTERN | PRELIMINARY HEATING LASER OUTPUT [W] | PRELIMINARY HEATING TIME [ms] | STANDBY TIME [ms] | HEATING LASER OUTPUT [W] | MEASUREMENT TIME [ms] | NORMALIZED SATURATION TEMPERATURE | NORMALIZED TEMPERATURE RISE CHARACTERISTICS |
|---|---|---|---|---|---|---|---|---|---|---|---|---|
| A | A01 | A02 | A03 | A04 | PATTERN 1 | A1 | A2 | A3 | A11 | A12 | A13 | CHARACTERISTICS A14 |
| B | B01 | B02 | B03 | B04 | PATTERN 2 | B1 | B2 | B3 | B11 | B12 | B13 | CHARACTERISTICS B14 |
| C | C01 | C02 | C03 | C04 | PATTERN 3 | C1 | C2 | C3 | C11 | C12 | C13 | CHARACTERISTICS C14 |
| .. | .. | .. | .. | .. | .. | .. | .. | .. | .. | .. | .. | .. |

H02A

OPTICAL NON-DESTRUCTIVE INSPECTION METHOD AND OPTICAL NON-DESTRUCTIVE INSPECTION APPARATUS

INCORPORATION BY REFERENCE

The disclosure of Japanese Patent Application No. 2017-139485 filed on Jul. 18, 2017 and No. 2018-031134 filed on Feb. 23, 2018 including the specification, drawings and abstract, is incorporated herein by reference in its entirety.

BACKGROUND OF THE INVENTION

1. Field of the Invention

The present invention relates to an optical non-destructive inspection method and an optical non-destructive inspection apparatus that obtain, optically and in a non-destructive manner, the joint state of a joint portion on the joint interface between a first member and a second member of a measurement target object, the first member and the second member being joined to each other on the joint interface or being joined to each other with a joint member interposed therebetween on the joint interface.

2. Description of the Related Art

In Japanese Patent Application Publication No. 2014-228478 (JP 2014-228478 A), for example, a measurement point set on the surface of a first member, of the first member and a second member joined to each other on the joint interface, is irradiated with laser with higher power than heating laser for obtaining the joint portion area for a short period of time to form an oxide film at the measurement point before the measurement point is irradiated with the heating laser to measure the temperature rise characteristics. The oxide film stably has a significantly high absorptivity (emissivity), has a stable surface roughness, and provides a significantly low reflectivity. In the case where the oxide film is not formed at the measurement point, the surface roughness at the measurement point is fluctuated among measurement target objects. Therefore, the temperature rise characteristics during irradiation with the heating laser differ among the measurement target objects. Thus, in the case where the oxide film is not formed at the measurement point, the signal-to-noise (S/N) ratio is fluctuated relatively significantly among the measurement target objects. In JP 2014-228478 A, the measurement point is irradiated with the heating laser to measure the temperature rise characteristics after the oxide film is formed at the measurement point. As a result, fluctuations in the surface roughness at the measurement point among the measurement target objects can be suppressed to obtain measurement results with a higher S/N ratio.

When the joint state is obtained by irradiating the measurement point with the heating laser, the obtained joint state may be fluctuated relatively significantly if the joint state is obtained a plurality of times for an identical measurement target object. For example, the joint portion area in the joint state which is obtained in a second measurement may be smaller than the joint portion area in the joint state which is obtained in a first measurement, even for an identical measurement target object. Such fluctuations in the joint portion area (joint state) for an identical measurement target object are considered to be caused by the [region B] described below transitioning between a contact state and a separate state.

For example, regarding fluctuations in the joint portion area (joint state), in the case of diffusion bonding, the following three regions ([region A] to [region C]) are provided on the joint surface between the first member and the second member.

[Region A]: a "region in a stable contact state", in which the first member and the second member are appropriately joined to, without separating from, each other to always contact each other with atoms sufficiently diffused.

[Region B]: a "region in an unstable contact state", in which the first member and the second member are not joined to each other to contact or be separate from each other.

[Region C]: a "region in a stable non-contact state", in which the first member and the second member are not joined to each other to be always separate from each other.

In the optical non-destructive inspection method described in JP 2014-228478 A, the measurement point is irradiated with high-power laser for a short period of time in order to form an oxide film at the measurement point. However, it is significantly difficult to eliminate the [region B] described above. That is, the [region B] described above cannot be eliminated but remains, and thus the method is not very preferable in that the obtained joint portion area (joint state) may be fluctuated significantly.

SUMMARY OF THE INVENTION

It is an object of the present invention to provide an optical non-destructive inspection method and an optical non-destructive inspection apparatus that can acquire and determine a more stable joint state by suppressing fluctuations in the joint state better in the case where the joint state between a first member and a second member is determined on the basis of temperature variations at a measurement point set on the first member that occur when the measurement point is irradiated with heating laser.

An aspect of the present invention provides an optical non-destructive inspection method of determining a joint state of a joint portion on a joint interface between a first member and a second member of a measurement target object on the basis of measurement point information acquired from a measurement point set on a surface of the first member by irradiating the measurement point with heating laser, or on the basis of heating laser information about the heating laser and the measurement point information, the first member and the second member being joined to each other on the joint interface or being joined to each other with a joint member interposed therebetween on the joint interface. The optical non-destructive inspection method includes: a heating laser emission step of emitting the heating laser toward the measurement point to heat the measurement point; an information acquisition step of acquiring the measurement point information which includes an intensity of infrared light radiated from the measurement point, or an information acquisition step of acquiring the measurement point information which includes an intensity of infrared light radiated from the measurement point and the heating laser information which includes an intensity of the heating laser which is radiated toward the measurement point; a joint state determination step of determining the joint state of the joint portion on the joint interface using acquisition-associated information based on the measurement point information, or the measurement point information and the heating laser information, acquired in the information acquisition step. The method also includes a preliminary heating step, which is performed before the heating laser emission step, of causing thermal distortion in the first member by irradiating the measurement point, or a preliminary heating range that includes the measurement point, or one or a plurality of preliminary heating points set in advance in the preliminary heating range, with preliminary heating laser adjusted to a thermal distortion generation intensity, which is a constant output intensity, and an irradiation time such that thermal distortion is caused in the first member without destroying the first member.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIG. 14(a) and FIG. 14(b) are a flowchart illustrating an example of the process procedure for a determination device and a phase difference detection device according to the first embodiment;

FIG. 15 illustrates an example of determination information in which various pieces of information are stored for each product number (each measurement target object);

FIG. 22 illustrates an example of determination information in which various pieces of information are stored for each product number (each measurement target object);

FIG. 35 illustrates an example of the outside diameter of the measurement point, the outside diameter of the fused foreign matter which is deposited around the measurement point, and the irradiation diameter of the surface foreign matter removal laser;

FIG. 37 illustrates an example of determination information in which various pieces of information are stored for each product number (each measurement target object) according to the sixth embodiment;

FIG. 39(a) and FIG. 39(b) are a flowchart illustrating an example of the process procedure for a determination device according to a seventh embodiment (obtained by adding a surface foreign matter removal process to the second embodiment);

FIG. 40 illustrates an example of determination information in which various pieces of information are stored for each product number (each measurement target object) according to the seventh embodiment.

DETAILED DESCRIPTION OF EMBODIMENTS

Figure 1:
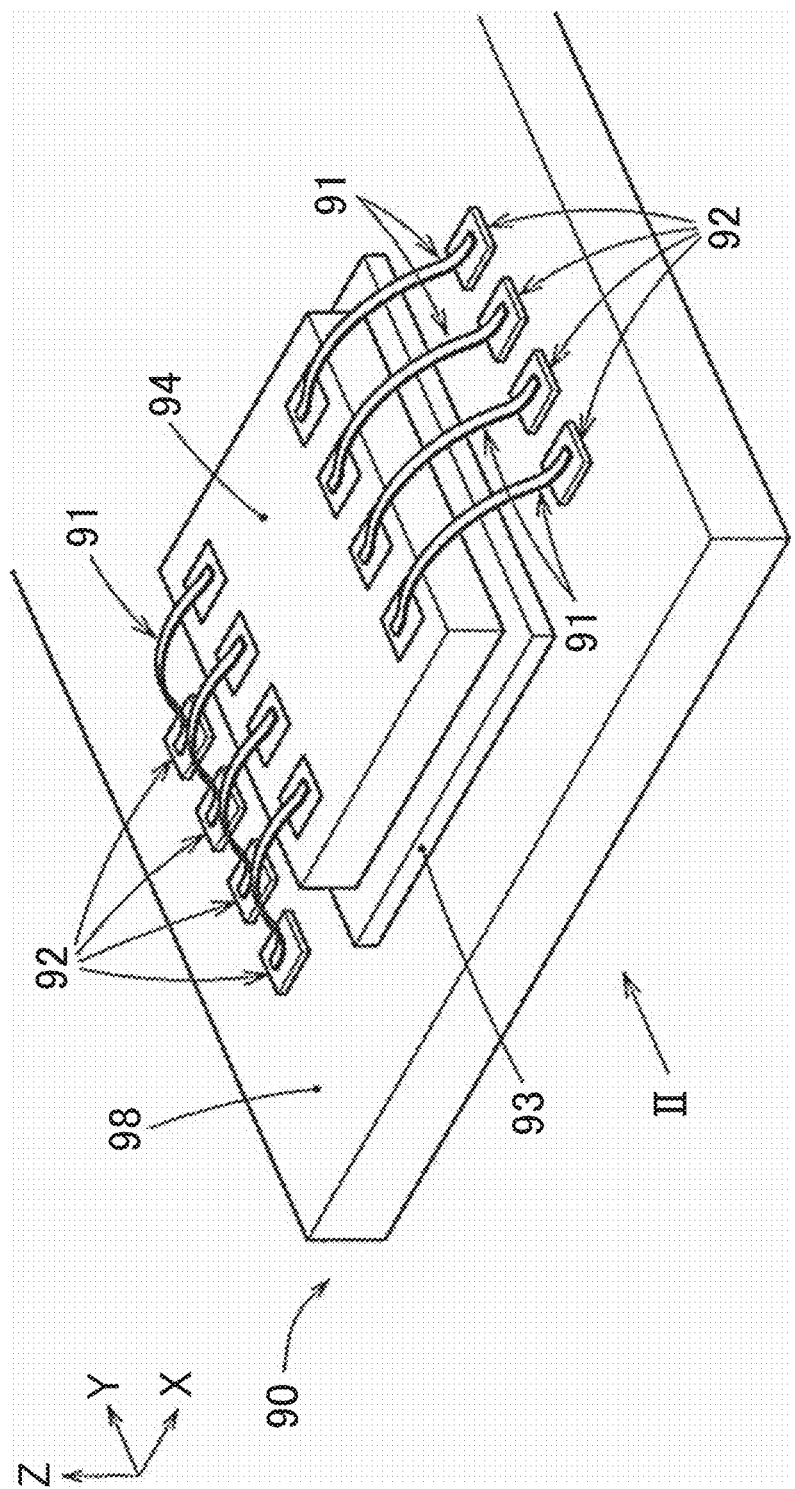
FIG. 1 is a perspective view illustrating an example of a measurement target object, illustrating an electronic part in which a wire is joined to an electrode by wire bonding.
Figure 3:
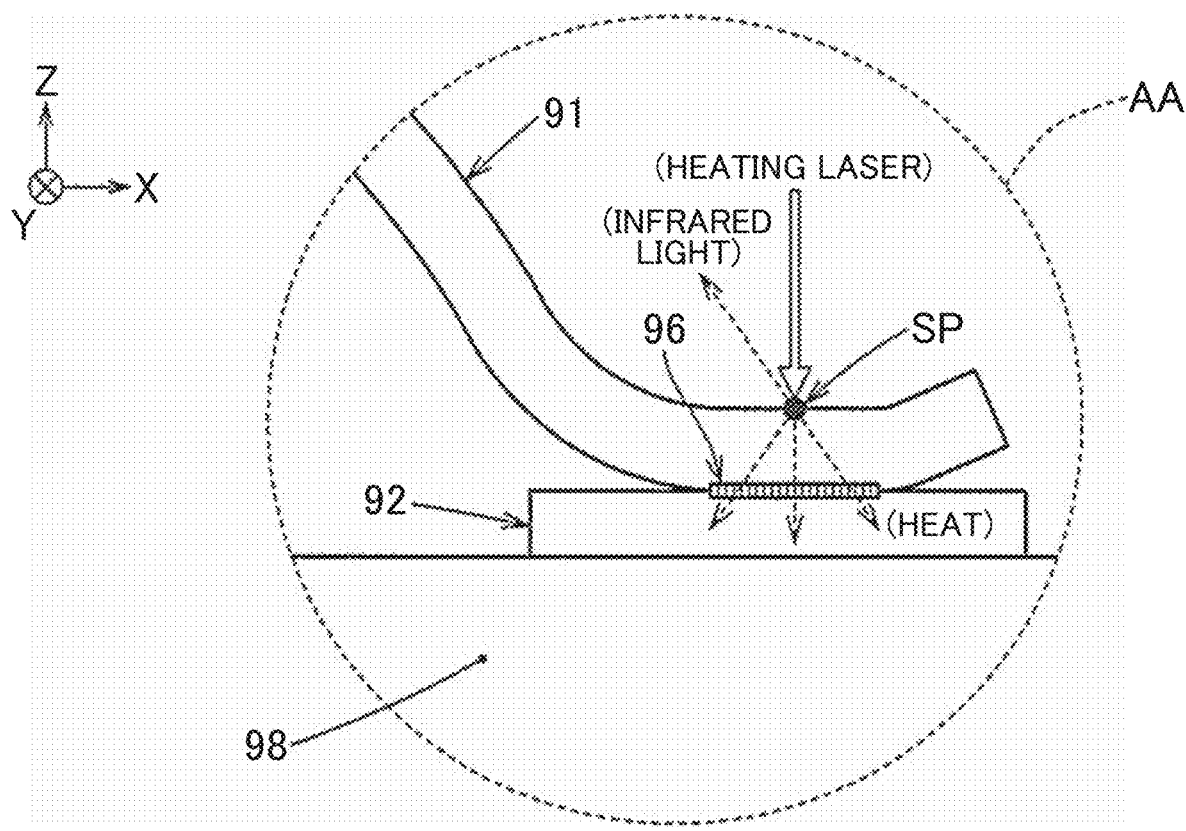
FIG. 3 is an enlarged view of an AA portion illustrated in FIG. 2, illustrating an example of heat conduction and infrared radiation during irradiation of a measurement point of the wire which is joined to the electrode with infrared light.

An optical non-destructive inspection apparatus and an optical non-destructive inspection method according to first to seventh embodiments of the present invention will be sequentially described below with reference to the drawings. In the first to seventh embodiments described below, as illustrated in FIG. 1, a wire 91 (such as an aluminum wire, corresponding to a first member) is joined to an electrode 92 (corresponding to a second member) of an electronic part such as an integrated circuit (IC). In the first to seventh embodiments, a measurement point set on the first member is irradiated with heating laser. Then, the joint portion area, which is the area of a joint portion on the joint interface between the first member and the second member, is obtained on the basis of measurement point information acquired from the measurement point, or the measurement point information and heating laser information about the heating laser. The phrase "joint portion on the joint interface" as used in this case refers to a joint portion 96, which is a planar region in which the first member (wire 91) and the second member (electrode 92) are joined to each other as illustrated in FIG. 3.

The information about the heating laser includes the intensity of the heating laser which is radiated to a measurement point SP in the first embodiment (see FIG. 5) over the lapse of time. The measurement point information which is acquired from the measurement point SP includes the intensity of infrared light radiated from the measurement point SP in the first embodiment (see FIG. 5), the second embodiment (see FIG. 20), or the fourth embodiment (see FIG. 30) over the lapse of time. The measurement point information which is acquired from the measurement point SP in the third embodiment (see FIG. 29) includes the intensity of infrared light radiated from the measurement point SP over the lapse of time, and the intensity of heating laser reflected at the measurement point SP over the lapse of time.

In the case where the X axis, the Y axis, and the Z axis are indicated in the drawings described later, the X axis, the Y axis, and the Z axis are orthogonal to each other, with the Z axis directed vertically upward and with the X axis and the Y axis directed horizontally.

Figure 2:
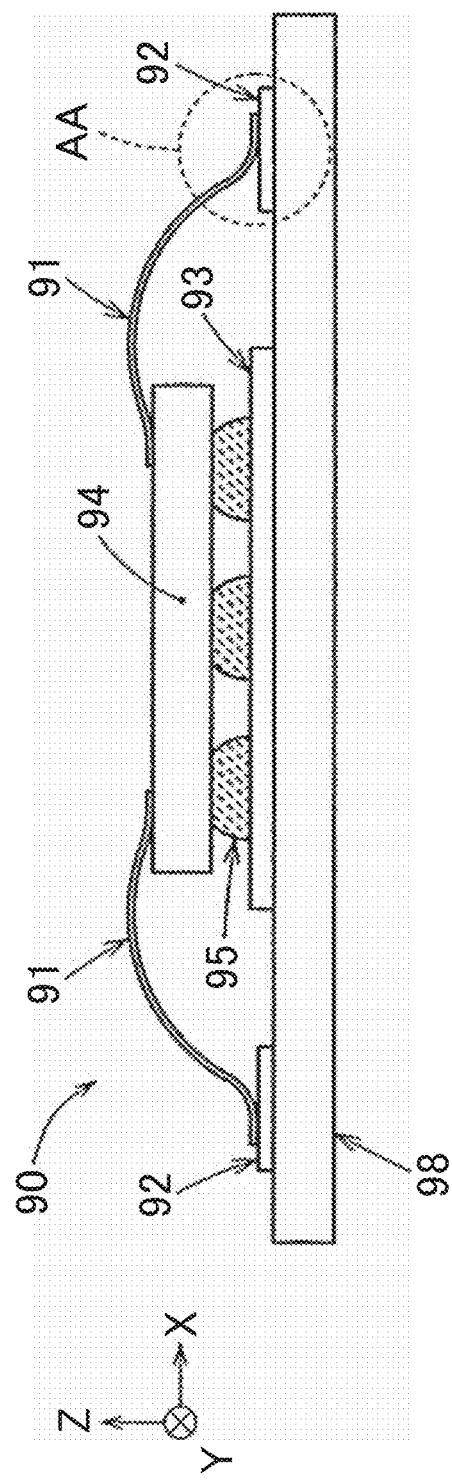
FIG. 2 illustrates the electronic part illustrated in FIG. 1 as seen from the II direction.

An example of a measurement target object 90 will be described with reference to FIGS. 1 to 3. FIG. 1 is a perspective view illustrating a state in which one end of the wire 91 such as an aluminum wire with a diameter (width) of about several tens to several hundreds of micrometers [μm] is joined, by wire bonding, to the electrode 92 such as a copper foil provided on a substrate 98, and in which the other end of the wire 91 is joined, by wire bonding, to a terminal of a semiconductor chip 94 fixed onto a base 93 on the substrate 98 using an adhesive 95 or the like. FIG. 2 illustrates the electronic part of FIG. 1 as seen from the II direction. FIG. 3 is an enlarged view of an AA portion in FIG. 2. The wire 91 corresponds to the first member. The electrode 92 corresponds to the second member.

In order to determine whether or not the wire 91 is appropriately joined to the electrode 92, it is only necessary to determine whether or not the joint state (internal state) is good by determining whether or not the joint portion area (the area over which the wire 91 and the electrode 92 are joined to each other), which is the area of the joint portion 96 (see FIG. 3), falls within an allowable range. Thus, as illustrated in FIG. 3, the measurement point SP is set on the surface of the wire 91 in the vicinity of the joint portion, and the measurement point SP is irradiated with heating laser to be heated. Then, the temperature at the measurement point SP is gradually raised, and heat is propagated from the measurement point SP to the electrode 92 by way of the wire 91 and the joint portion 96. In addition, infrared light that matches the raised temperature is radiated from the measurement point SP. In the first to fourth embodiments described later, an example in which the joint portion area of the joint portion between the electrode 92 and the wire 91 in the measurement target object 90 illustrated in FIGS. 1 to 3 is obtained will be described.

Figure 4:
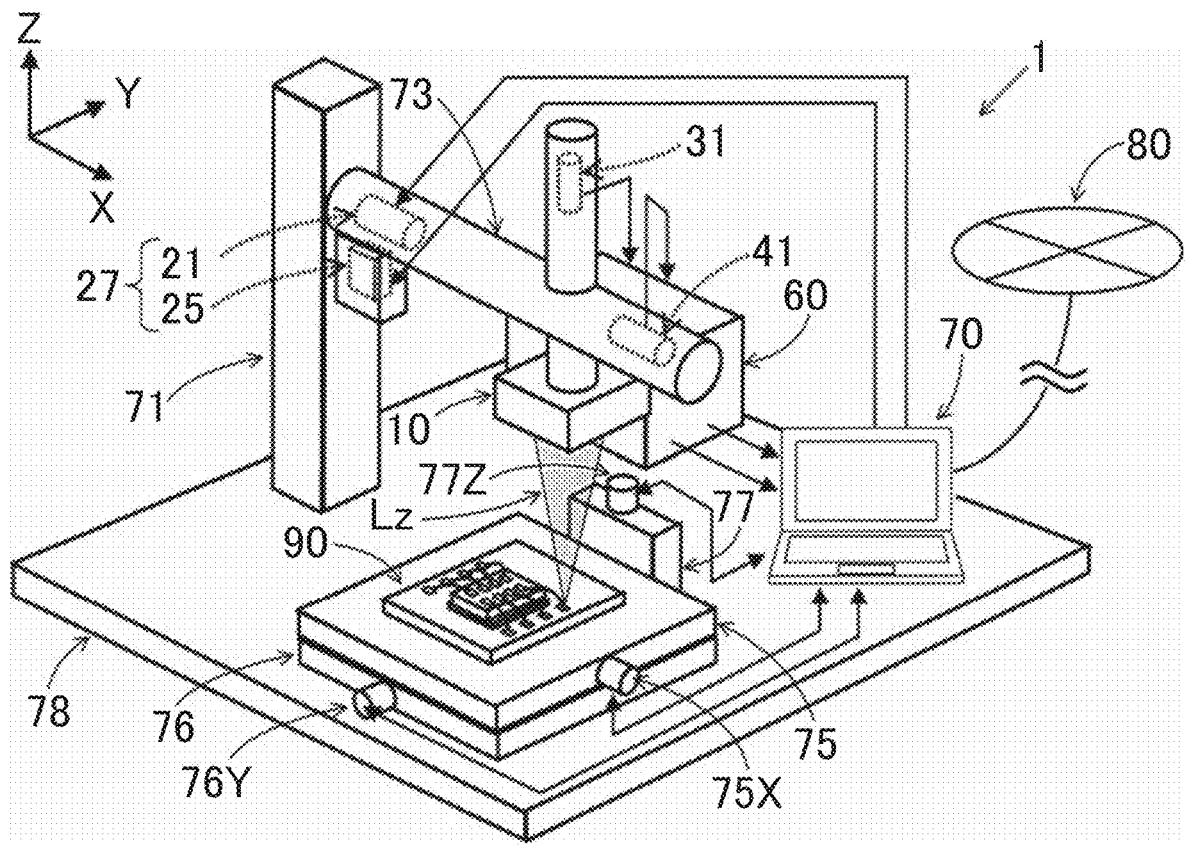
FIG. 4 is a perspective view illustrating an example of the appearance of an optical non-destructive inspection apparatus according to a first embodiment.
Figure 5:
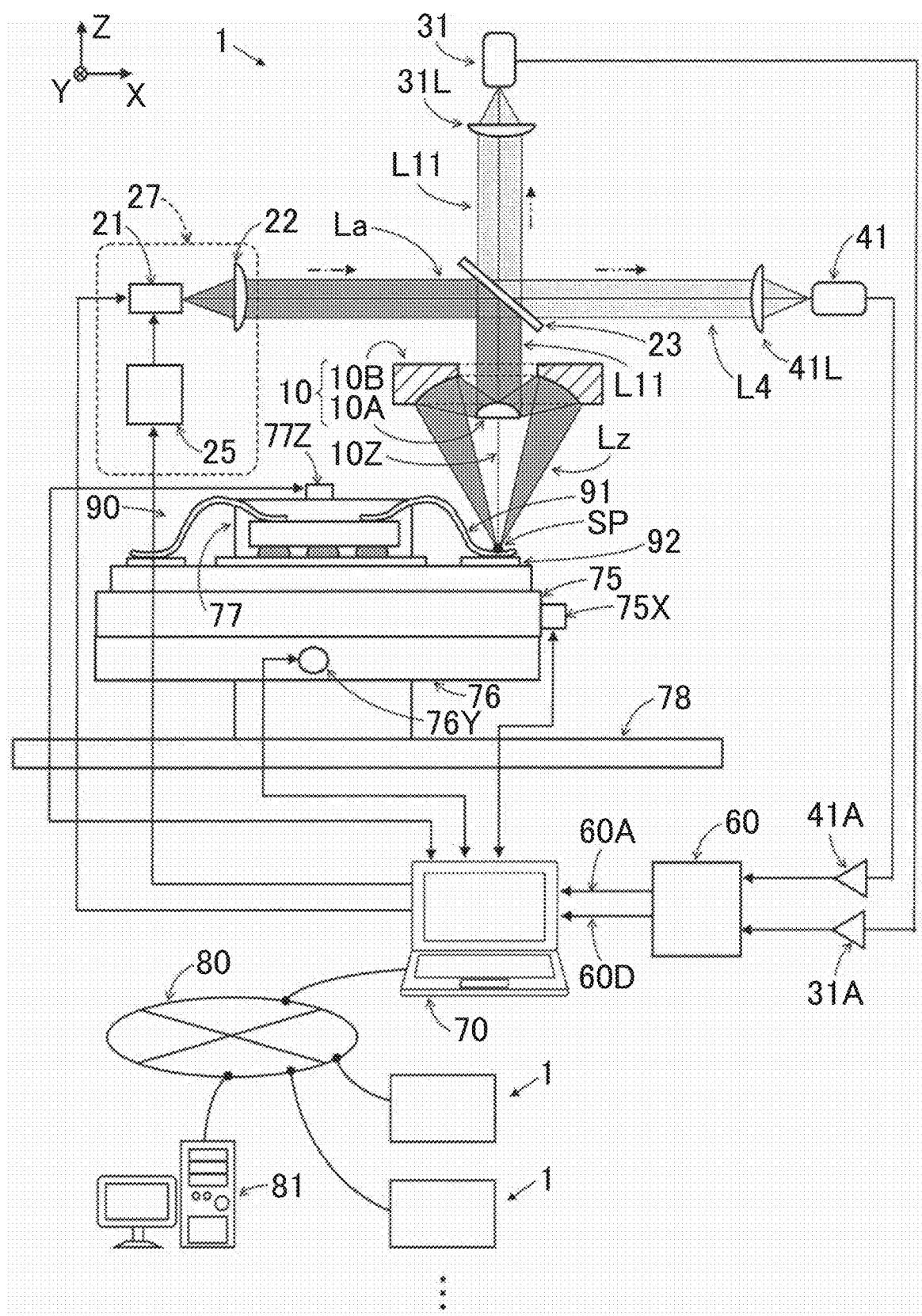
FIG. 5 illustrates an overall configuration of the optical non-destructive inspection apparatus according to the first embodiment illustrated in FIG. 4.

FIG. 4 is a perspective view illustrating the appearance of an optical non-destructive inspection apparatus 1 according to the first embodiment. FIG. 5 illustrates an example of an overall configuration of the optical non-destructive inspection apparatus 1 illustrated in FIG. 4. In the optical non-destructive inspection apparatus 1 according to the first embodiment, a measurement point is irradiated with laser light emitted from a laser light source (in this case, a semiconductor laser light source 21) with the intensity of the laser light itself varied sinusoidally. The optical non-destructive inspection apparatus 1 obtains the joint portion area of the measurement target object on the basis of the phase difference between the intensity of the heating laser which is radiated to the measurement point and varied sinusoidally and the intensity of the infrared light which is radiated from the measurement point and varied sinusoidally. A determination device 70 determines whether or not the joint state is good by determining whether or not the obtained joint portion area falls within the allowable range.

As illustrated in FIGS. 4 and 5, an optical non-destructive inspection apparatus 1 according to the first embodiment includes a platform 78, a support portion 71, a laser head portion 73, an X-axis direction slide table 75, an X-axis direction moving unit 75X, a Y-axis direction slide table 76, a Y-axis direction moving unit 76Y, a Z-axis direction support body 77, a Z-axis direction moving unit 77Z, a phase difference detection device 60, the determination device 70, and so forth. A measurement target object (in this case, the measurement target object 90 illustrated in the example of FIG. 1) is fixed to the X-axis direction slide table 75.

As illustrated in FIGS. 4 and 5, the Z-axis direction support body 77 is fixed to the platform 78, and the Z-axis direction support body 77 is provided with the Z-axis direction moving unit 77Z (such as an electric motor that includes an encoder), and the Y-axis direction slide table 76 is attached to the Z-axis direction support body 77. The Z-axis direction moving unit 77Z moves the Y-axis direction slide table 76 with respect to the Z-axis direction support body 77 in the Z-axis direction on the basis of a control signal from the determination device 70, and outputs a movement amount detection signal that matches the movement amount to the determination device 70.

The Y-axis direction slide table 76 is provided with the Y-axis direction moving unit 76Y (such as an electric motor that includes an encoder), and the X-axis direction slide table 75 is attached to the Y-axis direction slide table 76. The Y-axis direction moving unit 76Y moves the Y-axis direction slide table 76 with respect to the Z-axis direction support body 77 in the Y-axis direction on the basis of a control signal from the determination device 70, and outputs a movement amount detection signal that matches the movement amount to the determination device 70.

The X-axis direction slide table 75 is provided with the X-axis direction moving unit 75X (such as an electric motor that includes an encoder). The X-axis direction moving unit 75X moves the X-axis direction slide table 75 with respect to the Y-axis direction slide table 76 in the X-axis direction on the basis of a control signal from the determination device 70, and outputs a movement amount detection signal that matches the movement amount to the determination device 70. As described above, the determination device 70 can move the measurement target object 90 with respect to the platform 78 in the X-axis direction, the Y-axis direction, and the Z-axis direction using the X-axis direction moving unit 75X, the Y-axis direction moving unit 76Y, and the Z-axis direction moving unit 77Z.

As illustrated in FIG. 4, the support portion 71 is fixed to the platform 78, and the support portion 71 holds the laser head portion 73. The laser head portion 73 has a laser output device 27, a light condensing unit 10 (a reflective objective lens in the example of FIG. 5), a laser intensity detection unit 41, an infrared light intensity detection unit 31, and so forth.

The laser output device 27 has a semiconductor laser light source 21, a collimating lens 22, and a modulation signal output unit 25, for example. The modulation signal output unit 25 is an oscillator, for example, and generates a modulation signal, the voltage of which is varied sinusoidally with a predetermined frequency and a predetermined amplitude, on the basis of a control signal from the determination device 70. The semiconductor laser light source 21 includes an intensity adjustment input for intensity adjustment. The modulation signal is input from the modulation signal output unit 25 to the intensity adjustment input. The semiconductor laser light source 21 emits heating laser La, the intensity of which is varied sinusoidally, on the basis of the modulation signal from the modulation signal output unit 25. The heating laser La which is emitted from the semiconductor laser light source 21 is converted into parallel light by the collimating lens 22, and reaches a heating laser selective reflection unit 23. In the case where the emitted heating laser is parallel light, the collimating lens 22 can be omitted. Thus, the intensity of the heating laser La, which is condensed at the measurement point SP, is varied sinusoidally, and the frequency of the heating laser La is synchronized with the frequency of the modulation signal. The output of the heating laser is adjusted to an output that allows the measurement target object 90 to be heated without being destroyed.

When a control signal for radiating preliminary heating laser with a thermal distortion generation intensity which is a constant output intensity and an adjusted irradiation time is input from the determination device 70, the laser output device 27 outputs preliminary heating laser with an intensity corresponding to the thermal distortion generation intensity and for a time corresponding to the irradiation time, in order to cause thermal distortion without destroying the wire 91 (first member) before emitting the heating laser. The wavelength of the preliminary heating laser is the same as the wavelength of the heating laser.

The light condensing unit 10 emits parallel light, which is incident from one side (from the upper side in the example of FIG. 5) along its own optical axis, from the other side (from the lower side in the example of FIG. 5) as condensed toward the measurement point SP which is set on the surface of the first member 91 as the focal position. The light condensing unit 10 emits light, which is radiated and reflected at the measurement point SP (as the focal position) and incident from the other side, from the one side after being converted into first measurement light L11 which is parallel light directed along its own optical axis. The light condensing unit 10 can be constituted of a light condensing lens that transmits and refracts light. Since light at a plurality of different wavelengths is to be handled, however, a light condensing lens that causes chromatic aberration is not very preferable. Thus, the light condensing unit is constituted from (aspherical) reflection mirrors 10A and 10B to prevent generation of chromatic aberration and support a wide band of wavelength. The light condensing unit 10 is preferably an objective lens.

The heating laser selective reflection unit 23 is disposed at a position at which the optical axis of the heating laser La which is emitted from the laser output device 27 and the optical axis of the light condensing unit 10 intersect each other. The heating laser selective reflection unit 23 is a dichroic mirror that reflects light at the wavelength of the heating laser La and that transmits light at wavelengths other than the wavelength of the heating laser, for example. In the example of FIG. 5, the heating laser selective reflection unit 23 transmits about a few percent (e.g. about 2%) of light at the wavelength of the heating laser La. The laser intensity detection unit 41 is disposed in the path of the heating laser La which has been transmitted. A heating laser guiding unit is constituted from the collimating lens 22 and the heating laser selective reflection unit 23. The heating laser guiding unit guides the heating laser La, which is emitted from the semiconductor laser light source 21, toward one side of the light condensing unit 10 after conversion into parallel light.

The laser intensity detection unit 41 is a photo sensor that is capable of detecting the energy (intensity) of light at the wavelength of the heating laser, for example. Heating laser L4 (the intensity of which is varied sinusoidally) transmitted through the heating laser selective reflection unit 23 is condensed by a light condensing lens 41L, and input to the laser intensity detection unit 41. A laser intensity detection signal output from the laser intensity detection unit 41 is amplified by a sensor amplifier 41A, for example, and input to the phase difference detection device 60.

The first measurement light L11 (measurement light that includes irradiated light reflected at the measurement point SP and infrared light radiated from the measurement point SP), which is converted into parallel light by the light condensing unit 10, includes infrared light at a predetermined wavelength radiated from the measurement point SP. The infrared light intensity detection unit 31 is disposed in the path of the first measurement light L11.

The infrared light intensity detection unit 31 is an infrared light sensor that is capable of detecting the energy (intensity) of infrared light at a predetermined wavelength, for example. Infrared light at a predetermined wavelength (the intensity of which is varied sinusoidally) included in the first measurement light L11 is condensed by a light condensing lens 31L, and input to the infrared light intensity detection unit 31. An infrared light intensity detection signal output from the infrared light intensity detection unit 31 is amplified by a sensor amplifier 31A, for example, and input to the phase difference detection device 60. An infrared light guiding unit is constituted from the heating laser selective reflection unit 23 and the light condensing lens 31L. The infrared light guiding unit guides infrared light at a predetermined wavelength, which is included in the parallel light which is radiated from the measurement point SP and emitted from the one side of the light condensing unit 10, to the infrared light intensity detection unit 31.

The sensor amplifier 31A is a voltage amplification circuit, for example, and outputs the input infrared light intensity detection signal with the amplitude (voltage level) thereof amplified. The sensor amplifier 31A may be omitted. The sensor amplifier 41A is a voltage amplification circuit, for example, and outputs the input laser intensity detection signal with the amplitude (voltage level) thereof amplified. The sensor amplifier 41A may be omitted.

The phase difference detection device 60 is a lock-in amplifier, for example. A sinusoidal detection signal (laser intensity detection signal) output from the laser intensity detection unit 41 and a sinusoidal detection signal (infrared light intensity detection signal) output from the infrared light intensity detection unit 31 are input to the phase difference detection device 60. The phase difference detection device 60 measures the phase difference between the sinusoidal laser intensity detection signal and the sinusoidal infrared light intensity detection signal, and outputs information about the measured phase difference to the determination device 70. The laser intensity detection signal which is output from the laser intensity detection unit 41 is a signal that matches the intensity of the heating laser La which is radiated to the measurement point SP, the intensity being varied sinusoidally. The infrared light intensity detection signal is a signal that matches the intensity of infrared light radiated from the measurement point SP, the intensity being varied sinusoidally. The phase difference described above includes information about the area of a joint portion on the joint interface. The phase difference detection device 60 outputs an analog signal such as the laser intensity detection signal and the infrared light intensity detection signal from an output path 60A, and outputs a digital signal for information that includes a value for the phase difference (information about the phase difference such as the time and the angle) and the peak voltage of the infrared light intensity detection signal from an output path 60D, for example.

The determination device 70 is a personal computer, for example, and outputs a control signal to the laser output device 27 and retrieves information about the phase difference etc. from the phase difference detection device 60. As discussed later, the determination device 70 obtains the joint portion area, which is the area of a joint portion on the joint interface, on the basis of the phase difference which is based on the retrieved information about the phase difference and the phase difference/joint portion area characteristics (for the measurement target object) which is stored. The details of the phase difference/joint portion area characteristics and the procedure for obtaining the joint portion area will be discussed later.

In the case where the optical non-destructive inspection apparatus 1 is provided in an establishment such as a facility, for example, it is convenient if the determination device 70 is connected to a communication line 80 in the establishment (e.g. an on-site LAN) to distribute determination information (see determination information H1 indicated in FIG. 15) (for the measurement target object) from a distribution device 81 (distribution server) connected to the communication line 80. The determination device 70 of the optical non-destructive inspection apparatus 1 stores the determination information (including the phase difference/joint portion area characteristics) which is received via the communication line 80. Such a configuration is particularly convenient in the case where a plurality of optical non-destructive inspection apparatuses 1 are provided in an establishment, since determination information can be received and stored in the plurality of optical non-destructive inspection apparatuses 1 easily without trouble, compared to a case where determination information is stored in each of the plurality of optical non-destructive inspection apparatuses 1.

If the joint portion area between the same wire 91 and electrode 92 is obtained a plurality of number of times by irradiating the measurement point SP of the measurement target object 90 with heating laser, the intensity of which is varied sinusoidally, using the optical non-destructive inspection apparatus 1 according to the first embodiment described with reference to FIGS. 4 and 5, there may be relatively large fluctuations in the obtained joint portion area. For example, the joint portion area which is obtained in a second measurement may be smaller than the joint portion area which is obtained in a first measurement for the same wire 91 and electrode 92. Such fluctuations in the joint portion area are considered to be caused by the [region B] described below transitioning between a contact state and a separate state.

Figure 6:
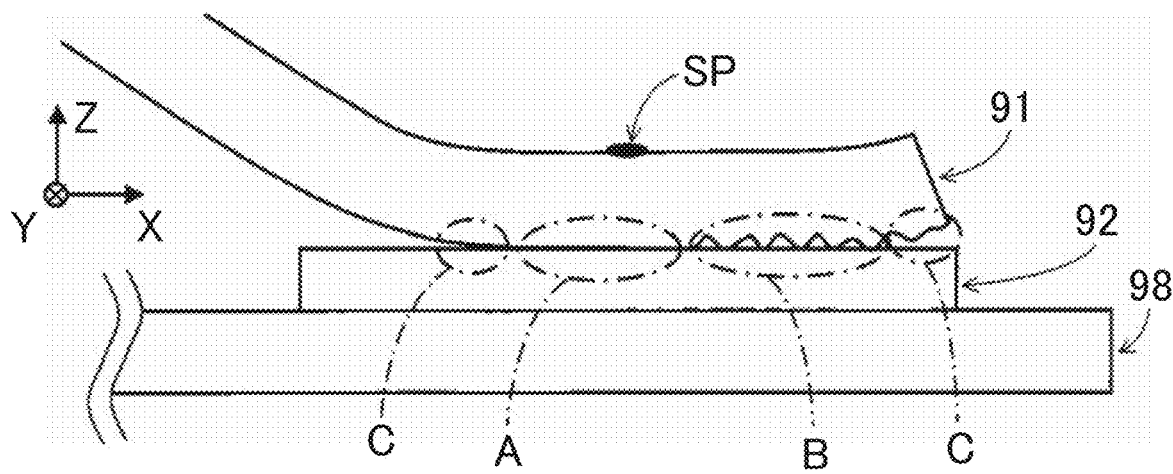
FIG. 6 illustrates an example of the wire which is joined to the electrode, illustrating the joint state (contact state) between the electrode and the wire on a joint surface.

FIG. 6 illustrates a further enlarged view of FIG. 3. The following three regions, namely [region A], [region B], and [region C], are provided on a joint surface over which the wire 91 and the electrode 92 face each other.

[Region A]: a [region in a stable contact state], in which the wire 91 (corresponding to the first member) and the electrode 92 (corresponding to the second member) are always maintained in a contact state (sufficiently joined state).

[Region B]: a [region in an unstable contact state], in which the wire 91 and the electrode 92 are not joined to each other to contact or be separate from each other.

[Region C]: a [region in a stable non-contact state (separate state)], in which the wire 91 and the electrode 92 are not joined to each other to be always maintained in a non-contact state (separate state).

Figure 7:
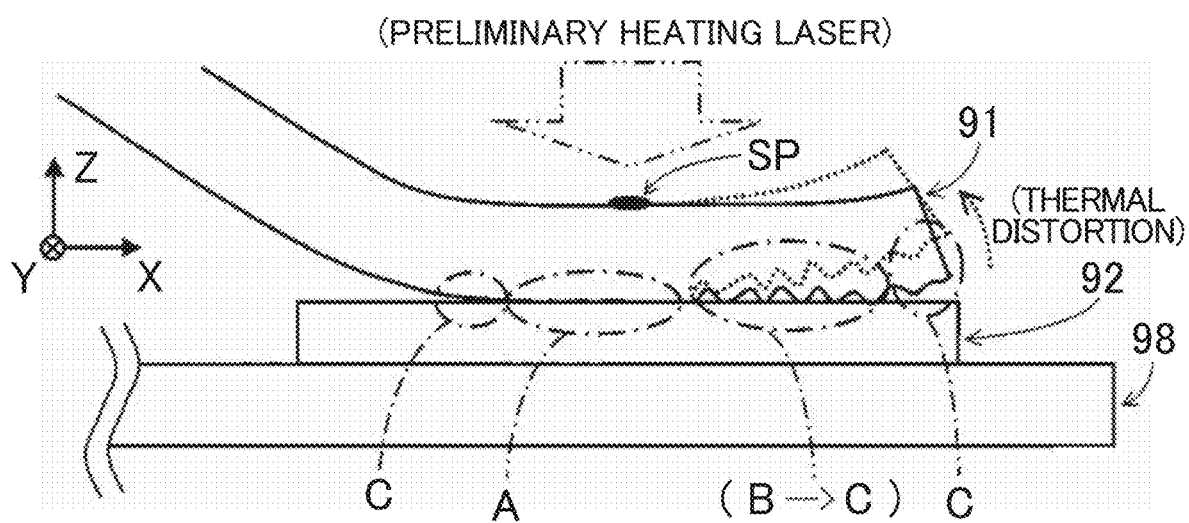
FIG. 7 illustrates an example in which the measurement point (or an area around the measurement point) in the state of FIG. 6 is irradiated with preliminary heating laser to cause thermal distortion of the wire (first member)

In order to suppress fluctuations in the joint portion area, it is necessary to eliminate the [region B] (a region in an unstable contact state) described above. Since it is significantly difficult to convert the [region B] into the [region A] after the joining process is finished, it is preferable to convert the [region B] into the [region C]. Thus, physical distortion (warp) is caused in the wire 91 (first member) before the joint portion area is measured to convert the [region B] into the [region C]. In the optical non-destructive inspection apparatus 1 according to the present embodiment, the measurement point of the wire 91 is heated using heating laser, and thus "thermal distortion" is preferably caused as the physical distortion. From the above, as illustrated in FIG. 7, the wire 91 is irradiated with "preliminary heating laser" before the joint portion area is measured. The output and the irradiation time of the preliminary heating laser are adjusted such that the [region B] is appropriately converted into the [region C] with thermal distortion (warp) caused in the wire 91 without destroying the wire 91 (first member). Fluctuations in the joint portion area can be suppressed by obtaining the joint portion area after thermal distortion (warp) is caused in the wire 91 by irradiating the wire 91 with the preliminary heating laser. Appropriate values of the output and the irradiation time of the preliminary heating laser are varied in accordance with the material, shape, size, etc. of the first member and the second member, and thus decided through a variety of experiments etc. for each product number. The phrase "thermal distortion is caused" means causing deformation in the wire 91 such that it is not restored to its original shape even when the temperature is lowered.

Next, examples ([pattern 1] to [pattern 3] described below) of how and where the preliminary heating laser is radiated will be described with reference to FIGS. 8 to 13. The preliminary heating laser can be implemented relatively easily by adjusting the output and the irradiation time of the heating laser, and thus there is no need to add a new laser output device.

Figure 8:
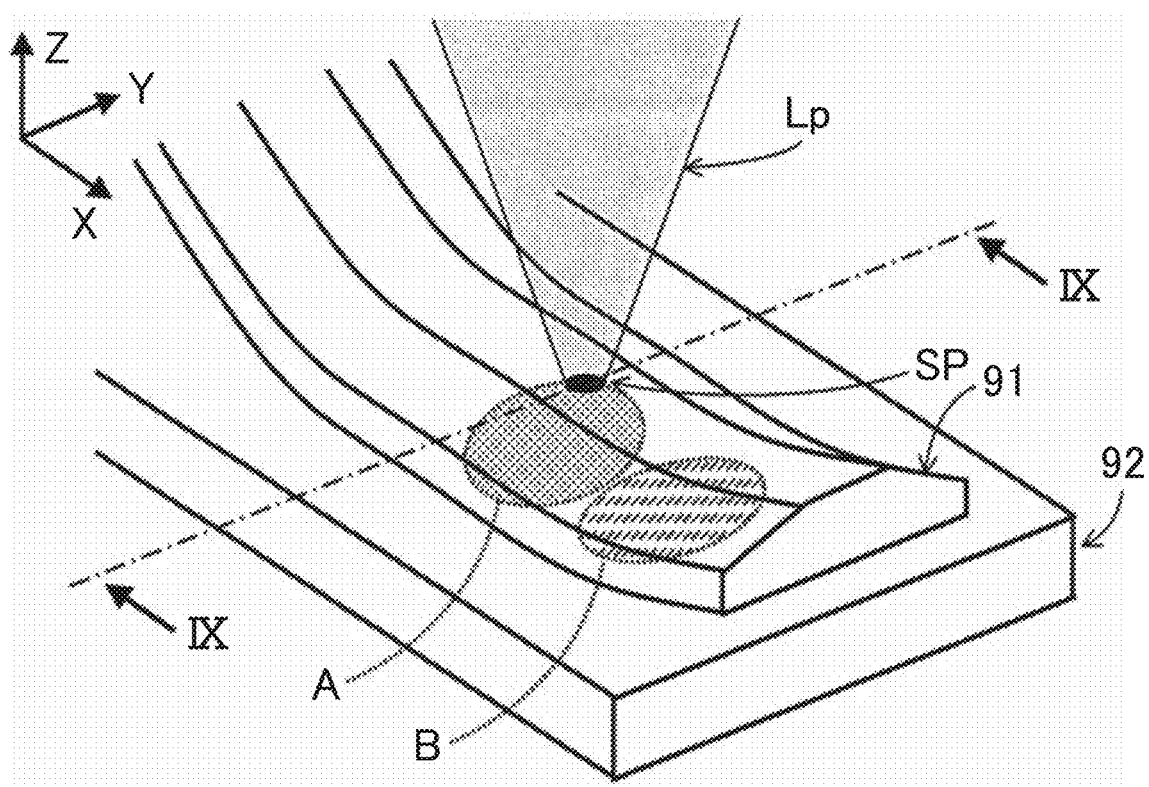
FIG. 8 is a perspective view illustrating an example in which the measurement point is irradiated with the preliminary heating laser.
Figure 9:
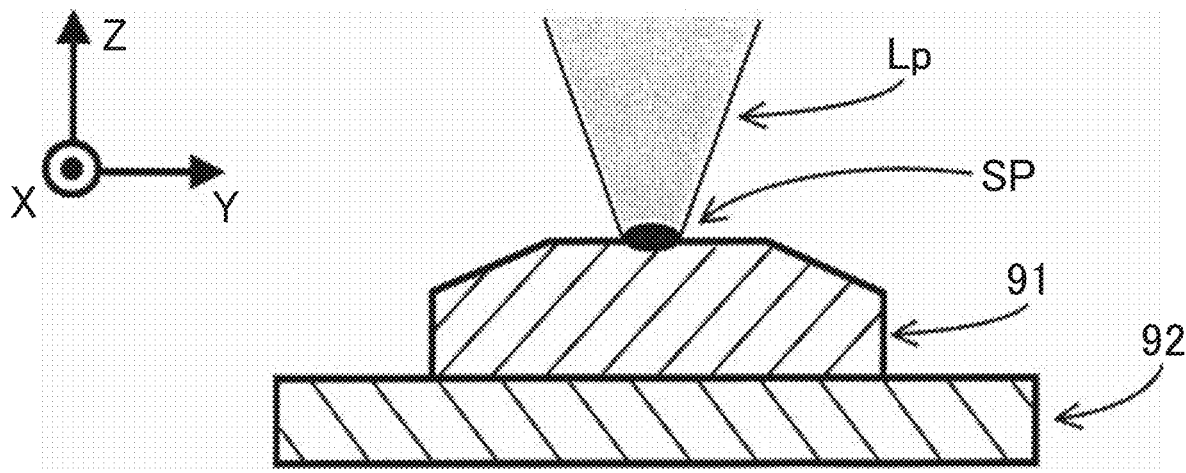
FIG. 9 is a sectional view taken along the line IX-IX of FIG. 8.

In the example illustrated in FIGS. 8 and 9 and corresponding to [pattern 1], preliminary heating laser Lp, the output and the irradiation time of which are adjusted, is radiated to the measurement point SP. FIG. 9 is a sectional view taken along the line IX-IX of FIG. 8. The diameter of the preliminary heating laser Lp which is radiated to the wire 91 is about 200 [μm], for example, and is substantially equal to the diameter of the heating laser which is radiated to the measurement point SP of the wire 91 to obtain the joint portion area. In this case, the preliminary heating laser is radiated to the measurement point SP which is irradiated to obtain the joint portion area, and thus it is not necessary to change the position of the measurement target object with respect to the position of the light condensing unit 10 (see FIG. 5). In the example illustrated in FIGS. 8 and 9, the joint portion area can be measured by radiating the preliminary heating laser without changing the position of the measurement target object. As a result, the work can be performed efficiently in a short period of time.

Figure 10:
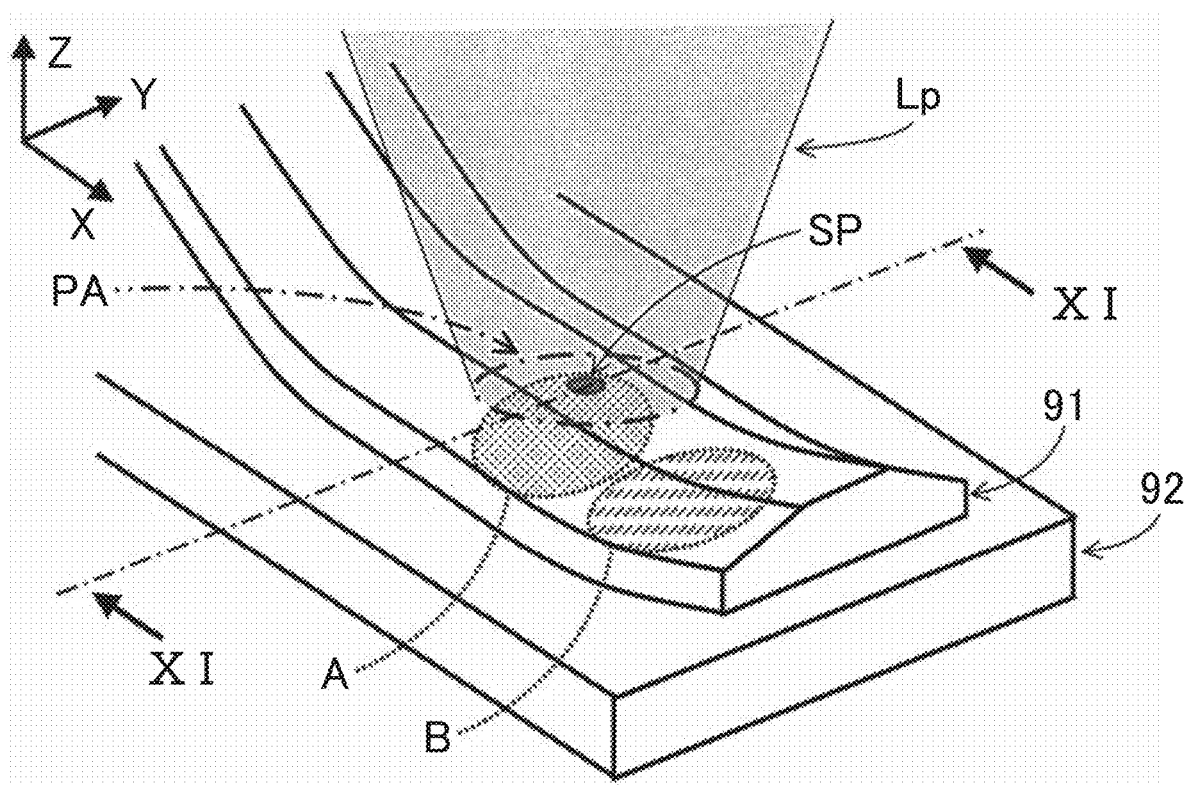
FIG. 10 is a perspective view illustrating an example in which a preliminary heating range that includes the measurement point is irradiated with the preliminary heating laser.
Figure 11:
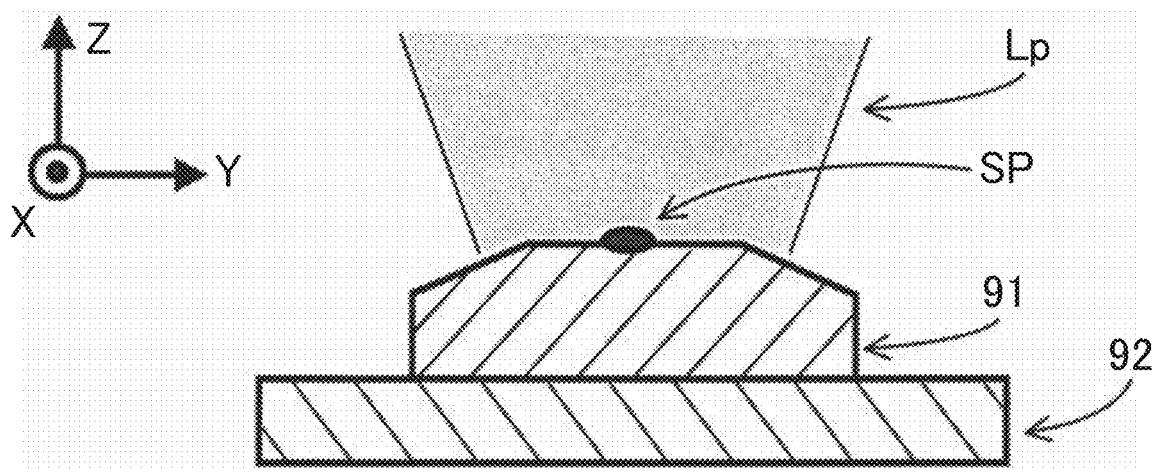
FIG. 11 is a sectional view taken along the line XI-XI of FIG. 10.

In the example illustrated in FIGS. 10 and 11 and corresponding to [pattern 2], the preliminary heating laser Lp, the output and the irradiation time of which are adjusted, is radiated to a preliminary heating range PA that includes the measurement point SP. FIG. 11 is a sectional view taken along the line XI-XI of FIG. 10. The diameter of the preliminary heating laser Lp which is radiated to the wire 91 is about 300 to 400 [μm], for example, and is larger than the diameter of the heating laser which is radiated to the measurement point SP of the wire 91 to obtain the joint portion area. In this case, in order to radiate the preliminary heating laser to the preliminary heating range PA which is wider than the measurement point SP, the measurement target object is moved slightly closer to the light condensing unit 10 (see FIG. 5) (the clearance therebetween is made shorter than the focal length), or the measurement target object is moved slightly away from the light condensing unit 10 (see FIG. 5) (the clearance therebetween is made longer than the focal length), using the Z-axis direction moving unit 77Z illustrated in FIGS. 4 and 5. In the example illustrated in FIGS. 10 and 11, thermal distortion can be caused in a wider range by heating the preliminary heating range PA which is wider and includes the measurement point.

Figure 12:
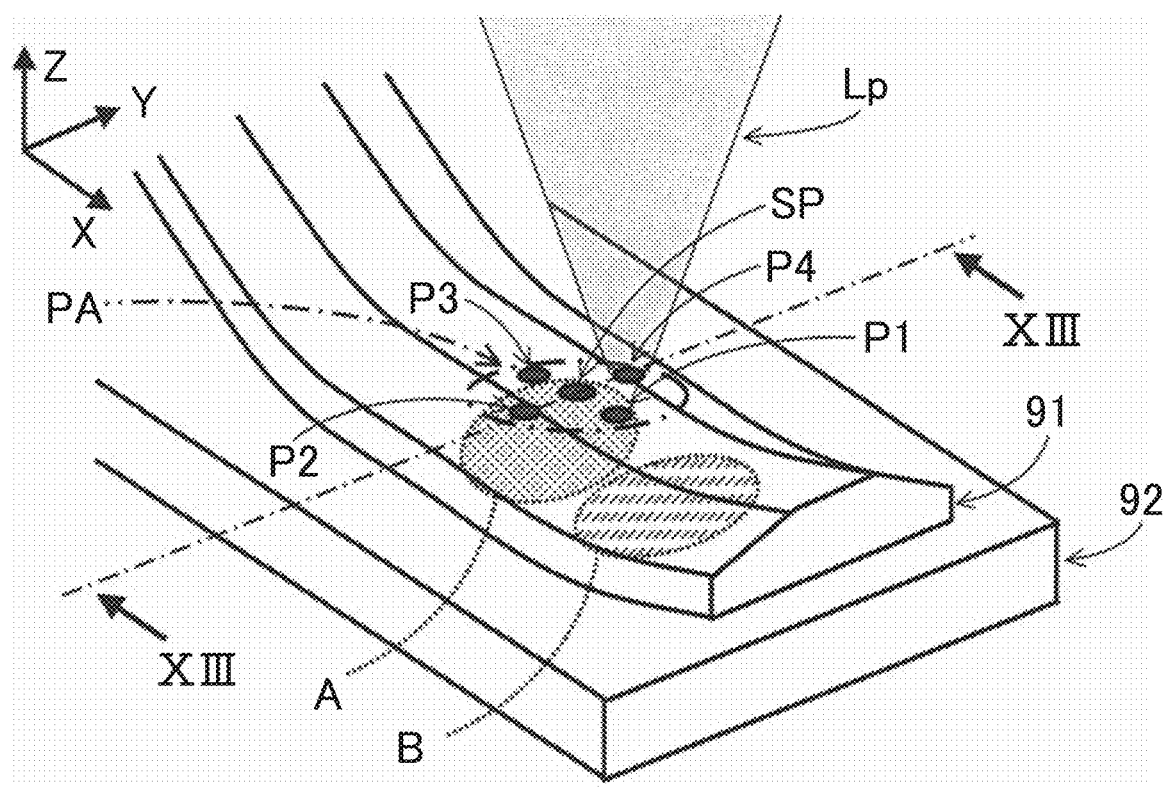
FIG. 12 is a perspective view illustrating an example in which a preliminary heating point set within the preliminary heating range is irradiated with the preliminary heating laser.
Figure 13:
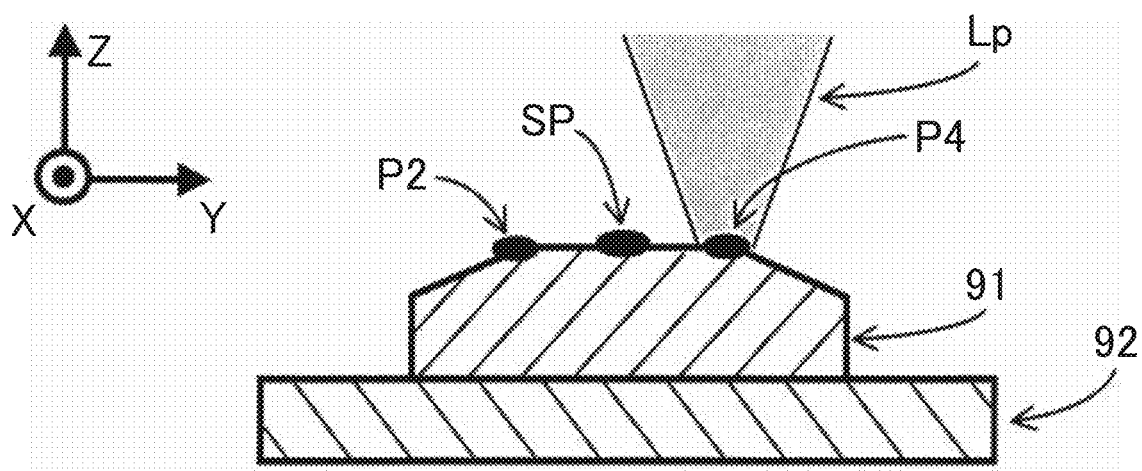
FIG. 13 is a sectional view taken along the line XIII-XIII of FIG. 12.

In the example illustrated in FIGS. 12 and 13 and corresponding to [pattern 3], the preliminary heating laser Lp, the output and the irradiation time of which are adjusted, is radiated to preliminary heating points P1 to P4 set in advance in the preliminary heating range PA which includes the measurement point SP. In the example illustrated in FIG. 12, four preliminary heating points are set. However, a single preliminary heating point or a plurality of preliminary heating points may be set. FIG. 13 is a sectional view taken along the line XIII-XIII of FIG. 12. The diameter of the preliminary heating laser Lp which is radiated to the wire 91 is about 200 [μm], for example, and is substantially equal to the diameter of the heating laser which is radiated to the measurement point SP of the wire 91 to obtain the joint portion area. In this case, in order to radiate the preliminary heating laser to each of the preliminary heating points P1 to P4 which are set in the preliminary heating range PA, the measurement target object is moved with respect to the light condensing unit 10 in the X-axis direction and the Y-axis direction using the X-axis direction moving unit 75X and the Y-axis direction moving unit 76Y, respectively, that are illustrated in FIGS. 4 and 5. In the example illustrated in FIGS. 12 and 13, thermal distortion can be caused easily since a variety of locations of the wire 91 are irradiated with the preliminary heating laser, although the time required for the preliminary heating is extended.

In the following description of the first to fourth embodiments, preliminary heating is performed in the [pattern 1] illustrated in FIGS. 8 and 9.

Figure 14A:
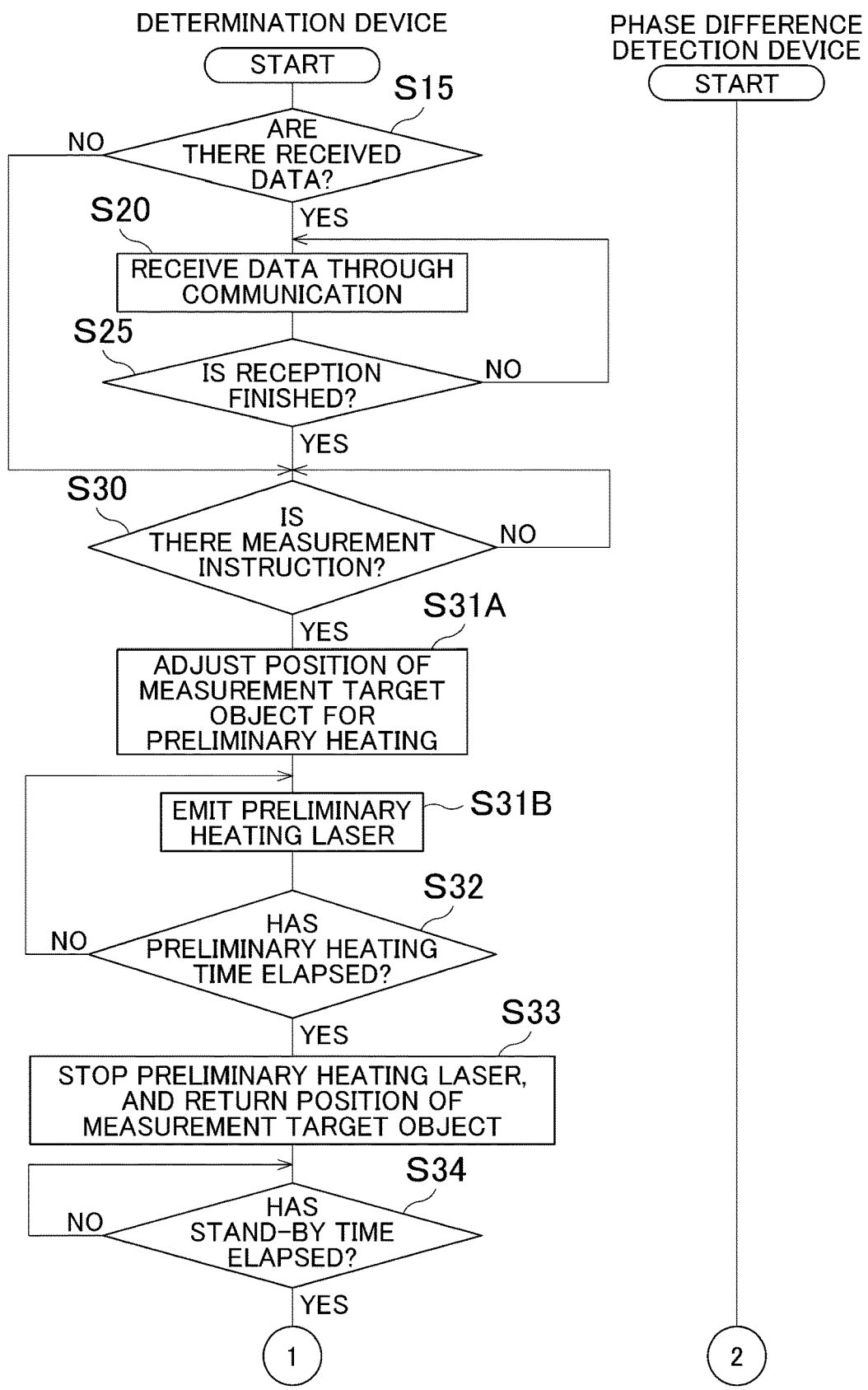

Next, an example of the process procedure for the determination device 70 and the phase difference detection device 60 will be described with reference to the flowchart illustrated in FIG. 14(a) and FIG. 14(b). When an operator starts the determination device 70, for example, the phase difference detection device 60 is started in conjunction, and the determination device 70 proceeds to step S15 while the phase difference detection device 60 proceeds to step S140.

First, the process procedure for steps S15 to S35 for the determination device 70 will be described. In step S15, the determination device 70 determines whether or not there are received data (data received via the communication line 80). In the case where there are received data (Yes), the process proceeds to step S20. In the case where there are no received data (No), the process proceeds to step S30.

In the case where the process proceeds to step S20, the determination device 70 receives data via the communication line 80. Then, the process proceeds to step S25. In step S25, the determination device 70 determines whether or not the reception is finished. In the case where the reception is finished (Yes), the process proceeds to step S30. In the case where the reception is not finished (No), the process returns to step S20.

Figure 17:
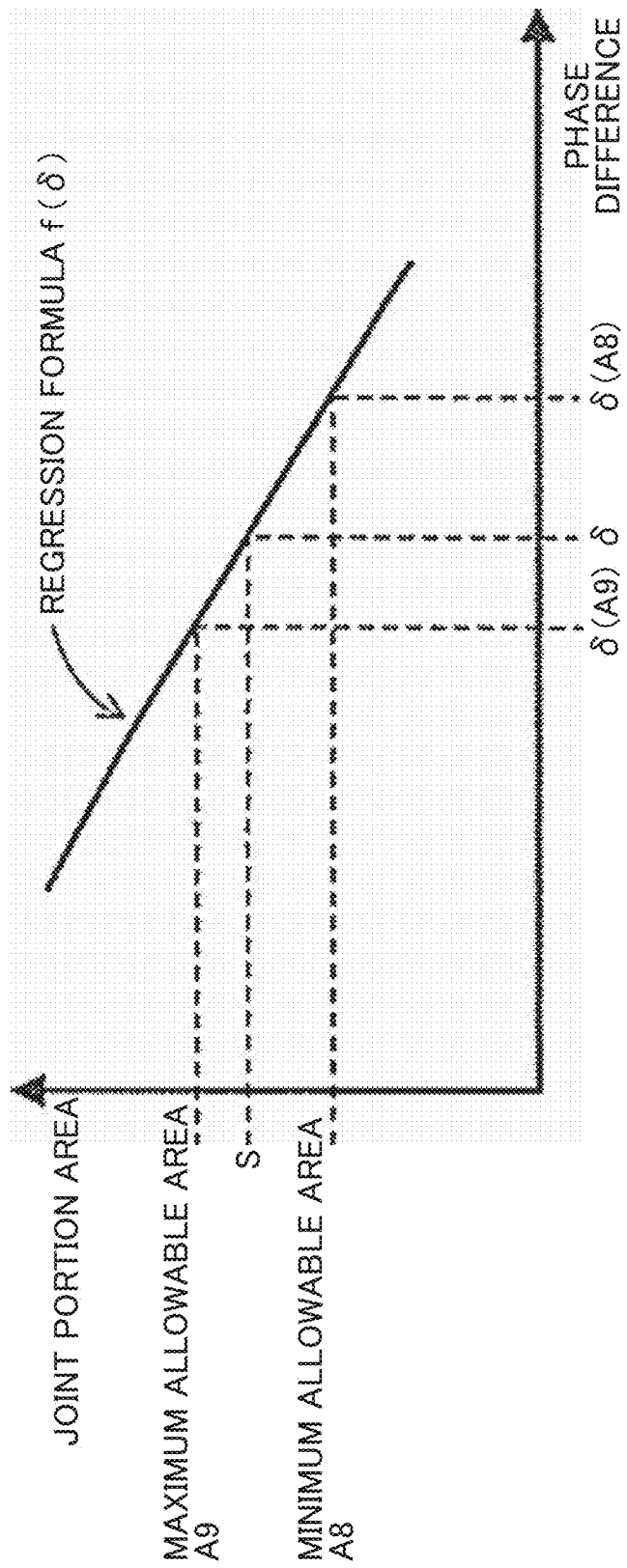
FIG. 17 illustrates an example of the phase difference/joint portion area characteristics.

The data which are received by the determination device 70 are determination information that includes the phase difference/joint portion area characteristics which are distributed from the distribution device 81 illustrated in FIG. 5. FIG. 17 illustrates an example of the phase difference/joint portion area characteristics. FIG. 15 illustrates an example of the determination information. As illustrated in the example of FIG. 15, the determination information H1 includes product number (corresponding to the measurement target object), preliminary heating pattern, preliminary heating laser output, preliminary heating time, stand-by time, heating laser output, heating laser frequency, measurement time, phase difference/joint portion area characteristics (the graph illustrated in the example of FIG. 17, a map, or a regression formula f(δ) (a regression formula obtained from the graph in the example of FIG. 17)), minimum allowable area, maximum allowable area, etc. For example, the distribution device 81 distributes the determination information at a predetermined timing (e.g. each time the product number of the measurement target object to be inspected in the establishment is changed, each time the content of the phase difference/joint portion area characteristics is changed, and each time data about the preliminary heating are changed). The determination device 70 receives the determination information from the distribution device 81 via the communication line 80, and stores the received determination information.

There are a plurality of measurement target objects in accordance with the material of the first member, the size of the first member, the material of the second member, the size of the second member, the presence or absence of a joint member between the first member and the second member, etc. Thus, the measurement target objects are distinguished from each other by the "product number". Preliminary heating pattern, preliminary heating laser output, preliminary heating time, stand-by time, heating laser output, heating laser frequency, measurement time, phase difference/joint portion area characteristics (graph, map, or regression formula $f(\delta)$), minimum allowable area, maximum allowable area, etc. are correlated with the "product number". For example, the product number "A" is correlated with the first member which is an aluminum wire with a diameter of 400 [μm], the second member which is a copper foil, "pattern 1" (see FIGS. 8 and 9) as the preliminary heating pattern, 220 [W] as preliminary heating laser output A1, 100 [ms] as preliminary heating time A2, 120 [ms] as stand-by time A3, 180 [W] as heating laser output A4, 71.4 [Hz] as heating laser frequency A5, 300 [ms] as measurement time A6, phase difference/joint portion area characteristics A7, minimum allowable area A8, and maximum allowable area A9.

The minimum allowable area indicates the minimum value of the area to be determined as normal, of the joint portion area finally calculated in this flowchart. The maximum allowable area indicates the maximum value of the area to be determined as normal, of the joint portion area finally calculated in this flowchart.

In the case where the process proceeds to step S30, the determination device 70 determines the presence or absence of a measurement instruction from the operator. In the case where there is a measurement instruction (Yes), the process proceeds to step S31A. In the case where there is no measurement instruction (No), the process returns to step S30. The measurement instruction includes an input of the "product number". The operator inputs the product number using a keyboard, a bar code reader (in the case where the measurement target object is provided with a bar code corresponding to the product number), or the like.

In the case where the process proceeds to step S31A, the determination device 70 reads a preliminary heating pattern corresponding to the product number using the determination information H1 (see FIG. 15), and adjusts the position of the measurement target object with respect to the light condensing unit 10 by controlling the X-axis direction moving unit, the Y-axis direction moving unit, and the Z-axis direction moving unit in accordance with the preliminary heating pattern. Then, the process proceeds to step S31B.

In step S31B, the determination device 70 reads preliminary heating laser output (corresponding to the thermal distortion generation intensity which is a constant output intensity) and preliminary heating time (corresponding to the irradiation time) corresponding to the product number using the determination information H1 (see FIG. 15). The determination device 70 causes the laser output device to emit laser with an output set to the "preliminary heating laser output". Then, the process proceeds to step S32.

In step S32, the determination device 70 determines whether or not the preliminary heating time has elapsed since radiation of the preliminary heating laser is started. In the case where the preliminary heating time has elapsed (Yes), the process proceeds to step S33. In the case where the preliminary heating time has not elapsed (No), the process returns to step S31B.

In the case where the process proceeds to step S33, the determination device 70 stops radiation of the preliminary heating laser, and returns the position of the measurement target object (returns the measurement target object to a position at which the heating laser is radiated to the measurement point) by controlling the X-axis direction moving unit 75X, the Y-axis direction moving unit 76Y, and the Z-axis direction moving unit 77Z. Then, the process proceeds to step S34. Steps S31A to S33 described above correspond to a preliminary heating step, which is performed before a heating laser emission step, of causing thermal distortion in the first member by irradiating the measurement point, or the preliminary heating range, or the preliminary heating point which is set in the preliminary heating range, with the preliminary heating laser adjusted to a thermal distortion generation intensity and an irradiation time. In this preliminary heating step, the [region B] (a region in an unstable contact state) discussed above is converted into the [region C] (a region in a stable non-contact state).

Figure 16:
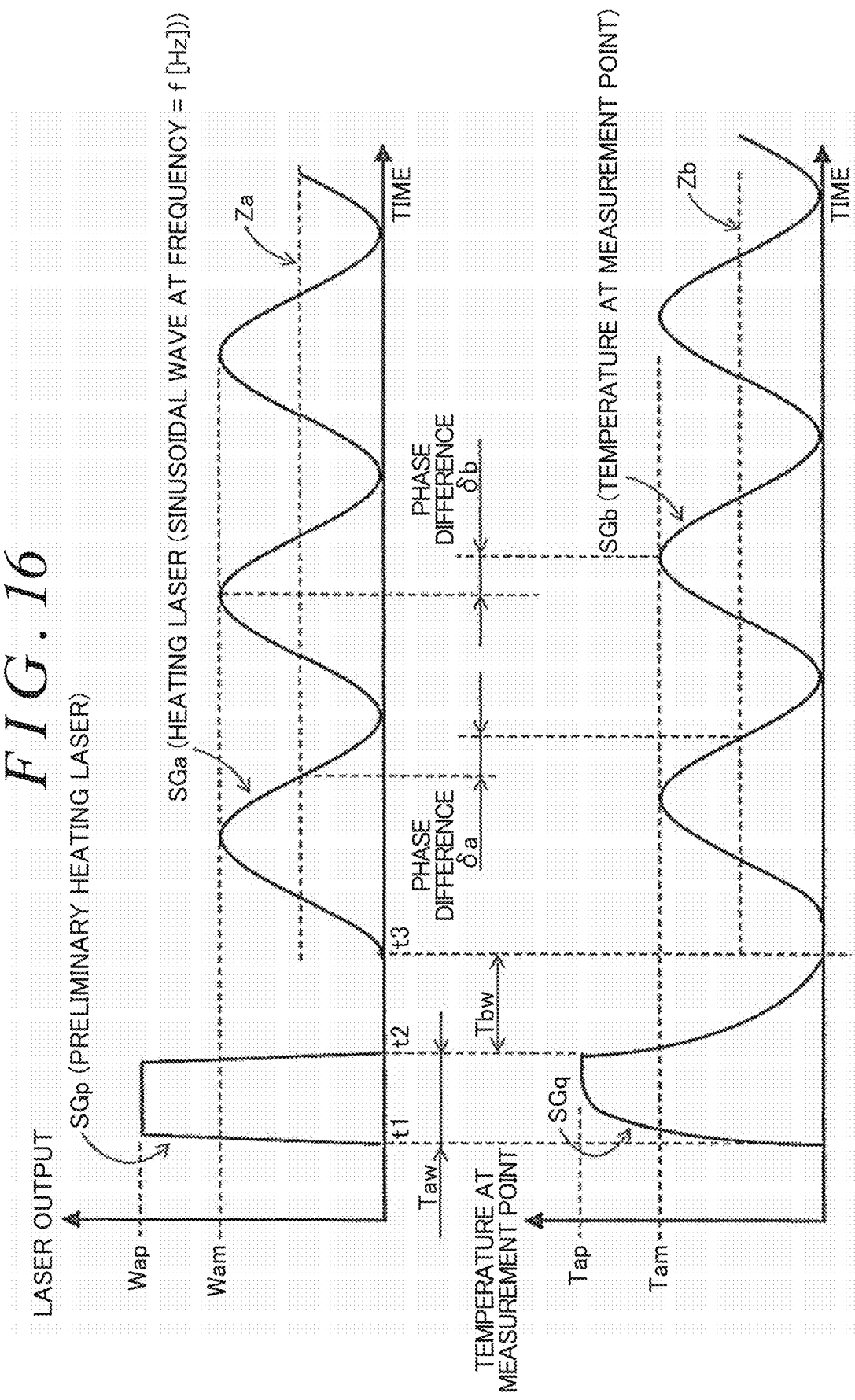
FIG. 16 illustrates an example of the state of irradiation of the measurement point with laser and temperature variations at the measurement point in the first embodiment.

In step S34, the determination device 70 reads the stand-by time corresponding to the product number using the determination information H1 (see FIG. 15). The determination device 70 determines whether or not the stand-by time has elapsed since the preliminary heating laser is stopped. In the case where the stand-by time has elapsed (Yes), the process proceeds to step S35. In the case where the stand-by time has not elapsed (No), the process returns to step S34. The radiation state of the preliminary heating laser in the preliminary heating step is illustrated in FIG. 16. FIG. 16 illustrates an example in which preliminary heating laser SGp with an output Wap corresponding to the thermal distortion generation intensity is radiated during a preliminary heating time Taw from time t1 to time t2. With this preliminary heating laser, the temperature at the measurement point is raised to Tap as indicated by a signal SGq. Laser radiation is stopped during a stand-by time Tbw from time t2 to time t3, and the temperature at the measurement point is gradually lowered. In the case where there are a plurality of locations, namely first members and second members joined to each other, to be measured as in the electronic part illustrated in the example of FIG. 1, the locations to be measured are sequentially irradiated with the preliminary heating laser without providing the stand-by time Tbw. When the joint state is determined by sequentially radiating the heating laser after that, the time can be shortened by an amount corresponding to the omission of the stand-by time.

In the case where the process proceeds to step S35, the determination device 70 reads the heating laser output and the heating laser frequency corresponding to the product number using the determination information H1 (see FIG. 15). The determination device 70 outputs a control signal to the laser output device 27 so as to achieve the heating laser output and the heating laser frequency which have been read. The laser output device 27 emits the heating laser such that the intensity of the heating laser which is radiated to the measurement point SP is varied sinusoidally (as with the heating laser frequency) on the basis of the input control signal. When the process in step S35 is finished, the determination device 70 stands by for an input of information about the phase difference from the phase difference detection device 60 in step S60. The process in step S35 corresponds to a laser emission step of emitting the heating laser such that the intensity of the heating laser at the measurement point SP is varied sinusoidally (a laser emission step of emitting the heating laser toward the measurement point to heat the measurement point).

Next, the process procedure for steps S140 to S155 for the phase difference detection device 60 will be described. In step S140, the phase difference detection device 60 determines the presence or absence of an input of a laser intensity detection signal from the laser intensity detection unit 41 (the presence or absence of the heating laser as the irradiated light (see FIG. 5)). In the case where there is an input of a laser intensity detection signal (Yes), the process proceeds to step S145. In the case where there is no input of a laser intensity detection signal (No), the process returns to step S140.

In the case where the process proceeds to step S145, the phase difference detection device 60 determines the presence or absence of a temperature response based on the infrared light intensity detection signal from the infrared light intensity detection unit 31. In the case where there is a temperature response (Yes), the process proceeds to step S150. In the case where there is no temperature response (No), the process returns to step S145. The determination may be made in accordance with the presence or absence of an input of infrared light at a predetermined wavelength.

In the case where the process proceeds to step S150, the phase difference detection device 60 retrieves the laser intensity detection signal (a signal corresponding to a signal SGa indicated in the example of FIG. 16) from the laser intensity detection unit 41, and measures the irradiated light (see FIG. 5), the intensity of which is varied sinusoidally. The phase difference detection device 60 retrieves the infrared light intensity detection signal (a signal corresponding to a signal SGb indicated in the example of FIG. 16) from the infrared light intensity detection unit 31, and measures the infrared light, the intensity of which is varied sinusoidally. The phase difference detection device 60 measures a phase difference δa (or a phase difference δb) between the laser intensity detection signal corresponding to the signal SGa and the infrared light intensity detection signal corresponding to the signal SGb as indicated in the example of FIG. 16. Then, the process proceeds to step S155.

The process of retrieving the laser intensity detection signal and the process of retrieving the infrared light intensity detection signal in step S150 correspond to an information acquisition step of acquiring the measurement point information which includes the intensity of infrared light radiated from the measurement point SP and the heating laser information which includes the intensity of the heating laser which is radiated toward the measurement point SP. More specifically, the processes correspond to an information acquisition step of the phase difference detection device retrieving a laser intensity detection signal which is the heating laser information which is output from the laser intensity detection unit on the basis of the intensity of the heating laser which is varied sinusoidally at the measurement point SP, and of the phase difference detection device retrieving an infrared light intensity detection signal which is the measurement point information which is output from the infrared light intensity detection unit on the basis of the intensity of the infrared light which is radiated from the measurement point SP and varied sinusoidally.

In step S155, the phase difference detection device 60 outputs acquisition-associated information that includes the measured phase difference δb (or phase difference δa) (information that includes the time, the angle, or the like of the phase difference) toward the determination device 70. Then, the process returns to step S140. The process of measuring (obtaining) the phase difference in step S150 and the process of outputting the phase difference to the determination device in step S155 correspond to a part of a joint state determination step.

Next, the process procedure for steps S60 to S80 for the determination device 70 will be described. In step S60, the determination device 70 determines the presence or absence of an input of information about the phase difference from the phase difference detection device 60. In the case where there is an input of information about the phase difference (Yes), the process proceeds to step S65. In the case where there is no input of information about the phase difference (No), the process returns to step S60.

In the case where the process proceeds to step S65, the determination device 70 retrieves the acquisition-associated information (information about the phase difference), outputs a control signal to the laser output device 27, and stops emission of the heating laser from the laser output device 27. Then, the process proceeds to step S70. The determination device 70 may read the measurement time corresponding to the product number using the determination information (see FIG. 15), and stop radiation of the heating laser in the case where the measurement time has elapsed since the start of the radiation of the heating laser.

In step S70, the determination device 70 obtains the joint portion area on the basis of the phase difference which is included in the retrieved acquisition-associated information (information about the phase difference) and the phase difference/joint portion area characteristics (characteristics that indicate the correlation between the phase difference and the joint portion area) corresponding to the "product number" in the determination information (see FIG. 15) which is stored in a storage device of the determination device 70 itself or an external storage device. Then, the process proceeds to step S80. The details of the phase difference/joint portion area characteristics and the details of how to obtain the joint portion area will be discussed later. Thus, the determination device 70 has a conversion unit (conversion section) that converts the phase difference into a joint portion area on the basis of the phase difference and the phase difference/joint portion area characteristics (at least one of a graph, a map, and a regression formula as discussed later).

In step S80, the determination device 70 outputs (see FIG. 18) determination results indicating that the joint state between the first member and the second member is normal or abnormal in accordance with the joint portion area which is obtained in step S70. The process is finished. For example, the determination device 70 determines that the joint state is normal in the case where the obtained joint portion area falls within a predetermined range from the minimum allowable area to the maximum allowable area corresponding to the "product number" in the determination information (see FIG. 15). Alternatively, the determination device 70 determines that the joint state is normal in the case where the obtained joint portion area is equal to or larger than the minimum allowable area. The process in step S80 corresponds to a determination result output step of outputting determination results that indicate whether or not the obtained joint portion area falls within a predetermined range set in advance, or whether or not the obtained joint portion area is equal to or larger than a predetermined area set in advance. Thus, the determination device 70 has an output unit (output section) that outputs determination results that indicate whether or not the obtained joint portion area falls within a predetermined range set in advance, or whether or not the obtained joint portion area is equal to or larger than a predetermined area set in advance. The process of retrieving the acquisition-associated information in step S65 and the processes in steps S70 and S80 correspond to a joint state determination step of determining the joint state of the joint portion on the joint interface using the acquisition-associated information which is based on the measurement point information and the heating laser information. More specifically, the processes correspond to a joint state determination step of retrieving the acquisition-associated information and determining the joint state of the joint portion on the joint interface on the basis of the phase difference which is included in the acquisition-associated information. An output of the determination results will be discussed in detail later.

Next, an example of a method of preparing the phase difference/joint portion area characteristics will be described. For example, a plurality of samples that differ from each other in only the joint portion area between the first member and the second member are prepared for a measurement target object with a particular product number (e.g. product number: A). The samples are subjected to the optical non-destructive inspection apparatus illustrated in FIG. 1 to measure the phase difference (δ). The joint portion area of each of the samples is measured before measurement of the phase difference, or after measurement of the phase difference. Phase difference/joint portion area characteristics (see FIG. 17) for the measurement target object with the product number are prepared on the basis of the measured phase difference and the measured joint portion area. In this way, the phase difference/joint portion area characteristics (for product number: A) can be obtained as illustrated in the example of FIG. 17 using a plurality of samples that differ from each other in only the joint portion area between the first member and the second member. Phase difference/joint portion area characteristics that are equivalent to the characteristics illustrated in the example of FIG. 17 may be obtained on the basis of a plurality of simulations, instead of obtaining the phase difference/joint portion area characteristics by preparing a plurality of samples. In the case where the joint portion area is large, heat is dissipated easily. Therefore, it takes less time before the temperature peaks during heating or heat reduction, and the phase difference tends to be small. In the case where the joint portion area is small, heat is not dissipated easily. Therefore, it takes much time before the temperature peaks during heating or heat reduction, and the phase difference tends to be large.

Figure 18:
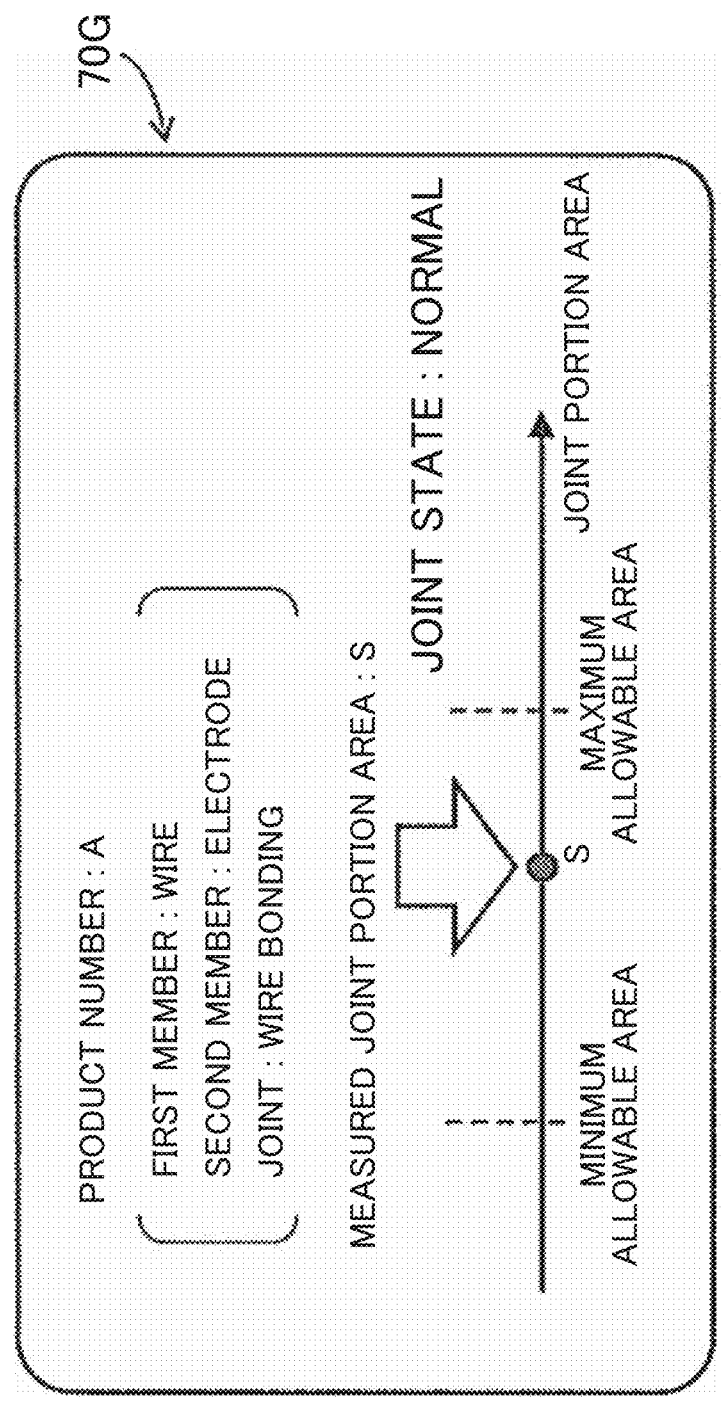
FIG. 18 illustrates an example of determination results.

A regression formula f(δ) for deriving the joint portion area (S) for the phase difference (δ) may be obtained from the phase difference/joint portion area characteristics (for product number: A). The phase difference/joint portion area characteristics may be represented in the graph form as illustrated in FIG. 17, or in the form of a look-up table, a map, or the like that indicates the joint portion area for a variety of values of the phase difference. The determination device (or the storage device) stores determination information that includes at least one of a graph, a map, and a regression formula that indicates the phase difference/joint portion area characteristics described above. Consequently, the determination device can obtain the joint portion area from the phase difference using the phase difference/joint portion area characteristics which match the measurement target object. By this method, the joint portion area can be obtained more accurately and easily for a variety of measurement target objects (a variety of product numbers), such as for measurement target objects in which the first member and the second member are joined to each other directly by welding or the like, for measurement target objects in which the first member and the second member are joined to each other with a joint member such as solder interposed therebetween, and for a case where the first member and the second member are not of a single material. When determining whether or not the obtained joint portion area is good or not, as illustrated in FIG. 18, for example, the minimum allowable area and the maximum allowable area may be set, and it may be determined that the obtained joint portion area is normal in the case where the joint portion area is equal to or larger than the minimum allowable area and equal to or smaller than the maximum allowable area, or it may be determined that the obtained joint portion area is normal in the case where the joint portion area is equal to or larger than the minimum allowable area. Alternatively, as illustrated in FIG. 17, the phase difference may not be converted into a joint portion area, and it may be determined that the phase difference is normal in the case where the phase difference is equal to or less than a phase difference δ(A8) corresponding to the minimum allowable area A8 and equal to or more than a phase difference δ(A9) corresponding to the maximum allowable area A9, or it may be determined that the phase difference is normal in the case where the phase difference is equal to or less than the phase difference δ(A8) corresponding to the minimum allowable area A8.

FIG. 18 illustrates an example in which determination result information 70G that includes an obtained joint portion area S is displayed on a display unit (such as a monitor) of the determination device 70. The minimum allowable area in FIG. 18 is a minimum allowable area specified by the determination information which is stored in the determination device 70 or the storage device and the product number which is input in step S30. The maximum allowable area in FIG. 18 is a maximum allowable area specified by the determination information which is stored in the determination device 70 or the storage device and the product number which is input in step S30. In the case where the calculated joint portion area S is equal to or larger than the minimum allowable area and equal to or smaller than the maximum allowable area, the determination device 70 determines that the joint state is "normal". In the case where the calculated joint portion area S is not equal to or larger than the minimum allowable area or not equal to or smaller than the maximum allowable area, the determination device 70 determines that the joint state is "abnormal". FIG. 18 illustrates an example in which it is determined that the joint state is "normal". The operator can easily identify whether the joint state of the measurement target object is normal or abnormal by looking at the determination result information 70G.

The determination results can be output by a variety of methods, besides the example described above in which software that handles digital values is mainly used. For example, a voltage corresponding to the minimum allowable area and a voltage corresponding to the obtained joint portion area may be input to a hardware voltage comparator that handles analog values, and the voltage comparator may be caused to output an ON signal to turn on a normal lamp or output a sound such as a normal chime in the case where the "voltage corresponding to the minimum allowable area" is equal to or smaller than the "voltage corresponding to the obtained joint portion area". In this way, the output unit (output section) which outputs the determination results can be configured in a variety of manners such as software, hardware, digital, analog, etc.

Figure 19:
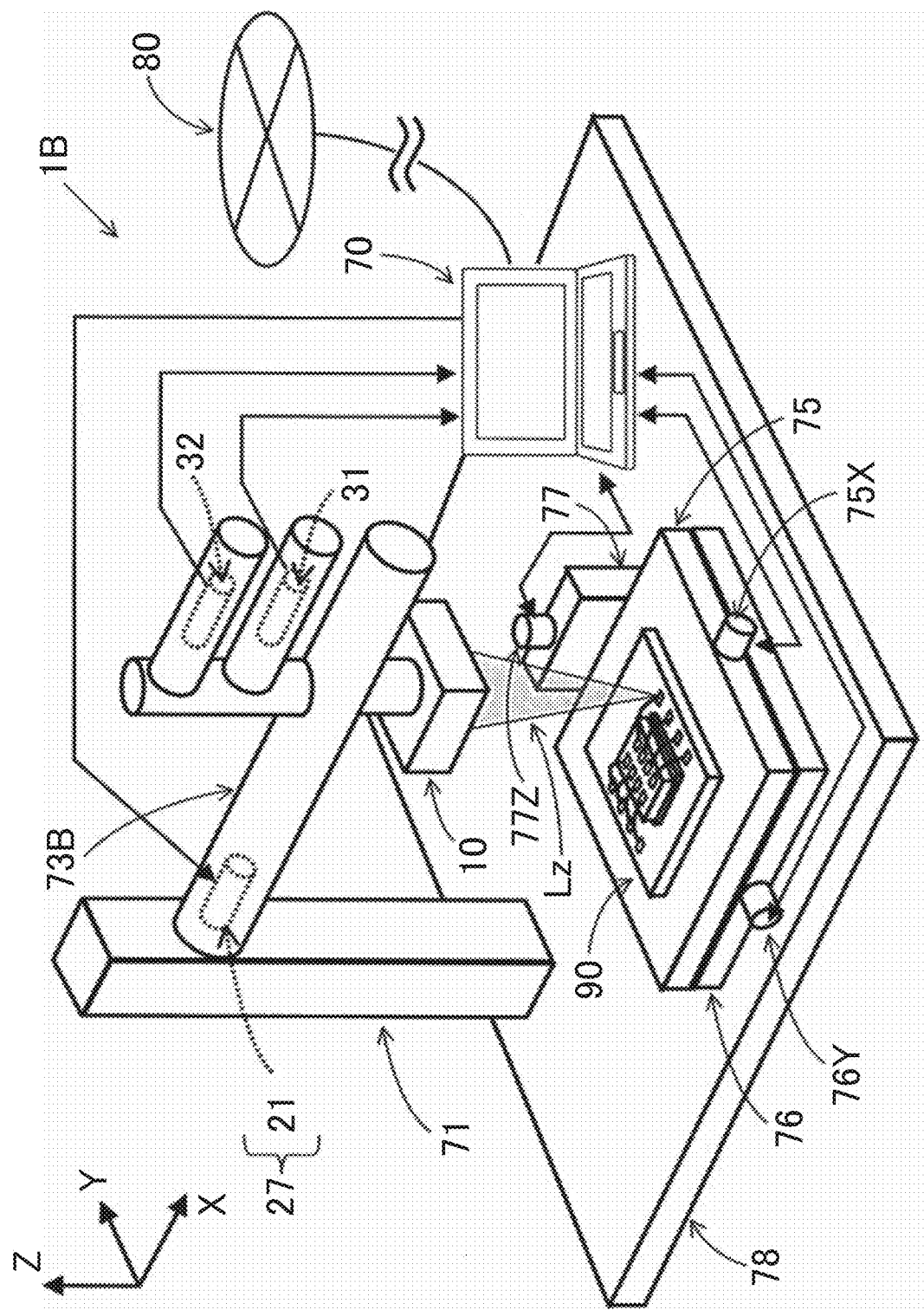
FIG. 19 is a perspective view illustrating an example of the appearance of an optical non-destructive inspection apparatus according to a second embodiment.
Figure 20:
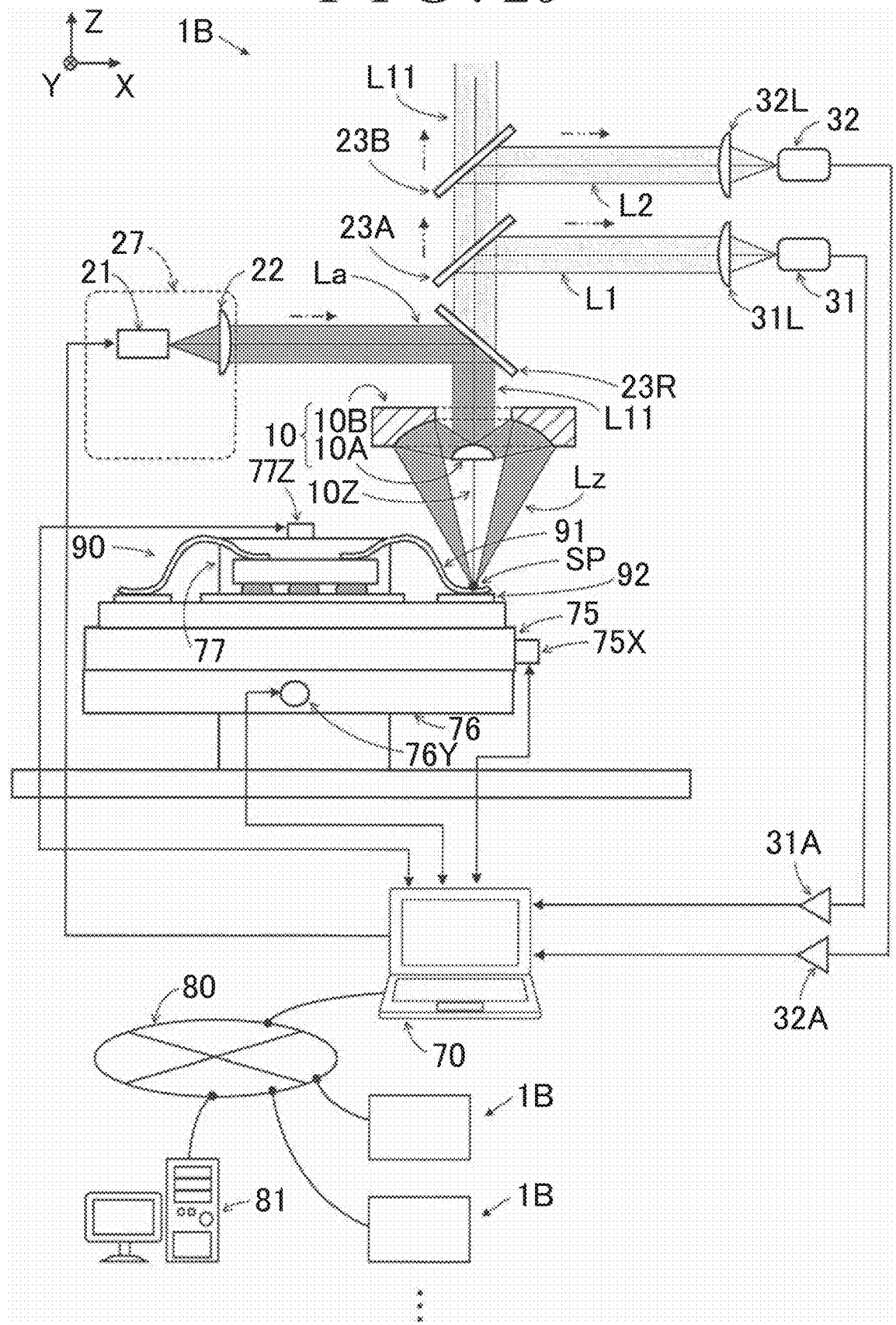
FIG. 20 illustrates an overall configuration of the optical non-destructive inspection apparatus according to the second embodiment illustrated in FIG. 19.

FIG. 19 is a perspective view illustrating the appearance of an optical non-destructive inspection apparatus 1B according to a second embodiment. FIG. 20 illustrates an example of an overall configuration of the optical non-destructive inspection apparatus 1B illustrated in FIG. 19. The optical non-destructive inspection apparatus 1B according to the second embodiment irradiates a measurement point with laser light which is emitted from a laser light source (in this case, the semiconductor laser light source 21) and the intensity of which is set to a heating intensity which is a constant intensity, and obtains the joint portion area of a measurement target object on the basis of temperature rise characteristics based on the intensity of infrared light radiated from the measurement point. The determination device 70 determines whether or not the joint state is good by determining whether or not the obtained joint portion area falls within the allowable range. In the first embodiment, the measurement point SP is irradiated with heating laser, the intensity of which is varied sinusoidally, and the joint portion area is obtained from the phase difference between the intensity of the heating laser which is sinusoidal and the intensity of infrared light which is sinusoidal. The second embodiment differs in that the measurement point SP is irradiated with heating laser at the heating intensity (constant intensity) and the joint portion area is obtained from the temperature rise characteristics at the measurement point. It should be noted, however, that the embodiments are the same as each other in that preliminary heating laser is radiated to cause thermal distortion in the wire 91 (first member) before the joint portion area is measured. Differences in the configuration and differences in the process procedure from the first embodiment will be mainly described below.

In the optical non-destructive inspection apparatus 1B according to the second embodiment, as illustrated in FIGS. 19 and 20, the laser intensity detection unit 41 and the modulation signal output unit 25 (see FIGS. 4 and 5) have been omitted from a laser head portion 73B, and an infrared light intensity detection unit 32 has been added, in contrast to the first embodiment (see FIGS. 4 and 5). In the optical non-destructive inspection apparatus 1B according to the second embodiment, the phase difference detection device 60 (see FIGS. 4 and 5) has been omitted in contrast to the first embodiment (see FIGS. 4 and 5).

The laser output device 27 has the semiconductor laser light source 21 and the collimating lens 22, for example. The semiconductor laser light source 21 includes an intensity adjustment input for intensity adjustment. A control signal from the determination device 70 is input to the intensity adjustment input. The semiconductor laser light source 21 emits the heating laser La, the intensity of which is set to the heating intensity (constant intensity), on the basis of the control signal from the determination device 70. The heating laser La which is emitted from the semiconductor laser light source 21 is converted into parallel light by the collimating lens 22, and reaches a heating laser selective reflection unit 23R. In the case where the emitted heating laser is parallel light, the collimating lens 22 can be omitted. The output of the heating laser is adjusted to an output that allows the measurement target object 90 to be heated without being destroyed. The heating laser selective reflection unit 23R is a dichroic mirror that reflects light at the wavelength of the heating laser and that transmits light at wavelengths other than the wavelength of the heating laser, for example. A heating laser guiding unit is constituted from the collimating lens 22 and the heating laser selective reflection unit 23R. The heating laser guiding unit guides the heating laser La, which is emitted from the semiconductor laser light source 21, toward one side of the light condensing unit 10 after conversion into parallel light.

When a control signal for radiating preliminary heating laser with a thermal distortion generation intensity which is a constant output intensity and an adjusted irradiation time is input from the determination device 70, the laser output device 27 outputs preliminary heating laser with an intensity corresponding to the thermal distortion generation intensity and for a time corresponding to the irradiation time, in order to cause thermal distortion without destroying the wire 91 (first member) before emitting the heating laser. The wavelength of the preliminary heating laser is the same as the wavelength of the heating laser.

The (first) infrared light intensity detection unit 31 is an infrared light sensor that is capable of detecting the energy (intensity) of infrared light at a predetermined wavelength reflected by a first infrared light selective reflection unit 23A. The first infrared light selective reflection unit 23A is a dichroic mirror that reflects first infrared light that has a first wavelength $\lambda 1$ and that transmits light at wavelengths other than the first wavelength $\lambda 1$, for example, and is disposed in the path of the first measurement light L11. Infrared light at the first wavelength $\lambda 1$ included in the first measurement light L11 is picked up by the first infrared light selective reflection unit 23A, condensed by the light condensing lens 31L, and input to the (first) infrared light intensity detection unit 31. A (first) infrared light intensity detection signal output from the (first) infrared light intensity detection unit 31 is amplified by the sensor amplifier 31A, for example, and input to the determination device 70. A (first) infrared light guiding unit is constituted from the heating laser selective reflection unit 23, the first infrared light selective reflection unit 23A, and the light condensing lens 31L. The (first) infrared light guiding unit guides infrared light at the first wavelength $\lambda 1$, which is included in the parallel light (first measurement light L11) which is radiated from the measurement point SP and emitted from the one side of the light condensing unit 10, to the (first) infrared light intensity detection unit 31. The sensor amplifier 31A is similar to that in the first embodiment, and may be omitted.

The (second) infrared light intensity detection unit 32 is an infrared light sensor that is capable of detecting the energy (intensity) of infrared light at a predetermined wavelength reflected by a second infrared light selective reflection unit 23B. The second infrared light selective reflection unit 23B is a dichroic mirror that reflects second infrared light that has a second wavelength $\lambda 2$ and that transmits light at wavelengths other than the second wavelength $\lambda 2$, for example, and is disposed in the path of the first measurement light L11. Infrared light at the second wavelength $\lambda 2$ included in the first measurement light L11 is picked up by the second infrared light selective reflection unit 23B, condensed by a light condensing lens 32L, and input to the (second) infrared light intensity detection unit 32. A (second) infrared light intensity detection signal output from the (second) infrared light intensity detection unit 32 is amplified by a sensor amplifier 32A, for example, and input to the determination device 70. A (second) infrared light guiding unit is constituted from the heating laser selective reflection unit 23, the second infrared light selective reflection unit 23B, and the light condensing lens 32L. The (second) infrared light guiding unit guides infrared light at the second wavelength $\lambda 2$, which is included in the parallel light (first measurement light L11) which is radiated from the measurement point SP and emitted from the one side of the light condensing unit 10, to the (second) infrared light intensity detection unit 32. The sensor amplifier 32A is a voltage amplification circuit, for example, and outputs the input (second) infrared light intensity detection signal with the amplitude (voltage level) thereof amplified. The sensor amplifier 32A may be omitted.

Figure 21A:
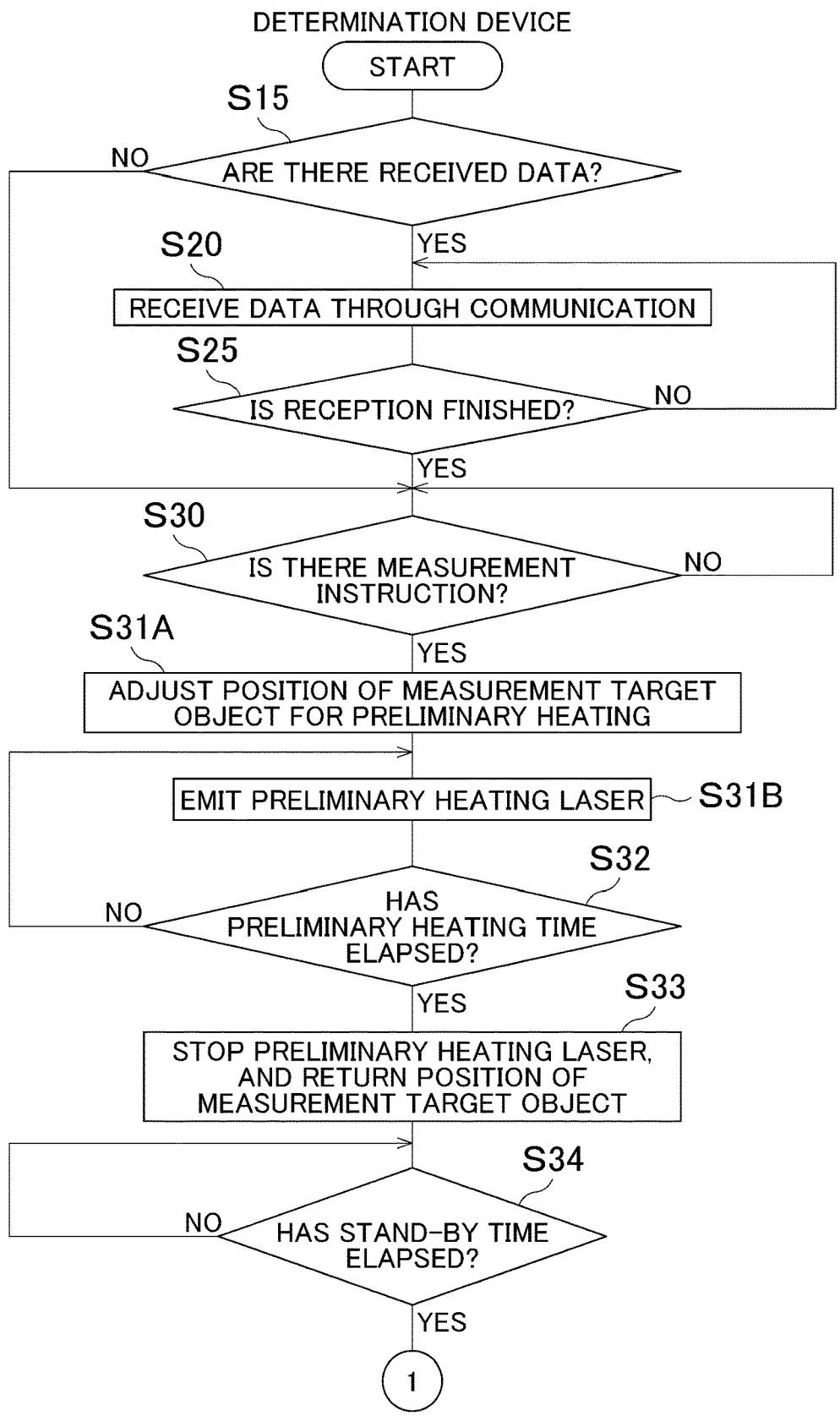
FIG. 21(a) and FIG. 21(b) are a flowchart illustrating an example of the process procedure for a determination device according to the second embodiment.
Figure 21B:
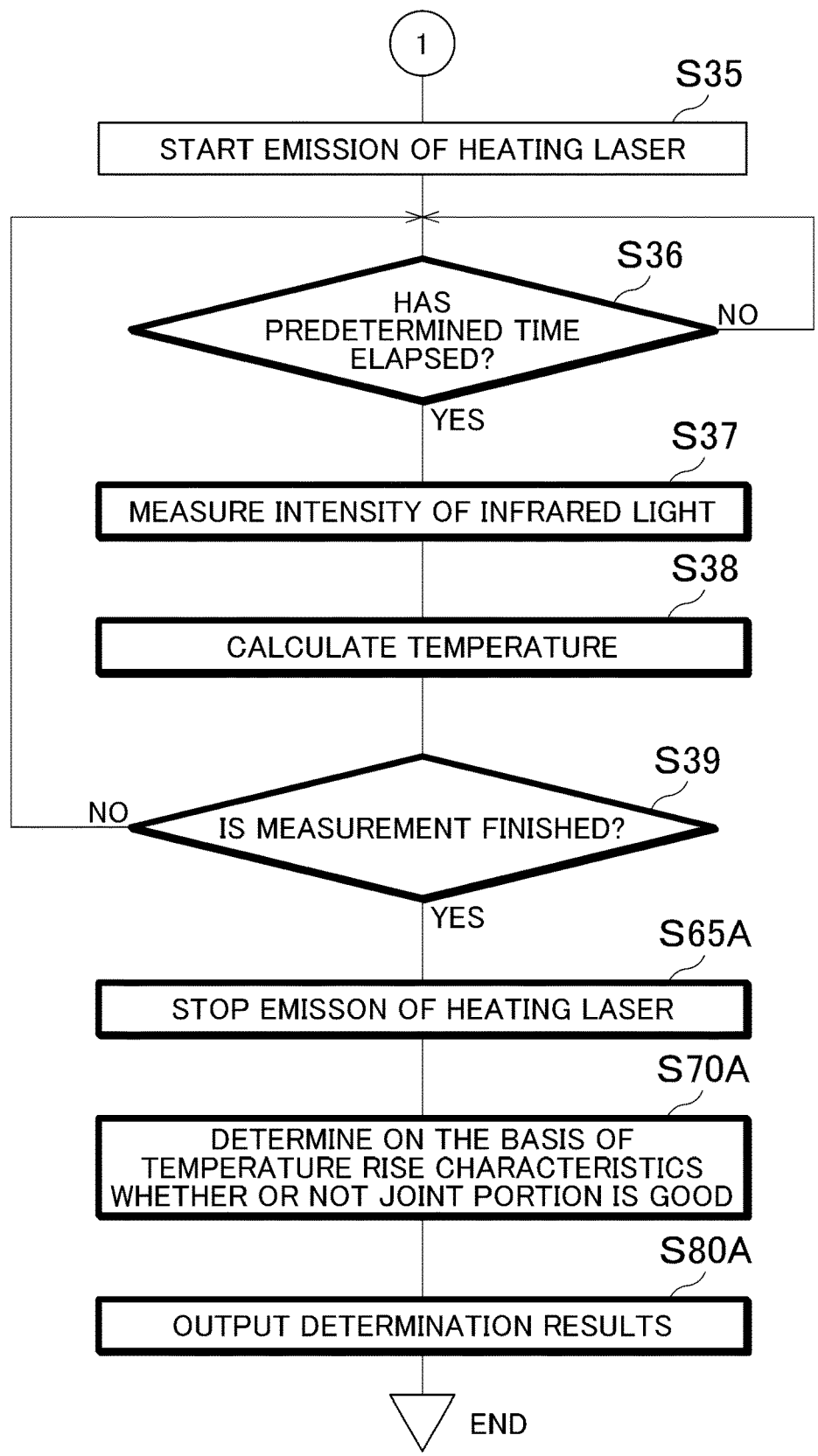
Figure 23:
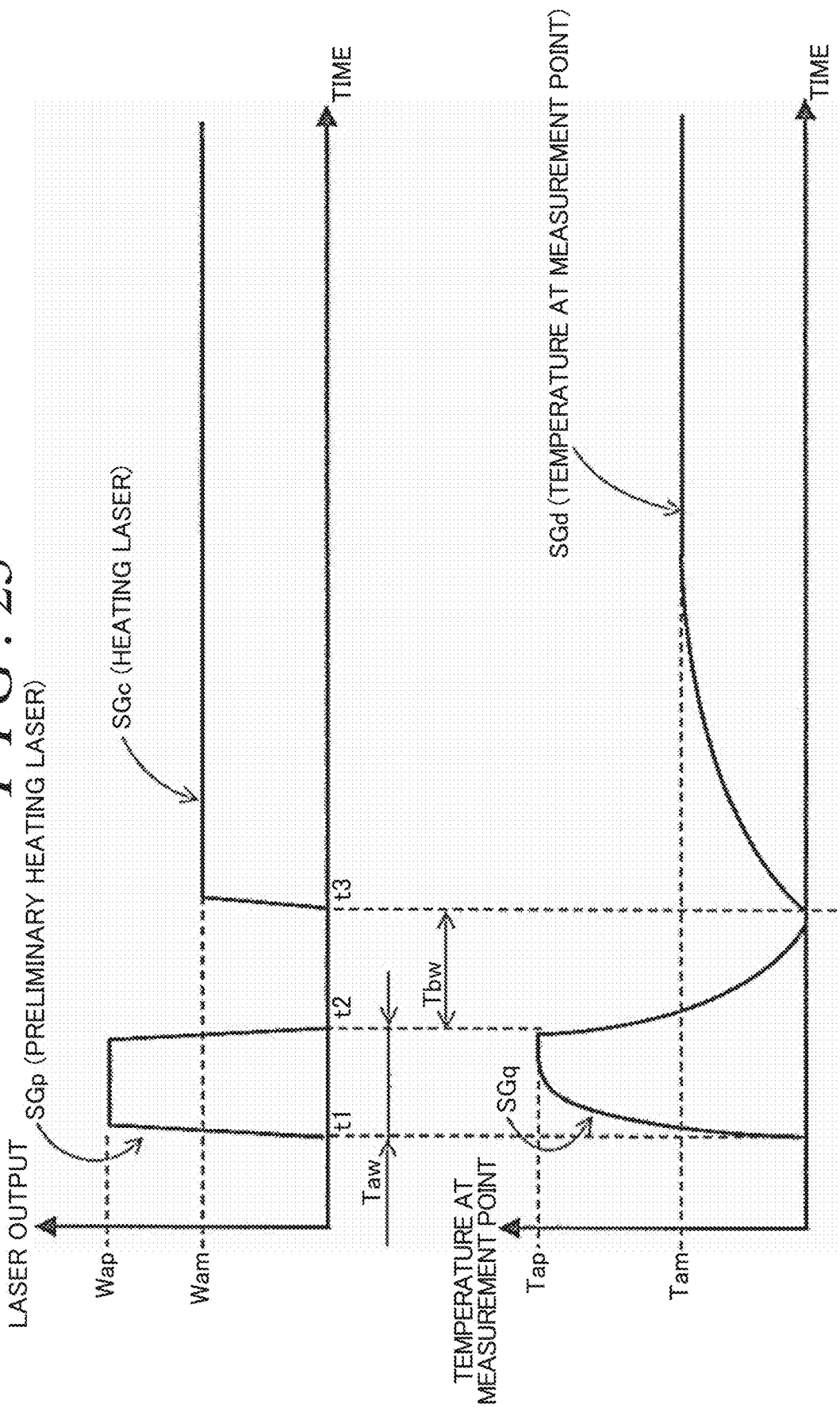
FIG. 23 illustrates an example of the state of irradiation of the measurement point with laser and temperature variations at the measurement point according to the second embodiment.

Next, an example of the process procedure for the determination device 70 will be described with reference to the flowchart illustrated in FIG. 21(a) and FIG. 21(b). When the operator starts the determination device 70, for example, the determination device 70 proceeds to step S15. Steps S15 to S35 in the flowchart illustrated in FIG. 21(a) and FIG. 21(b) are the same as steps S15 to S35, respectively, in the flowchart according to the first embodiment illustrated in FIG. 14(a) and FIG. 14(b), and thus will not be described. The determination device 70 reads the "preliminary heating pattern", the "preliminary heating laser output", and the "preliminary heating time" corresponding to the "product number" which is specified in step S30 from determination information H2 indicated in FIG. 22, and performs preliminary heating. When the determination device 70 executes the process in step S35, the process proceeds to step S36. How the preliminary heating laser is emitted in step S31B, how the heating laser is emitted in step S35, and the state of the temperature at the measurement point SP are as indicated in the example of FIG. 23. The preliminary heating laser SGp and the state of the temperature at the measurement point due to the preliminary heating laser SGp are the same as those according to the first embodiment indicated in FIG. 16, and cause thermal distortion in the first member (wire 91). The state of the heating laser at and after time t3 and the state of the temperature at the measurement point at and after time t3 in FIG. 23 differ from those according to the first embodiment indicated in FIG. 16.

In step S35, the determination device 70 reads the heating laser output corresponding to the product number using the determination information H2 (see FIG. 22), and outputs a control signal to the laser output device 27 so as to achieve heating laser at the heating intensity which is a constant output intensity. Then, the process proceeds to step S36. The process in step S35 corresponds to a heating laser emission step of emitting the heating laser at the heating intensity which is a constant output intensity from the laser output device toward the measurement point.

In step S36, the determination device 70 determines whether or not a predetermined time has elapsed. In the case where the predetermined time has elapsed (Yes), the process proceeds to step S37. In the case where the predetermined time has not elapsed (No), the process returns to step S36. The "predetermined time" is a sampling time during which the temperature at the measurement point SP is measured, and is set to a time of about several to several tens of milliseconds [ms], for example.

In the case where the process proceeds to step S37, the determination device 70 measures the intensity of the infrared light. Then, the process proceeds to step S38. Specifically, the determination device 70 retrieves a (first) infrared light intensity detection signal from the (first) infrared light intensity detection unit 31, and retrieves a (second) infrared light intensity detection signal from the (second) infrared light intensity detection unit 32. The process in step S37 corresponds to an information acquisition step of the determination device retrieving an infrared light intensity detection signal which is the measurement point information which is output from the infrared light intensity detection unit on the basis of the intensity of the infrared light which is radiated from the measurement point.

Figure 24:
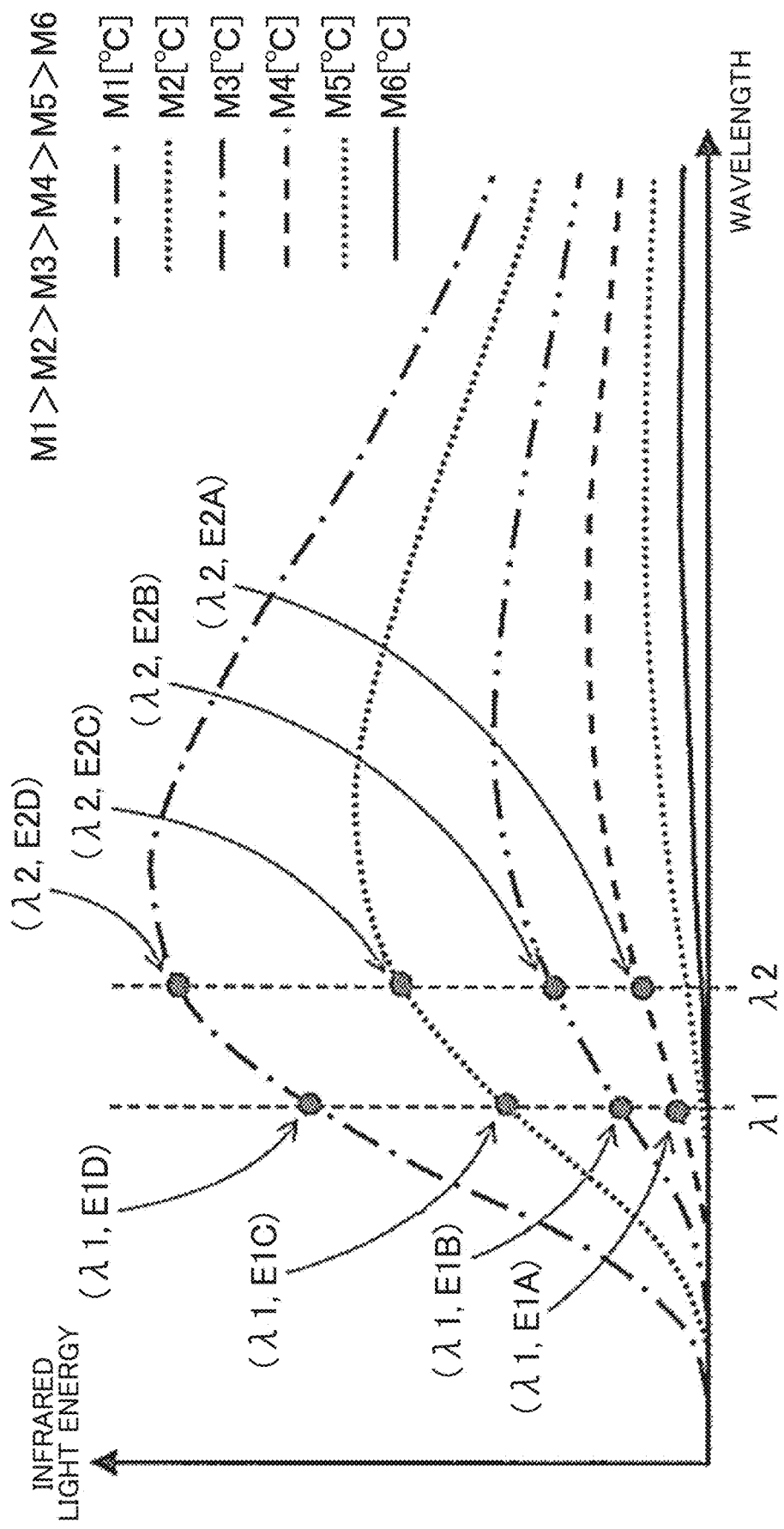
FIG. 24 illustrates the relationship among the wavelength of infrared light, the infrared light energy (intensity), and the temperature.
Figure 25:
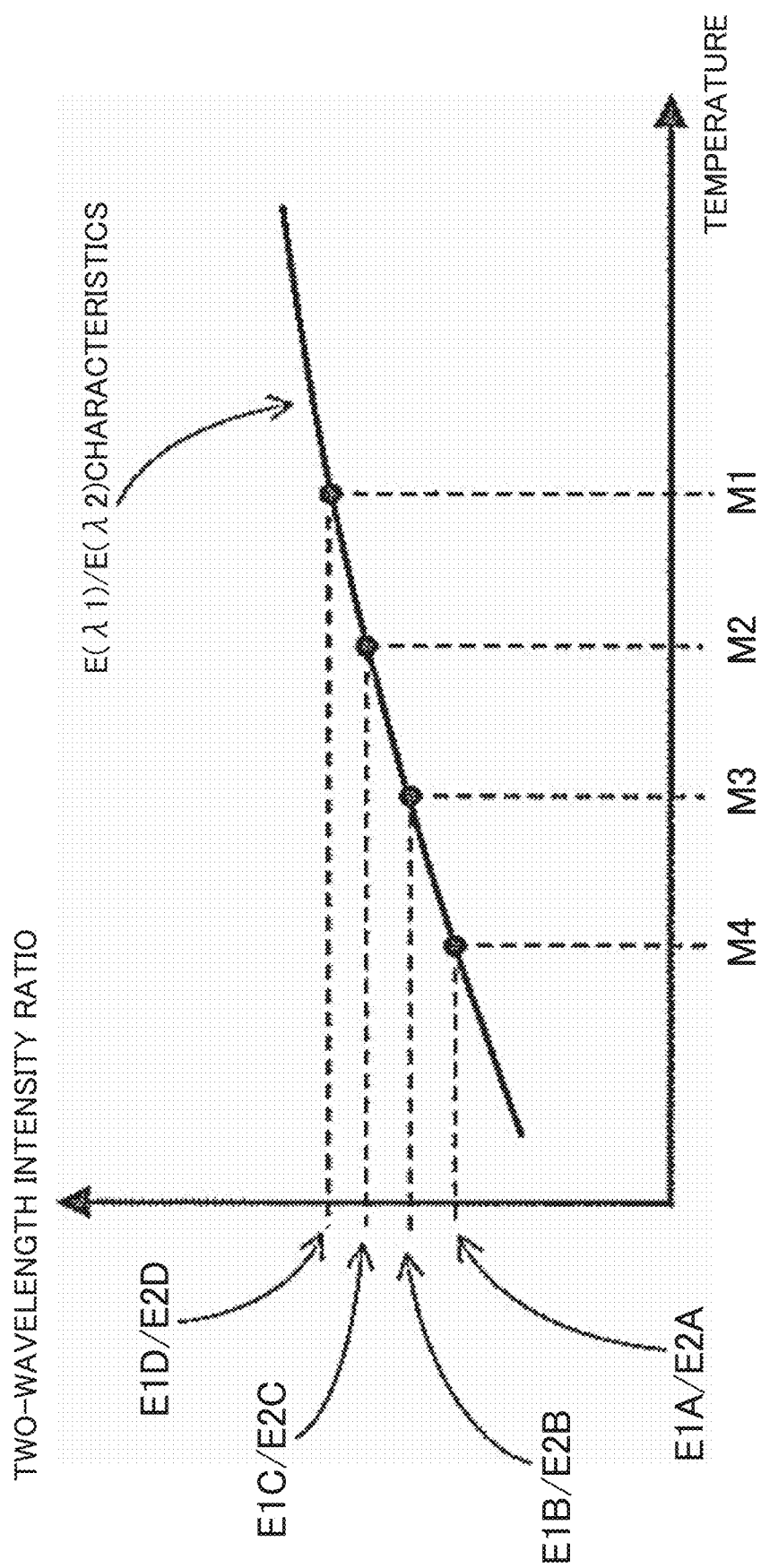
FIG. 25 illustrates the relationship between the temperature and the two-wavelength intensity ratio (infrared light energy at a wavelength $\lambda 1$/infrared light energy at a wavelength $\lambda 2$)

In step S38, the determination device 70 converts the intensity of the measured infrared light into a temperature. Then, the process proceeds to step S39. FIG. 24 illustrates an example of the wavelength/intensity/temperature characteristics which represent the relationship among the (infrared light) wavelength, the infrared light energy (intensity), and the temperature for a case where the emissivity is 100%, for example. FIG. 24 indicates that, if the emissivity at the measurement point SP is 100% and in the case where the temperature at the measurement point is M2 [° C.], for example, the infrared light at the wavelength λ1 from the (first) infrared light intensity detection unit 31 has an intensity of E1C and the infrared light at the wavelength λ2 from the (second) infrared light intensity detection unit 32 has an intensity of E2C. However, the emissivity differs among the measurement target objects in reality. Even if the emissivity differs, the ratio of intensity E1C/intensity E2C is constant in the case where the temperature is M2 [° C.]. Thus, the ratio (two-wavelength intensity ratio) of infrared light intensity at wavelength λ1/infrared light intensity at wavelength λ2 can be converted into a temperature using the temperature/two-wavelength intensity ratio characteristics illustrated in FIG. 25. That is, the determination device 70 can obtain the two-wavelength intensity ratio as the ratio of intensity based on (first) infrared light intensity detection signal/intensity based on (second) infrared light intensity detection signal, and obtain the temperature at the measurement point SP from the obtained two-wavelength intensity ratio and the temperature/two-wavelength intensity ratio characteristics illustrated in FIG. 25.

In step S39, the determination device 70 reads the "measurement time" corresponding to the specified "product number" from the determination information H2 (see FIG. 22). The determination device 70 determines whether or not the time which has elapsed since step S35 has reached the measurement time. In the case where the measurement time has been reached (Yes), the process proceeds to step S65A. In the case where the measurement time has not been reached (No), the process returns to step S36. The process of the determination device retrieving an infrared light intensity detection signal in steps S36 to S39 corresponds to an information acquisition step of the determination device retrieving an infrared light intensity detection signal which is the measurement point information which is output from the infrared light intensity detection unit on the basis of the intensity of the infrared light which is radiated from the measurement point.

In the case where the process proceeds to step S65A, the determination device 70 outputs a control signal to the laser output device 27, and stops emission of the heating laser from the laser output device 27. Then, the process proceeds to step S70A.

In step S70A, the determination device 70 obtains the relationship between the temperature rise characteristics which are based on the temperature at the measurement point SP which is obtained each predetermined time and the normalized temperature rise characteristics (characteristics obtained by normalizing the characteristics which indicate the correlation between the time and the temperature) corresponding to the "product number" in the determination information H2 (see FIG. 22) which is stored in the storage device of the determination device 70 itself or an external storage device. Then, the process proceeds to step S80A.

Figure 26:
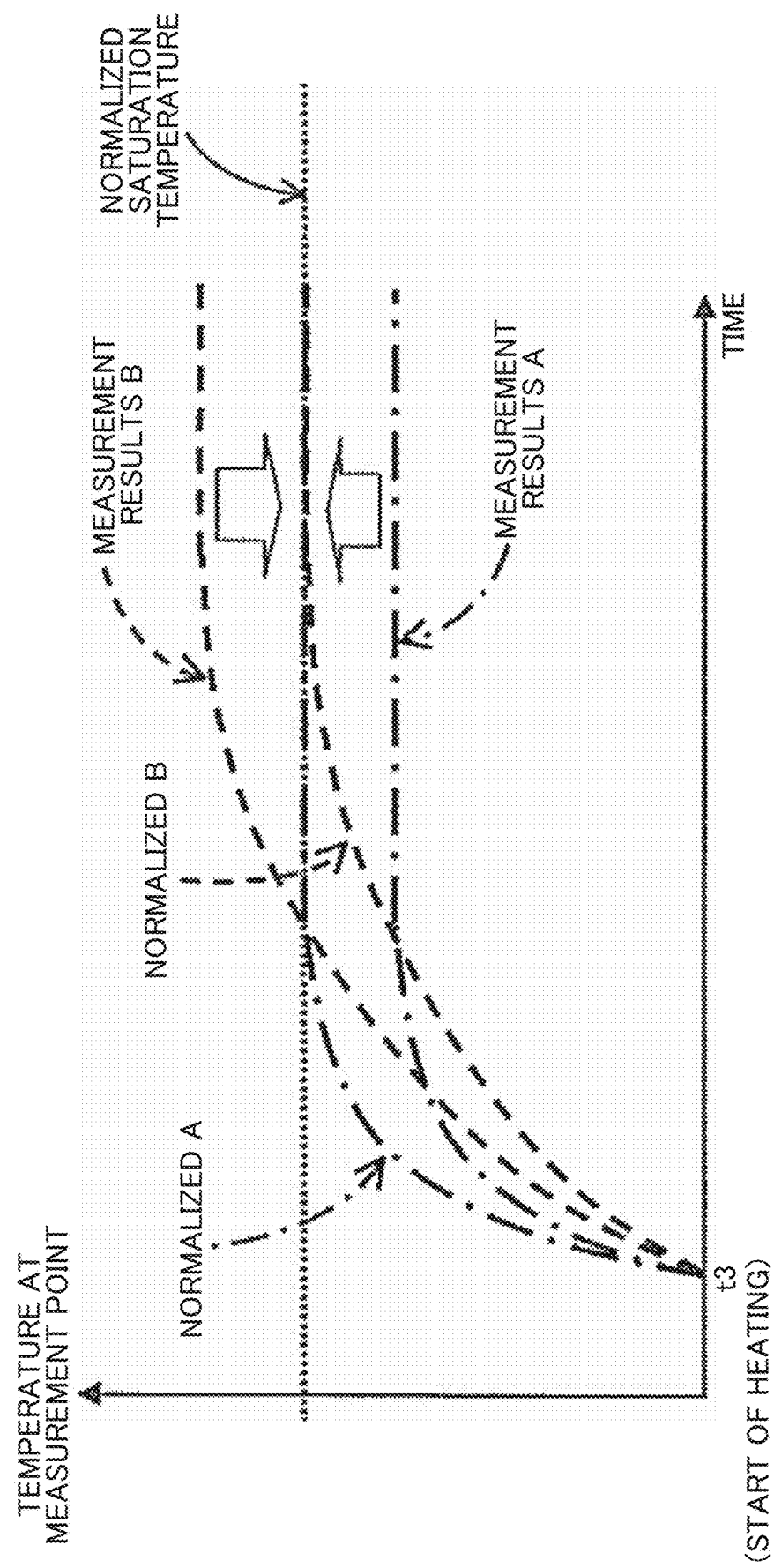
FIG. 26 illustrates an example of the temperature rise characteristics and an example of normalization.

For example, the "measurement result A" in FIG. 26 is an example of the measurement result from a sample with the product number A, in which the joint portion area is the maximum allowable area. The "measurement result B" in FIG. 26 is an example of the measurement result from a sample with the product number A, in which the joint portion area is the minimum allowable area. When the measurement point SP is irradiated with the heating laser at the heating intensity (constant intensity), the temperature at the measurement point SP is gradually raised. When a saturation temperature at which the amount of applied heat and the amount of radiated heat coincide with each other is reached, however, the rise in the temperature is stopped, and the temperature is substantially constant (at the saturation temperature) even if the heating is continued. In the case where the joint portion area is relatively large, the amount of conducted heat is large, and heat is dissipated easily via the joint portion. Thus, the time before the saturation temperature is reached is short, and the saturation temperature is relatively low. In the case where the joint portion area is relatively small, the amount of conducted heat is small, and heat is not dissipated easily via the joint portion. Thus, the time before the saturation temperature is reached is long, and the saturation temperature is relatively high.

When the saturation temperature of the temperature rise characteristics of the measurement target object is between the respective saturation temperatures of the "measurement result A" and the "measurement result B" indicated in FIG. 26, the joint portion area of the measurement target object is equal to or larger than the minimum allowable area and equal to or smaller than the maximum allowable area, and thus it can be determined that the measurement target object is a conforming product. By performing "normalization" as described below, it can be determined more appropriately whether or not the measurement target object is conforming by suppressing an error in the temperature measurement.

The "normalization" for the product number A will be described below with reference to FIG. 26. For example, the temperature rise characteristics of an (ideal) sample that has an ideal joint portion area for the product number A are obtained, and the saturation temperature for the (ideal) sample is set to a normalized saturation temperature. Then, the "measurement result A", which is the temperature rise characteristics of a sample with the product number A, in which the joint portion area is the maximum allowable area, is obtained, and thereafter the "normalized A", which is obtained by expanding (or contracting) the "measurement result A" in the temperature direction such that the saturation temperature of the "measurement result A" coincides with the normalized saturation temperature, is obtained. The "measurement result B", which is the temperature rise characteristics of a sample with the product number A, in which the joint portion area is the minimum allowable area, is obtained, and thereafter the "normalized B", which is obtained by compressing (or expanding) the "measurement result B" in the temperature direction such that the saturation temperature of the "measurement result B" coincides with the normalized saturation temperature, is obtained.

Figure 27:
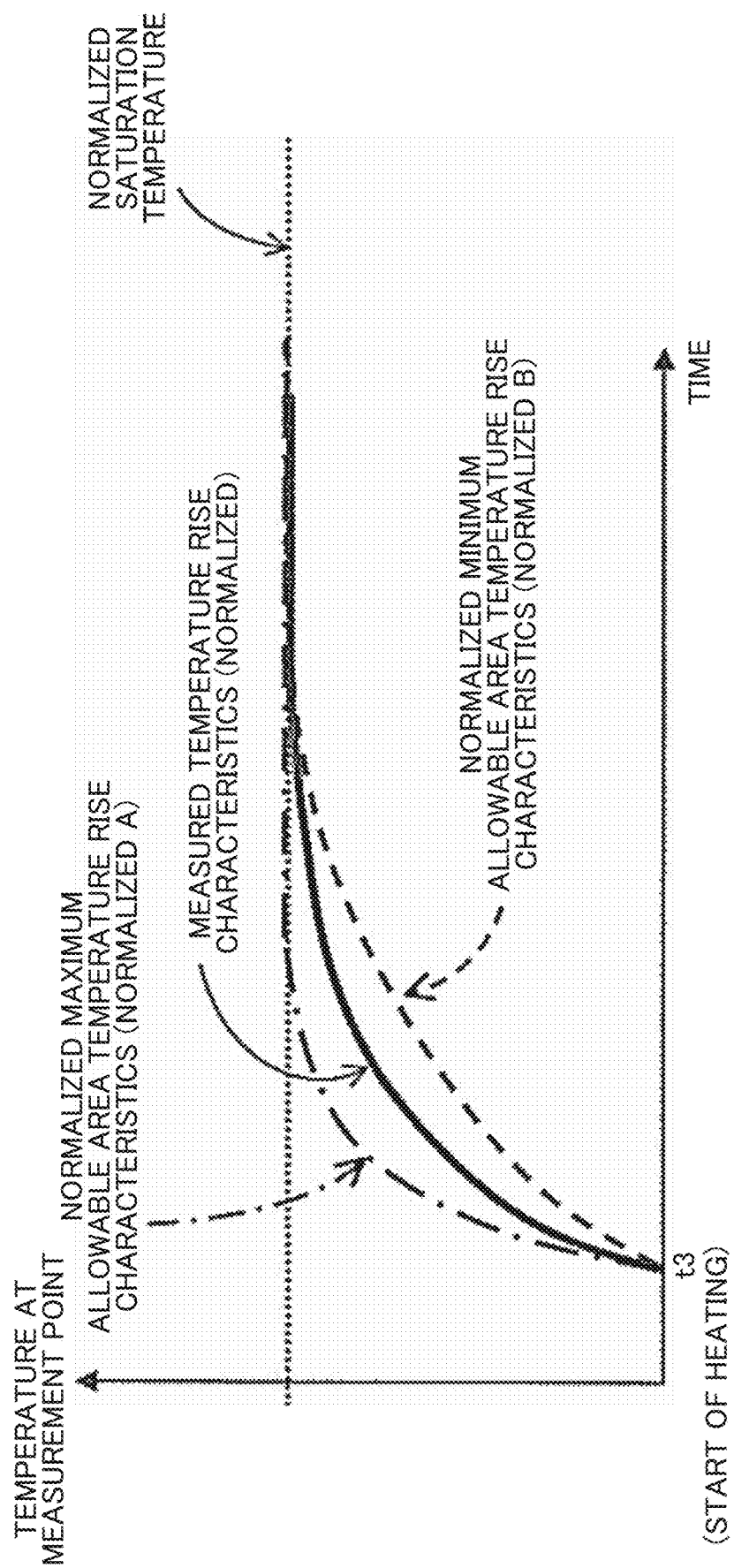
FIG. 27 illustrates an example of normalized temperature rise characteristics for a minimum allowable area, normalized temperature rise characteristics for a maximum allowable area, and normalized measured temperature rise characteristics.

As illustrated in FIG. 27, the "measured temperature rise characteristics (normalized)" are obtained by compressing or expanding the measured temperature rise characteristics in the temperature direction such that the saturation temperature of the temperature rise characteristics of the measurement target object coincides with the normalized saturation temperature. In the case where a portion of the "measured temperature rise characteristics (normalized)" before the normalized saturation temperature is reached is located between the "normalized maximum allowable area temperature rise characteristics (normalized A)" and the "normalized minimized allowable area temperature rise characteristics (normalized B)", the determination device 70 determines that the measurement target object is a conforming product since the joint portion area of the measurement target object is equal to or larger than the minimum allowable area and equal to or smaller than the maximum allowable area.

Figure 28:
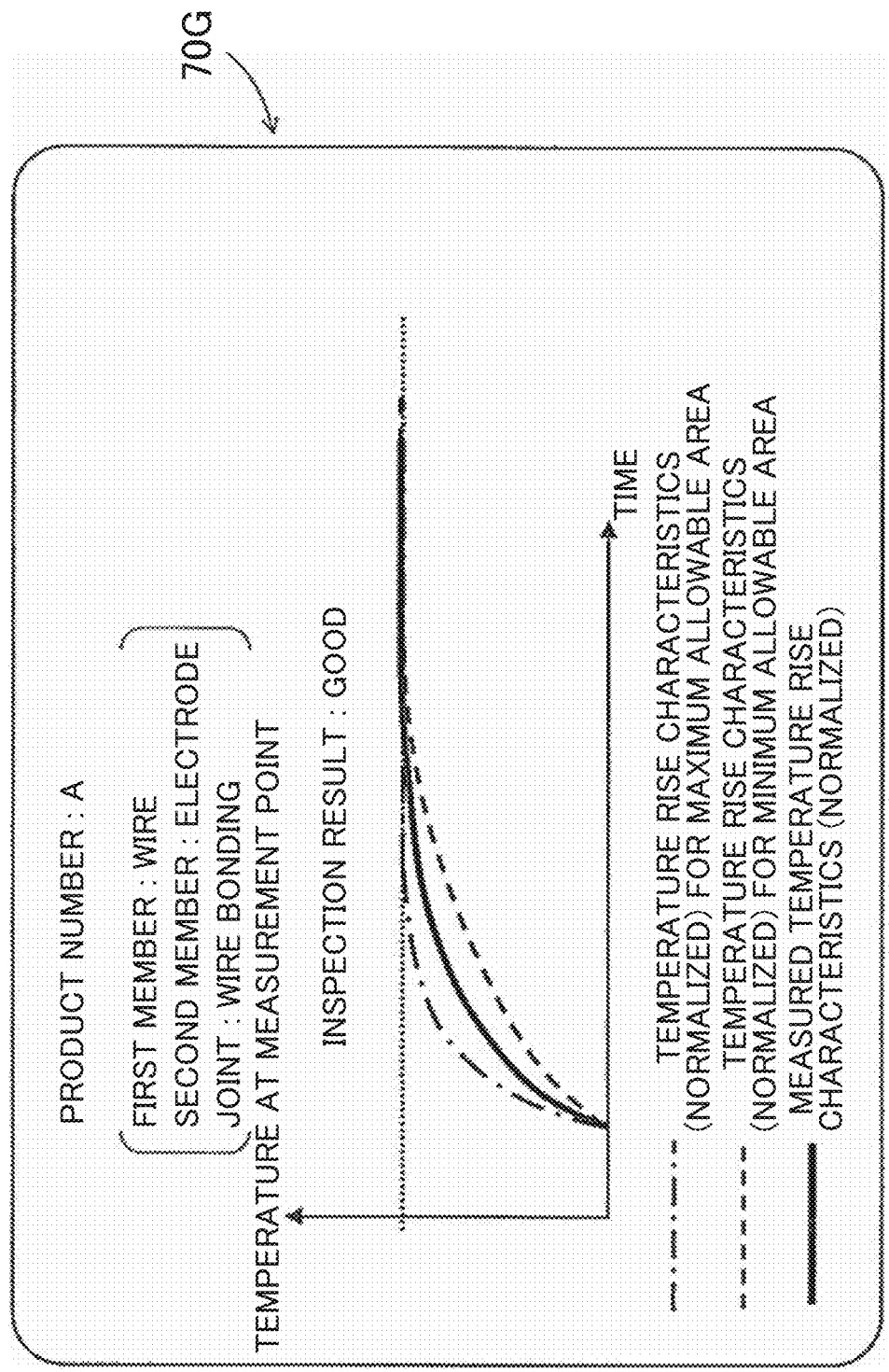
FIG. 28 illustrates an example of determination results.

In step S80A, the determination device 70 outputs (see FIG. 28) determination results indicating that the joint state between the first member and the second member is normal or abnormal in accordance with the joint portion area (whether or not the joint portion area is equal to or larger than the minimum allowable area and equal to or smaller than the maximum allowable area) which is obtained in step S70A. The process is finished. For example, the determination device 70 determines that the joint state is normal in the case where the "measured temperature rise characteristics (normalized)" are located between the maximum allowable area temperature rise characteristics (normalized A) and the minimum allowable area temperature rise characteristics (normalized B) as indicated in FIG. 27, and displays the determination results as illustrated in the example of FIG. 28. Alternatively, the determination device 70 determines that the joint state is normal in the case where the "measured temperature rise characteristics (normalized)" are located on the side of the maximum allowable area temperature rise characteristics (normalized A) with respect to the line for the minimum allowable area temperature rise characteristics (normalized B), and displays the determination results. Thus, the determination device 70 has an output unit (output section) that outputs determination results that indicate whether or not the joint portion area falls within a predetermined range set in advance, or whether or not the joint portion area is equal to or larger than a predetermined area set in advance. The processes in steps S70A and S80A correspond to a joint state determination step of determining the joint state of the joint portion on the joint interface on the basis of the temperature rise characteristics (see FIG. 27) at the measurement point which are the acquisition-associated information which is obtained from the infrared light intensity detection signal.

Next, an overall configuration of an optical non-destructive inspection apparatus 1C according to a third embodiment will be described with reference to FIG. 29. In the optical non-destructive inspection apparatus 1C according to the third embodiment, the intensity of laser light emitted from a laser light source 21A itself is not varied, but the amount of laser light that passes through a pin hole PH is increased and decreased by refracting the emitted laser light at a variety of angles, and the intensity of laser light reflected at the measurement point SP is detected, in contrast to the optical non-destructive inspection apparatus (FIG. 5) according to the first embodiment. The optical non-destructive inspection apparatus 1C according to the third embodiment illustrated in FIG. 29 differs from the optical non-destructive inspection apparatus 1 according to the first embodiment illustrated in FIG. 5 in that the laser output device 27 is replaced with a laser output device 27A to provide the heating laser La which is linear, that the heating laser selective reflection unit 23 has been omitted, and that a reflection light selective reflection unit 43 has been added. In addition, the optical non-destructive inspection apparatus 1C also differs from the optical non-destructive inspection apparatus 1 in that the measurement target object 90 is inclined in accordance with the radiation direction (incident angle) and the reflection direction (reflection angle) of the heating laser La. Such differences will be mainly described below. The configuration other than the differences is the same as that described in relation to the first embodiment, and thus will not be described.

The laser output device 27A has the laser light source 21A which emits the heating laser La which is linear, an acousto-optic modulator 24, and the modulation signal output unit 25, for example. The laser output device 27A emits the heating laser La on the basis of a control signal from the determination device 70 such that the intensity of the heating laser La which is radiated to the measurement point SP is varied sinusoidally. The modulation signal output unit 25 is an oscillator, for example, and generates a modulation signal, the voltage of which is varied sinusoidally with a predetermined frequency and a predetermined amplitude, on the basis of a control signal from the determination device 70. The heating laser La which is linear and emitted from the laser light source 21A is input to the acousto-optic modulator 24, and diffracted (refracted) by the acousto-optic modulator 24 as discussed later. The acousto-optic modulator 24 includes an electro-optic modulation (EOM) device and a surface acoustic wave (SAW) device. For example, the electro-optic modulation device varies the index of refraction in piezoelectric crystals by causing a piezoelectric effect by applying an electric field or an ultrasonic wave on the basis of a modulation signal from the modulation signal output unit 25 when light passes through the piezoelectric crystals. The refracted heating laser is picked up as diffracted light. The heating laser La which is emitted from the acousto-optic modulator 24 is periodically refracted at a fine refraction angle as described above, passes through the pin hole PH which is provided in a laser shielding member, and is condensed at the measurement point SP by an objective lens LT. That is, the amount of the heating laser La which passes through the pin hole PH is varied periodically when the heating laser La passes through the pin hole PH while being refracted periodically at a variety of refraction angles. As a result, the intensity of the heating laser La, which is radiated to the measurement point SP, is varied sinusoidally, and the frequency of the heating laser La is synchronized with the frequency of the modulation signal. The output of the heating laser is adjusted to an output that allows the measurement target object to be heated without being destroyed.

When a control signal for radiating preliminary heating laser with a thermal distortion generation intensity which is a constant output intensity and an adjusted irradiation time is input from the determination device 70, the laser output device 27A outputs preliminary heating laser with an intensity corresponding to the thermal distortion generation intensity and for a time corresponding to the irradiation time, in order to cause thermal distortion without destroying the wire 91 (first member) before emitting the heating laser. The wavelength of the preliminary heating laser is the same as the wavelength of the heating laser.

The reflection light selective reflection unit 43 is disposed at any position in the optical path of the first measurement light L11 (measurement light that includes irradiated light reflected at the measurement point SP and infrared light radiated from the measurement point SP). The reflection light selective reflection unit 43 is a dichroic mirror that reflects light at the wavelength of reflected light of the heating laser La reflected at the measurement point SP (that is, wavelength of the heating laser) and that transmits light at wavelengths other than the wavelength of the reflected light, for example. The light condensing lens 41L and the laser intensity detection unit 41 are disposed in the path of reflected light L5 reflected by the reflection light selective reflection unit 43. The light condensing lens 41L and the laser intensity detection unit 41 are the same as those described in relation to the first embodiment, and thus will not be described.

An inclined table 75T is disposed between the X-axis direction slide table 75 and the measurement target object 90. The inclined table 75T has an inclination angle θ based on the incident angle of the heating laser La at the measurement point SP and the reflection angle of the heating laser La (the angle of the first measurement light L11 along an optical axis 10Z). The inclined table 75T is fixed to the X-axis direction slide table 75. The measurement target object 90 is fixed to the inclined table 75T.

The process procedure, the determination information, etc. for the determination device 70 and the phase difference detection device 60 according to the third embodiment are the same as those according to the first embodiment described with reference to FIGS. 14(a) to 18, and thus will not be described.

Figure 30:
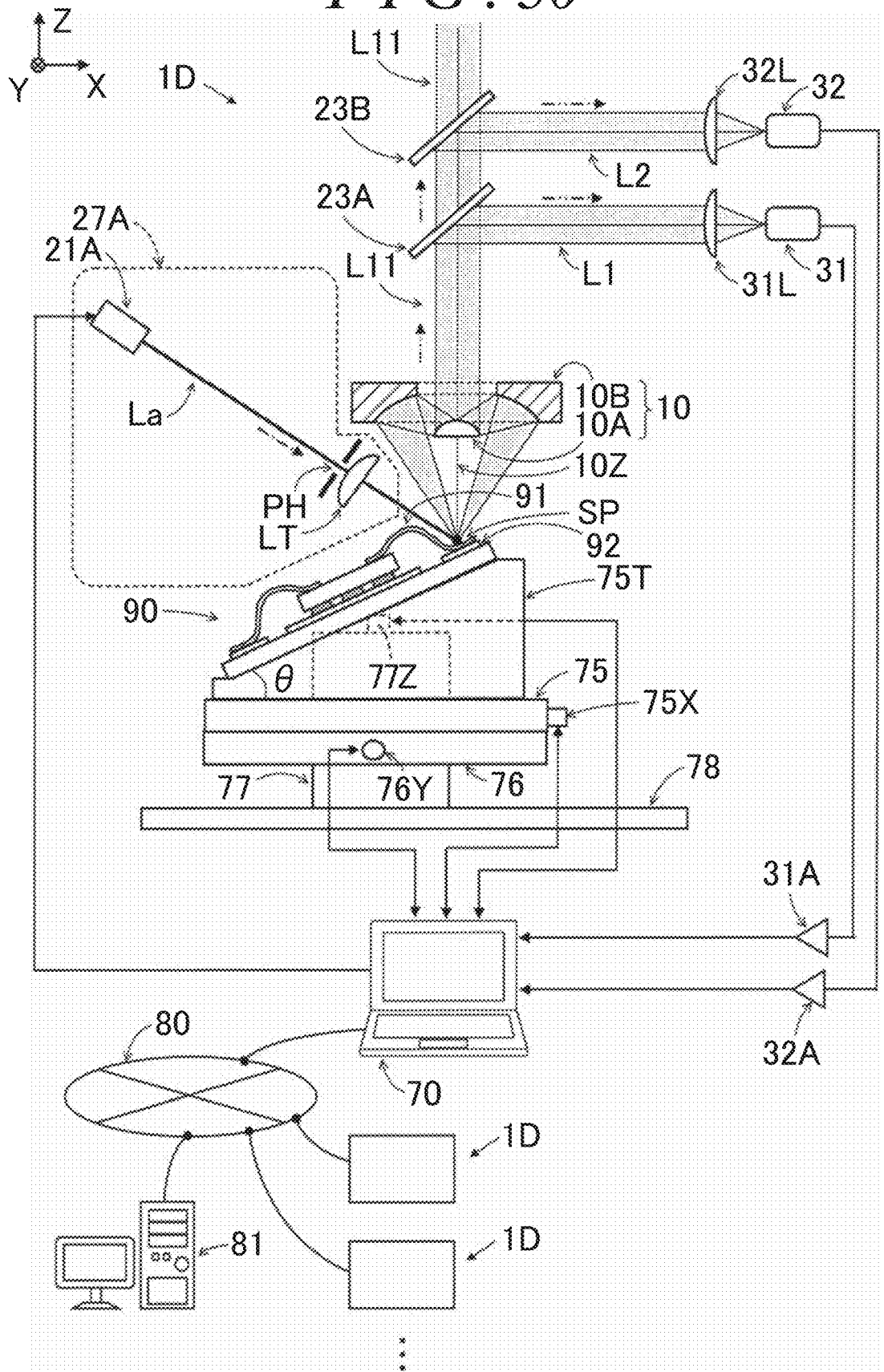
FIG. 30 illustrates an overall configuration of an optical non-destructive inspection apparatus according to a fourth embodiment.

Next, an overall configuration of an optical non-destructive inspection apparatus 1D according to a fourth embodiment will be described with reference to FIG. 30. The optical non-destructive inspection apparatus 1D according to the fourth embodiment illustrated in FIG. 30 differs from the optical non-destructive inspection apparatus 1B according to the second embodiment illustrated in FIG. 20 in that the laser output device 27 is replaced with a laser output device 27A to provide the heating laser La which is linear and that the heating laser selective reflection unit 23R has been omitted. The optical non-destructive inspection apparatus 1D also differs from the optical non-destructive inspection apparatus 1B in that the measurement target object 90 is inclined in accordance with the radiation direction (incident angle) and the reflection direction (reflection angle) of the heating laser La. Such differences will be mainly described below. The configuration other than the differences is the same as that described in relation to the second embodiment, and thus will not be described.

Figure 29:
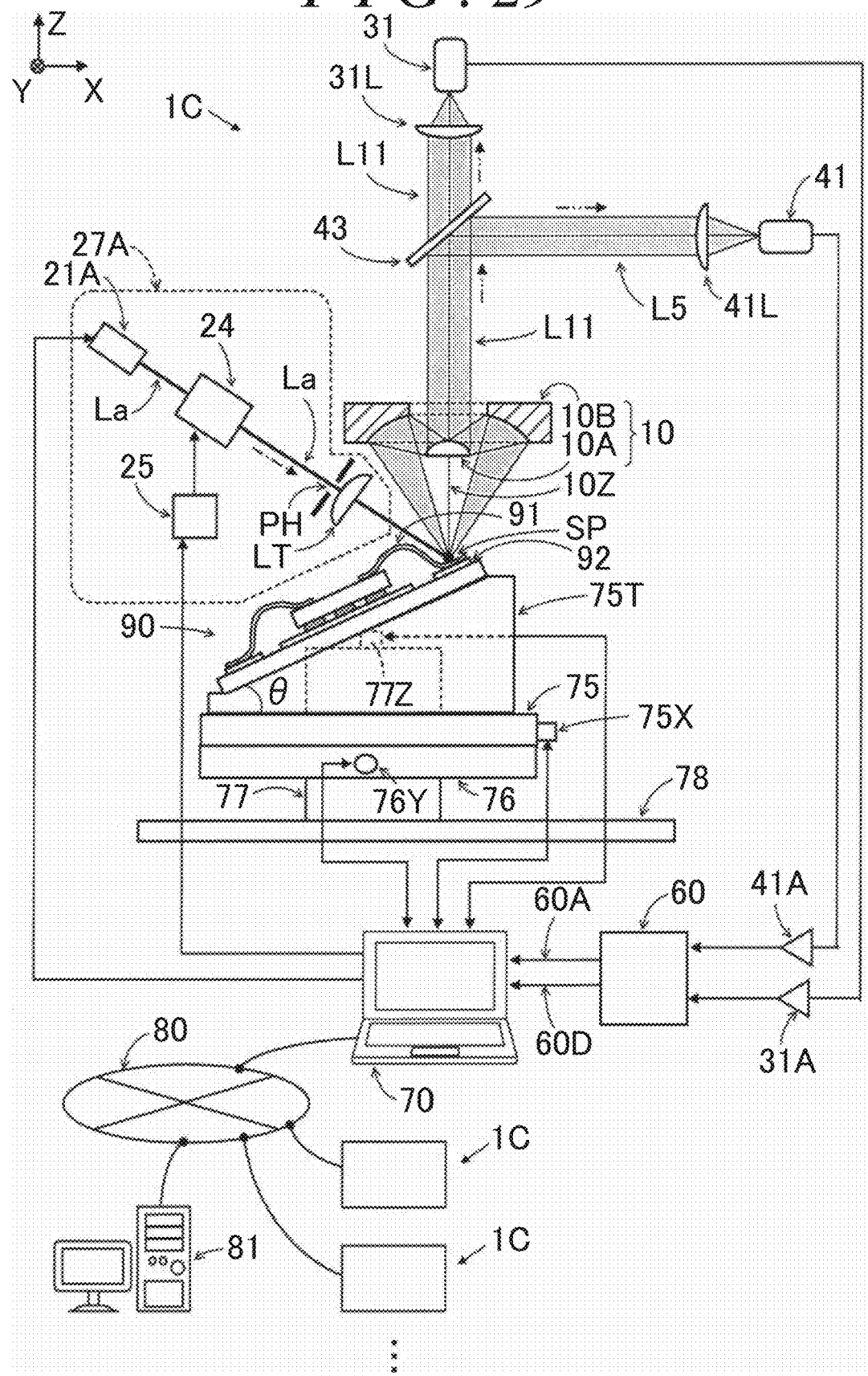
FIG. 29 illustrates an overall configuration of an optical non-destructive inspection apparatus according to a third embodiment.

The laser light source 21A in the laser output device 27A is the same as that according to the third embodiment illustrated in FIG. 29. The laser light source 21A emits heating laser La, the intensity (constant heating intensity) of which is specified in accordance with a control signal from the determination device 70. The heating laser La which is linear and emitted from the laser light source 21A passes through the pin hole PH, and thereafter is condensed at the measurement point SP by the objective lens LT. The output of the heating laser is adjusted to an output that allows the measurement target object to be heated without being destroyed.

When a control signal for radiating preliminary heating laser with a thermal distortion generation intensity which is a constant output intensity and an adjusted irradiation time is input from the determination device 70, the laser output device 27A outputs preliminary heating laser with an intensity corresponding to the thermal distortion generation intensity and for a time corresponding to the irradiation time, in order to cause thermal distortion without destroying the wire 91 (first member) before emitting the heating laser. The wavelength of the preliminary heating laser is the same as the wavelength of the heating laser.

An inclined table 75T is disposed between the X-axis direction slide table 75 and the measurement target object 90, as in the third embodiment. The inclined table 75T has an inclination angle θ based on the incident angle of the heating laser La at the measurement point SP and the reflection angle of the heating laser La (the angle of the first measurement light L11 along an optical axis 10Z). The inclined table 75T is fixed to the X-axis direction slide table 75. The measurement target object 90 is fixed to the inclined table 75T.

The process procedure, the determination information, etc. for the determination device 70 according to the fourth embodiment are the same as those according to the second embodiment described with reference to FIGS. 21(a) to 28, and thus will not be described.

Figure 31:
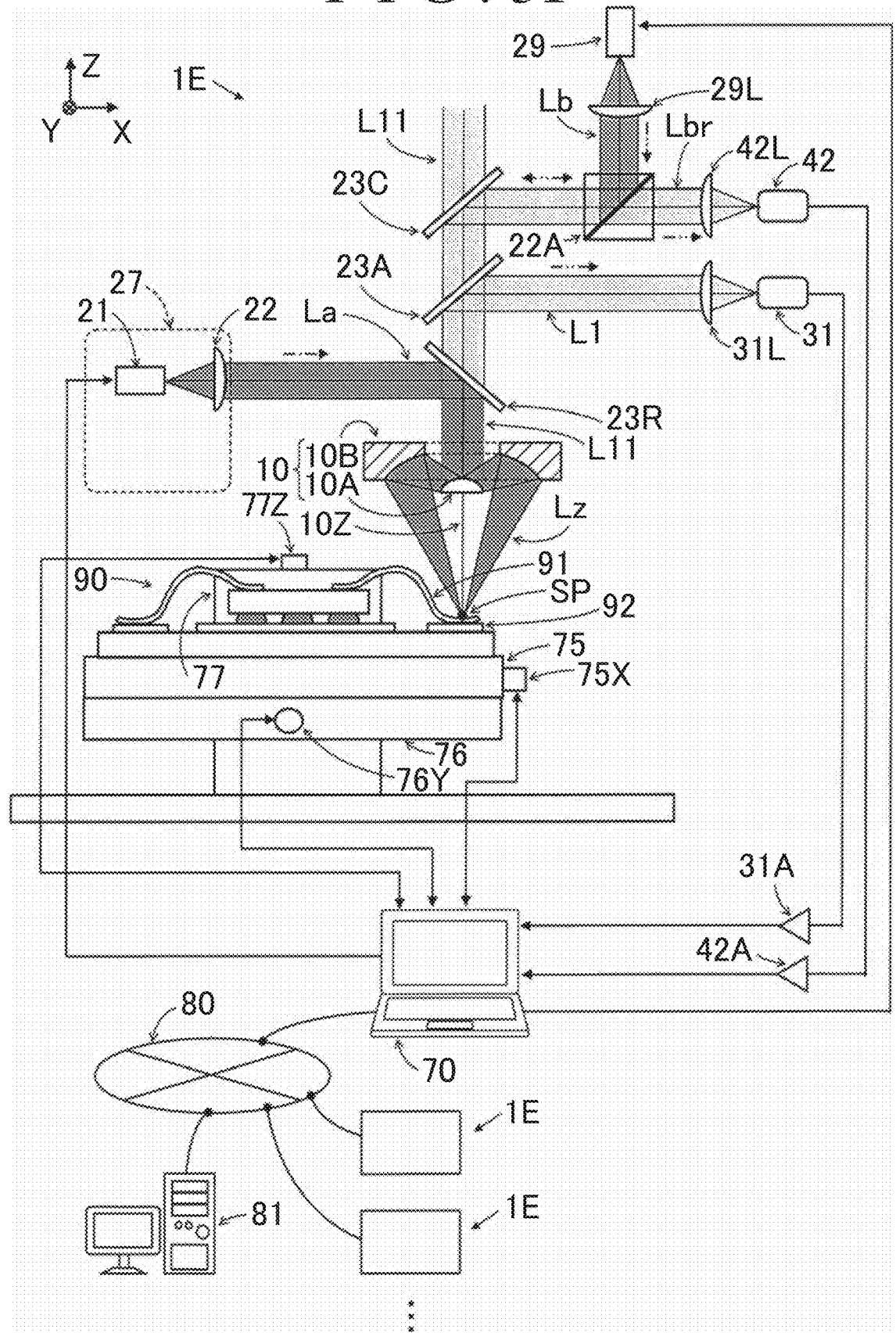
FIG. 31 illustrates an overall configuration of an optical non-destructive inspection apparatus according to a fifth embodiment.

Next, an overall configuration of an optical non-destructive inspection apparatus 1E according to a fifth embodiment will be described with reference to FIG. 31. The optical non-destructive inspection apparatus 1E according to the fifth embodiment illustrated in FIG. 31 differs from the optical non-destructive inspection apparatus 1B according to the second embodiment illustrated in FIG. 20 in that the second infrared light selective reflection unit 23B, the light condensing lens 23L, and the (second) infrared light intensity detection unit 32 have been omitted, and that a correction laser selective reflection unit 23C, a beam splitter 22A, a correction laser light source 29, a collimating lens 29L, a laser intensity detection unit 42, and a light condensing lens 42L have been added. Such differences will be mainly described below. The configuration other than the differences is the same as that described in relation to the second embodiment, and thus will not be described.

The correction laser light source 29 emits correction laser with a correction laser wavelength (that is different from the wavelength of the heating laser), the output of which is adjusted to be sufficiently smaller than that of the heating laser, on the basis of a control signal from the determination device 70. The correction laser light source 29 emits semiconductor laser, for example.

The collimating lens 29L is disposed in the vicinity of the correction laser light source 29, and converts the correction laser which is emitted from the correction laser light source 29 into correction laser Lb which is parallel light. The collimating lens 29L can be omitted if the correction laser light source 29 can emit correction laser which is parallel light.

The beam splitter 22A reflects a first predetermined proportion of the correction laser with the correction laser wavelength which is emitted from the correction laser light source 29, transmits a second predetermined proportion of the correction laser, and guides the reflected first predetermined proportion of the correction laser which is parallel light to the correction laser selective reflection unit 23C. The correction laser selective reflection unit 23C is a dichroic mirror that reflects light at the correction laser wavelength and that transmits light at wavelengths other than the correction laser wavelength.

A correction laser guiding unit is constituted from the collimating lens 29L, the beam splitter 22A, the correction laser selective reflection unit 23C, and the heating laser selective reflection unit 23R. The correction laser guiding unit guides the correction laser, which is emitted from the correction laser light source 29, toward one side of the light condensing unit 10 after conversion into parallel light.

The laser intensity detection unit 42 is capable of detecting the energy of the correction laser which is reflected at the measurement point SP. The laser intensity detection unit 42 is a light sensor that is capable of detecting the energy of light with the correction laser wavelength, for example. A detection signal from the laser intensity detection unit 42 is retrieved by the determination device 70 via a sensor amplifier 42A.

The beam splitter 22A transmits a second predetermined proportion of the (reflected) correction laser, which is reflected from the measurement point SP and reflected by the correction laser selective reflection unit 23C, toward the laser intensity detection unit 42.

The light condensing lens 42L is disposed in the vicinity of the laser intensity detection unit 42, and condenses parallel light Lbr (correction laser) with a correction laser wavelength, which is reflected from the measurement point SP and has passed through the beam splitter 22A, toward the laser intensity detection unit 42.

A reflected laser guiding unit is constituted from the heating laser selective reflection unit 23R, the correction laser selective reflection unit 23C, the beam splitter 22A, and the light condensing lens 42L. The reflected laser guiding unit guides the correction laser, which is reflected at the measurement point SP and emitted from the one side of the light condensing unit 10, to the laser intensity detection unit 42.

Steps S35, S37, S38, and S65A in the process for the determination device 70 differ from those in the process procedure according to the second embodiment illustrated in FIG. 21(a) and FIG. 21(b) as described below. The other steps in the process for the determination device 70 are the same as those in the process procedure according to the second embodiment, and thus will not be described.

In contrast to step S35 illustrated in FIG. 21(b), the determination device 70 according to the fifth embodiment emits heating laser and emits correction laser. In contrast to step S37 illustrated in FIG. 21(b), the determination device 70 according to the fifth embodiment retrieves an infrared light intensity detection signal from the (first) infrared light intensity detection unit 31 and a laser intensity detection signal from the laser intensity detection unit 42. In contrast to step S38 illustrated in FIG. 21(b), the determination device 70 according to the fifth embodiment obtains the reflectivity at the measurement point SP on the basis of the intensity of the correction laser, the first predetermined proportion and the second predetermined proportion of the beam splitter 22A, and the laser intensity detection signal, and obtains the emissivity on the basis of the reflectivity. The intensity of the infrared light intensity detection signal is corrected on the basis of the obtained emissivity, and the temperature at the measurement point SP is obtained from the corrected intensity and the wavelength/intensity/temperature characteristics indicated in FIG. 24. In contrast to step S65A illustrated in FIG. 21(b), the determination device 70 according to the fifth embodiment stops emission of the heating laser and the correction laser.

With the optical non-destructive inspection apparatus and the optical non-destructive inspection method according to the present invention described above, it is possible to determine, in a non-destructive manner, whether or not the joint state is good for a measurement target object that includes a first member and a second member joined to each other on the joint interface or a first member and a second member joined to each other with a joint member interposed therebetween on the joint interface.

In the optical non-destructive inspection apparatus and the optical non-destructive inspection method described in relation to the first to fifth embodiments, as described above, thermal distortion is caused in the first member by radiating the preliminary heating laser (see FIGS. 16 and 23) before the heating laser is radiated. Consequently, a [region in an unstable contact state], in which the first member and the second member contact or are separate from each other, is converted into a [region in a stable non-contact state (separate state)]. Thus, it is possible to determine whether or not the joint state is good by acquiring a more stable joint state by suppressing fluctuations in the joint state. An oxide film can also be formed at the measurement point by irradiating the measurement point with the preliminary heating laser. Thus, the surface roughness and the emissivity at the measurement point are brought into a more stable, better state. Thus, it is possible to determine whether or not the joint state is good more precisely. By using the determination information for the measurement target object which is obtained using a plurality of samples or through a plurality of simulations, it is possible to determine whether or not the joint state is good more accurately and easily for a variety of measurement target objects, such as for measurement target objects in which the first member and the second member are joined to each other directly by welding or the like, for measurement target objects in which the first member and the second member are joined to each other with a joint member such as solder interposed therebetween, and for a case where the first member and the second member are not of a single material.

Next, an optical non-destructive inspection apparatus and an optical non-destructive inspection method according to a sixth embodiment will be described with reference to FIGS. 32 to 38. An overall configuration of the optical non-destructive inspection apparatus according to the sixth embodiment is the same as that of the optical non-destructive inspection apparatus according to the first embodiment illustrated in FIGS. 4 and 5, and thus will not be described. The sixth embodiment differs from the first embodiment, in which the preliminary heating laser is emitted before the heating laser is emitted, in that surface foreign matter removal laser is emitted further before the preliminary heating laser is emitted. Differences from the first embodiment will be mainly described below.

Figure 32:
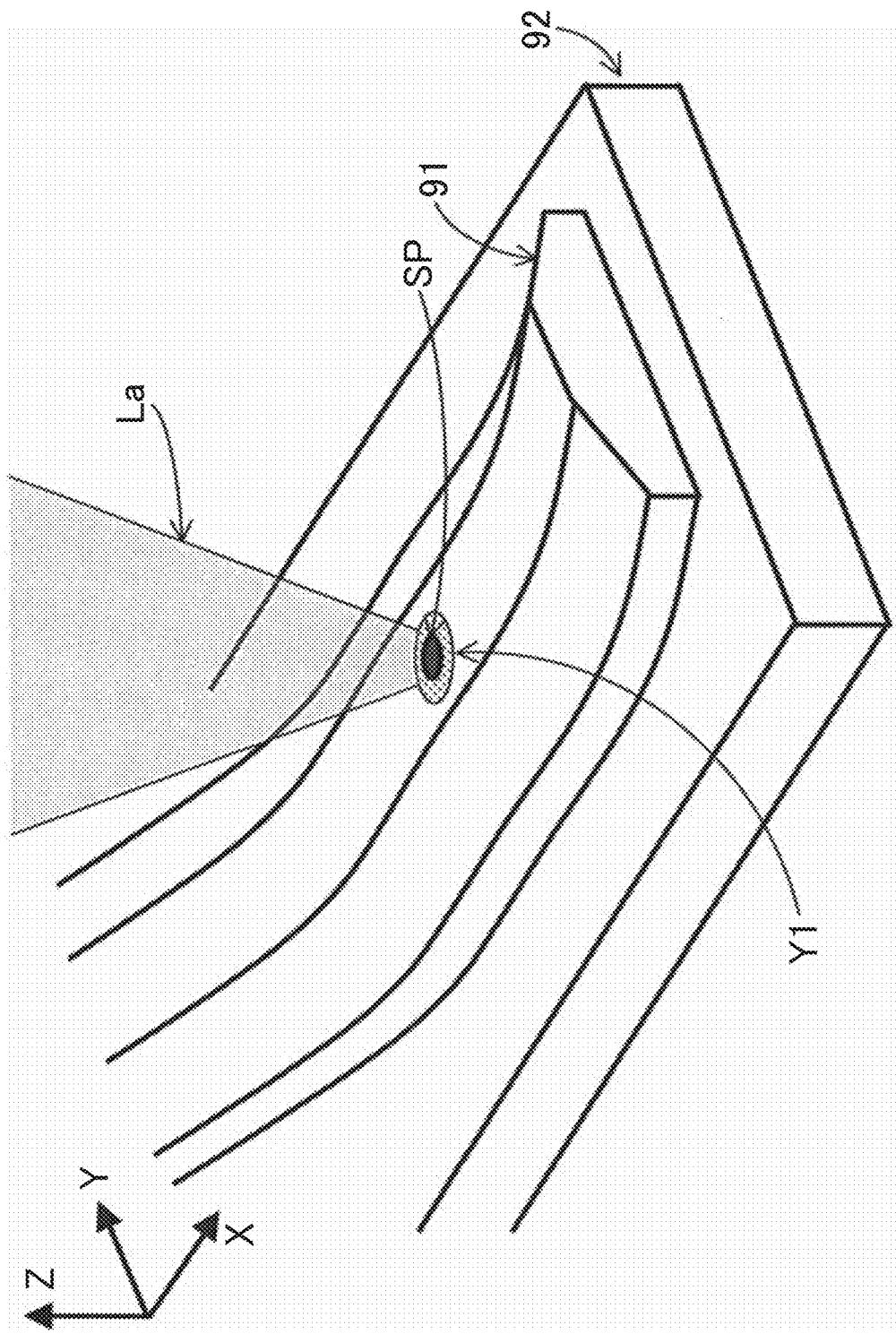
FIG. 32 is a perspective view illustrating how fused foreign matter is deposited around a measurement point because of heating laser in a sixth embodiment (obtained by adding a surface foreign matter removal process to the first embodiment)
Figure 33:
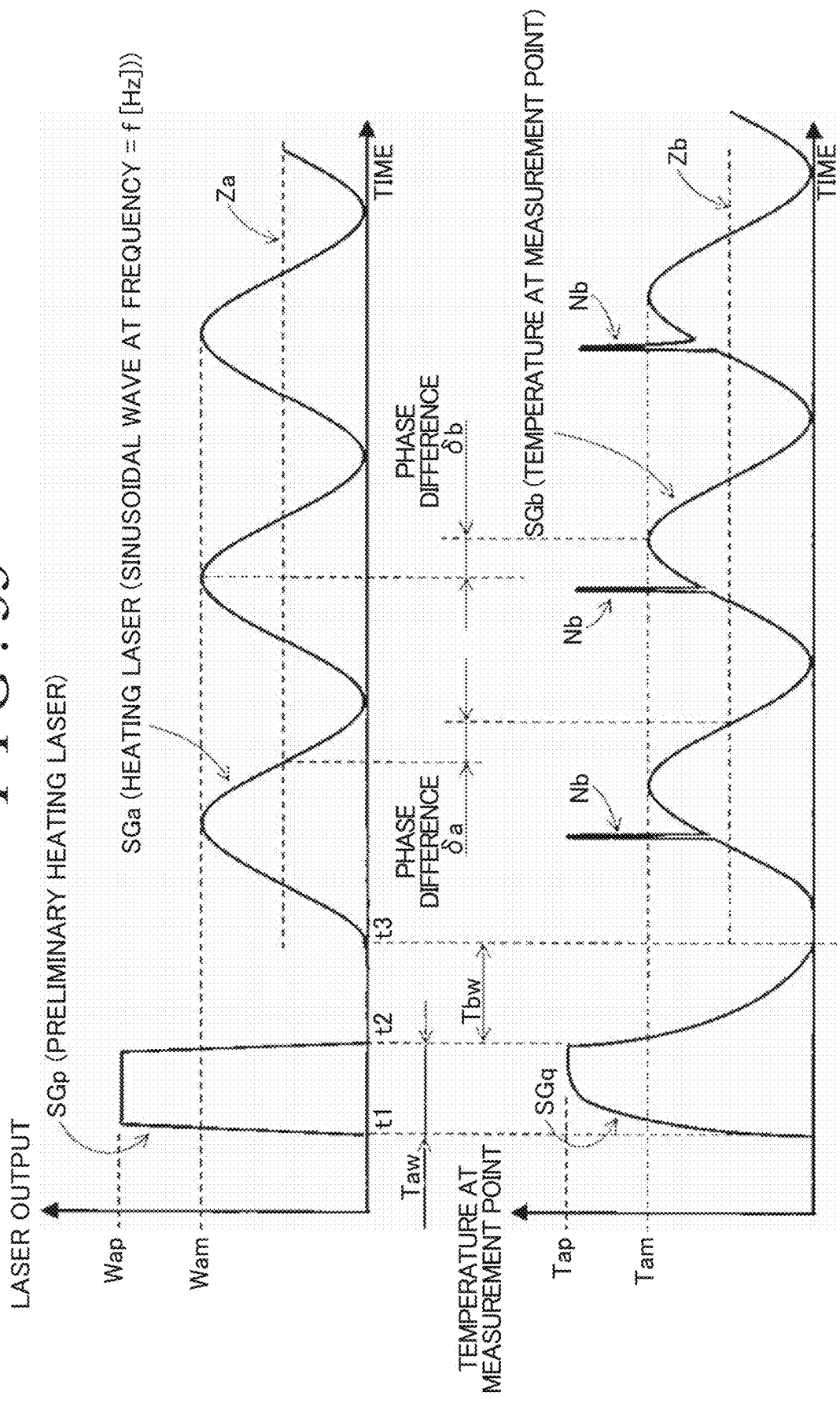
FIG. 33 illustrates an example in which noise is superposed on the temperature at the measurement point because of the fused foreign matter in contrast to FIG. 16.

In the case where the first member is the wire 91, the second member is the electrode 92, and the first member and the second member are joined to each other by soldering, for example, foreign matter such as flux for soldering and an organic solvent used to wash away the flux occasionally remains on the surface at the measurement point SP. If the measurement point SP is irradiated with the heating laser La in the case where such foreign matter remains on the surface at the measurement point SP, the foreign matter which adheres to the surface at the measurement point SP may be fused and flow from the measurement point SP to form an annular foreign matter deposition layer Y1 around the measurement point SP as illustrated in FIG. 32. When the measurement point SP is irradiated with the heating laser (SGa) illustrated in FIG. 33 in the case where the annular foreign matter deposition laser Y1 illustrated in the example of FIG. 32 is formed around the measurement point SP, temperature characteristics indicated by the signal SGb indicated in FIG. 33 may be exhibited. FIG. 33 illustrates an example in which noise Nb is superposed on the temperature at the measurement point by the foreign matter deposition laser Y1. In the sixth embodiment, a "surface foreign matter removal process" described below is added to the first embodiment to remove the foreign matter from the measurement point SP and an area around the measurement point SP (fuse the foreign matter and push the foreign matter out of the area around the measurement point SP) to prevent noise from the foreign matter from being superposed on the temperature at the measurement point.

Figure 34:
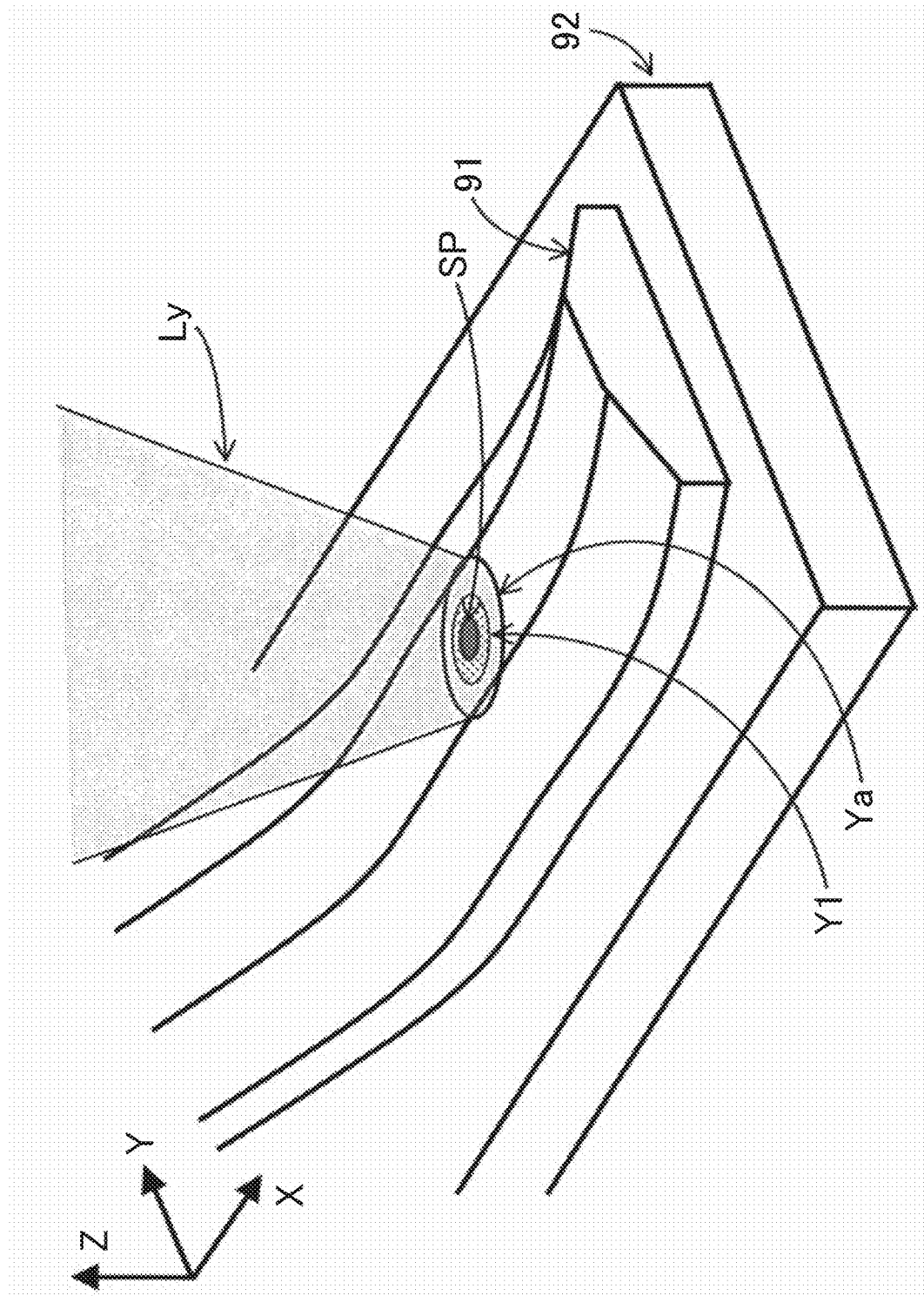
FIG. 34 is a perspective view illustrating an example in which the measurement point and an area around the measurement point are irradiated with surface foreign matter removal laser.
Figure 38:
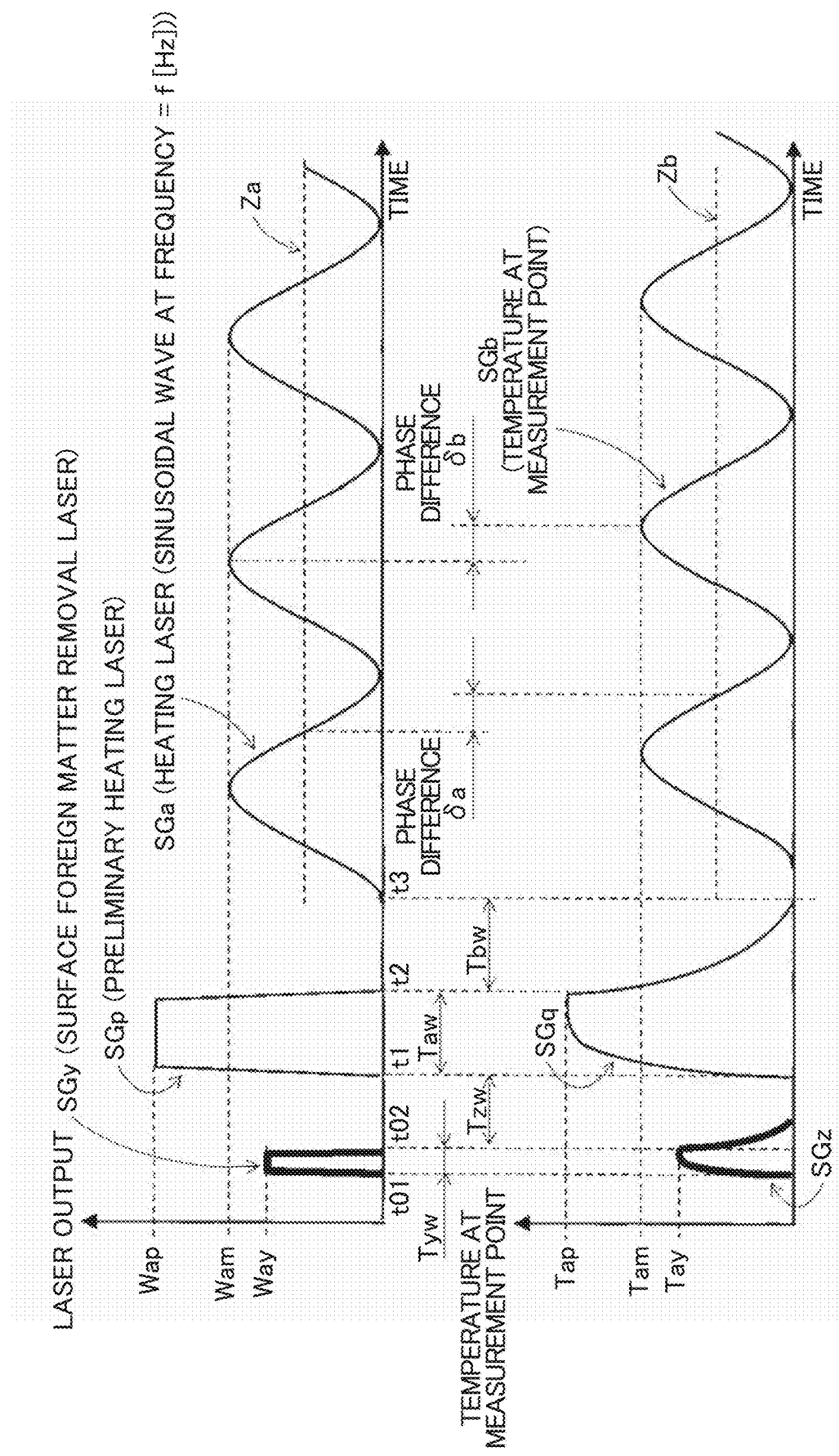
FIG. 38 illustrates an example of the state of irradiation of the measurement point with laser and temperature variations at the measurement point according to the sixth embodiment.

Thus, before the preliminary heating laser is radiated, surface foreign matter removal laser Ly is radiated to the measurement point SP and an area around the measurement point SP as illustrated in FIGS. 34 and 35 to move (push out) the foreign matter deposition laser Y1 out of the outer peripheral portion which is adjacent to the measurement point SP. The surface foreign matter removal laser Ly can be emitted from the same laser output device that emits the preliminary heating laser. As indicated in FIG. 38, an output intensity Way of the surface foreign matter removal laser SGy is set to an output intensity that is lower than a (maximum) output intensity Wam of the heating laser and that is lower than the output intensity Wap of the preliminary heating laser. The output intensity Way of the surface foreign matter removal laser Ly is set to an output intensity that enables the foreign matter within the irradiation range to be fused, in accordance with the type etc. of the foreign matter. In the case where the irradiation energy of the surface foreign matter removal laser Ly is defined as E, the temperature rise width is defined as $\Delta T$, the specific heat is defined as c, the laser diameter is defined as d, the depth is defined as H, and the density is defined as $\rho$, the irradiation energy E is decided on the basis of the following (Formula 1).

$$E=\Delta T*(\pi/4)*d^2*H*\rho*c \qquad \text{(Formula 1)}$$

The irradiation diameter of the surface foreign matter removal laser Ly is set to a surface foreign matter removal diameter RC (see FIG. 35), which is larger than the irradiation diameter (measurement point diameter RA which is the diameter of the measurement point SP in the example of FIG. 35) of the measurement point SP with the heating laser. Thus, in FIG. 35, the surface foreign matter removal laser fuses the foreign matter (foreign matter deposition laser Y1) in the surface foreign matter removal diameter RC, and pushes the foreign matter out of a surface foreign matter removal region Ya (region of irradiation with the surface foreign matter removal laser). For example, in the case where the measurement point diameter RA of the measurement point SP is about 200 [μm] in FIG. 35, the surface foreign matter removal diameter RC is set to about 300 to 400 [μm]. The determination device 70 can adjust the surface foreign matter removal diameter RC by controlling the Z-axis direction moving unit 77Z illustrated in FIGS. 4 and 5. The surface foreign matter removal region Ya is substantially concentric with the measurement point SP, and covers (surrounds) the measurement point SP. The surface foreign matter removal diameter RC is set to a diameter with which infrared light from the foreign matter which is pushed out to the outer periphery of the surface foreign matter removal region Ya does not affect detection of infrared light radiated from the measurement point SP.

The irradiation time of the surface foreign matter removal laser Ly is set to a surface foreign matter removal irradiation time Tyw (see FIG. 38) that is shorter than the irradiation time (preliminary heating time Taw in FIG. 38) of the preliminary heating laser. For example, in the case where the preliminary heating time in FIG. 38 is about 100 [ms], the surface foreign matter removal irradiation time Tyw may be less than about 1 [ms]. The surface foreign matter removal irradiation time Tyw is set to a time that enables the foreign matter in the surface foreign matter removal region Ya to be fused and pushed out to the outer periphery of the surface foreign matter removal region Ya when the surface foreign matter removal region Ya which includes the measurement point SP is irradiated with the surface foreign matter removal laser Ly at the output intensity Way described above with the surface foreign matter removal diameter RC described above. For example, the range of the surface foreign matter removal irradiation time Tyw is obtained through a simulation that uses the type of the matter (foreign matter) which adhered in the preceding process (such as the type, the melting point, etc. of the flux and the organic solvent), the material of the first member, the output intensity (irradiation energy) of the surface foreign matter removal laser Ly, the surface foreign matter removal diameter RC, etc., and an appropriate value of the surface foreign matter removal irradiation time Tyw is decided from the range.

Next, an example of the process procedure for the determination device 70 and the phase difference detection device 60 will be described with reference to the flowchart illustrated in FIG. 36(a) and FIG. 36(b). The flowchart according to the sixth embodiment illustrated in FIG. 36(a) and FIG. 36(b) differs from the flowchart according to the first embodiment illustrated in FIG. 14(a) and FIG. 14(b) in that steps S30A to S30E (surface foreign matter removal process) have been added, and the other steps in the flowchart according to the sixth embodiment are the same as those in the flowchart according to the first embodiment. The differences will be mainly described below.

In the case where the process proceeds to step S30, the determination device 70 determines the presence or absence of a measurement instruction from the operator. In the case where there is a measurement instruction (Yes), the process proceeds to step S30A. In the case where there is no measurement instruction (No), the process returns to step S30.

In the case where the process proceeds to step S30A, the determination device 70 reads the "surface foreign matter removal laser irradiation diameter" corresponding to the product number using determination information H01 (see FIG. 37). The determination device 70 adjusts the position of the measurement target object with respect to the light condensing unit 10 by controlling the Z-axis direction moving unit 77Z (see FIGS. 4 and 5) so as to achieve the read "surface foreign matter removal laser irradiation diameter". Then, the process proceeds to step S30B. The determination information H01 (see FIG. 37) according to the sixth embodiment is obtained by adding "surface foreign matter removal laser output", "surface foreign matter removal laser irradiation time", "surface foreign matter removal laser irradiation diameter", and "stand-by time 1" (symbol H01A in FIG. 37) to the determination information H1 according to the first embodiment indicated in FIG. 15.

In step S30B, the determination device 70 reads the "surface foreign matter removal laser output" and the "surface foreign matter removal laser irradiation time" corresponding to the product number using the determination information H01 (see FIG. 37). The determination device 70 causes the laser output device to emit laser (surface foreign matter removal laser) with an output intensity set to the "surface foreign matter removal laser output". Then, the process proceeds to step S30C.

In step S30C, the determination device 70 determines whether or not the "surface foreign matter removal laser irradiation time" (surface foreign matter removal irradiation time) has elapsed since radiation of the surface foreign matter removal laser is started. In the case where the surface foreign matter removal laser irradiation time has elapsed (Yes), the process proceeds to step S30D. In the case where the surface foreign matter removal laser irradiation time has not elapsed (No), the process returns to step S30B.

In the case where the process proceeds to step S30D, the determination device 70 stops radiation of the surface foreign matter removal laser. Then, the process proceeds to step S30E.

In step S30E, the determination device 70 reads the "stand-by time 1" corresponding to the product number using the determination information H01 (see FIG. 37). The determination device 70 determines whether or not the "stand-by time 1" has elapsed since the surface foreign matter removal laser is stopped. In the case where the stand-by time 1 has elapsed (Yes), the process proceeds to step S31A. In the case where the stand-by time 1 has not elapsed (No), the process returns to step S30E. The subsequent processes are the same as those in the flowchart according to the first embodiment illustrated in FIG. 14(a) and FIG. 14(b), and thus will not be described.

Steps S30A to S30E described above correspond to a surface foreign matter removal step, which is performed before the preliminary heating step, of removing foreign matter adhering to the measurement point and an area around the measurement point by radiating, toward the measurement point SP, surface foreign matter removal laser at an output intensity that is lower than the output intensity of the preliminary heating laser for a surface foreign matter removal irradiation time that is shorter than the irradiation time of the preliminary heating laser such that the irradiation diameter of the surface foreign matter removal laser is larger than the irradiation diameter of the heating laser.

Through the process procedure described above, the surface foreign matter removal laser (SGy) is radiated before the preliminary heating laser (SGp) is radiated as indicated in FIG. 38. The output intensity Way of the surface foreign matter removal laser (SGy) is lower than the output intensity Wap of the preliminary heating laser (SGp), and lower than the (maximum) output intensity Wam of the heating laser (SGa). The irradiation time (surface foreign matter removal irradiation time Tyw) of the surface foreign matter removal laser (SGy) is shorter than the irradiation time (preliminary heating time Taw) of the preliminary heating laser (SGp). An appropriate stand-by time Tzw is set since radiation of the surface foreign matter removal laser (SGy) is finished until radiation of the preliminary heating laser (SGp) is started.

Figure 36A:
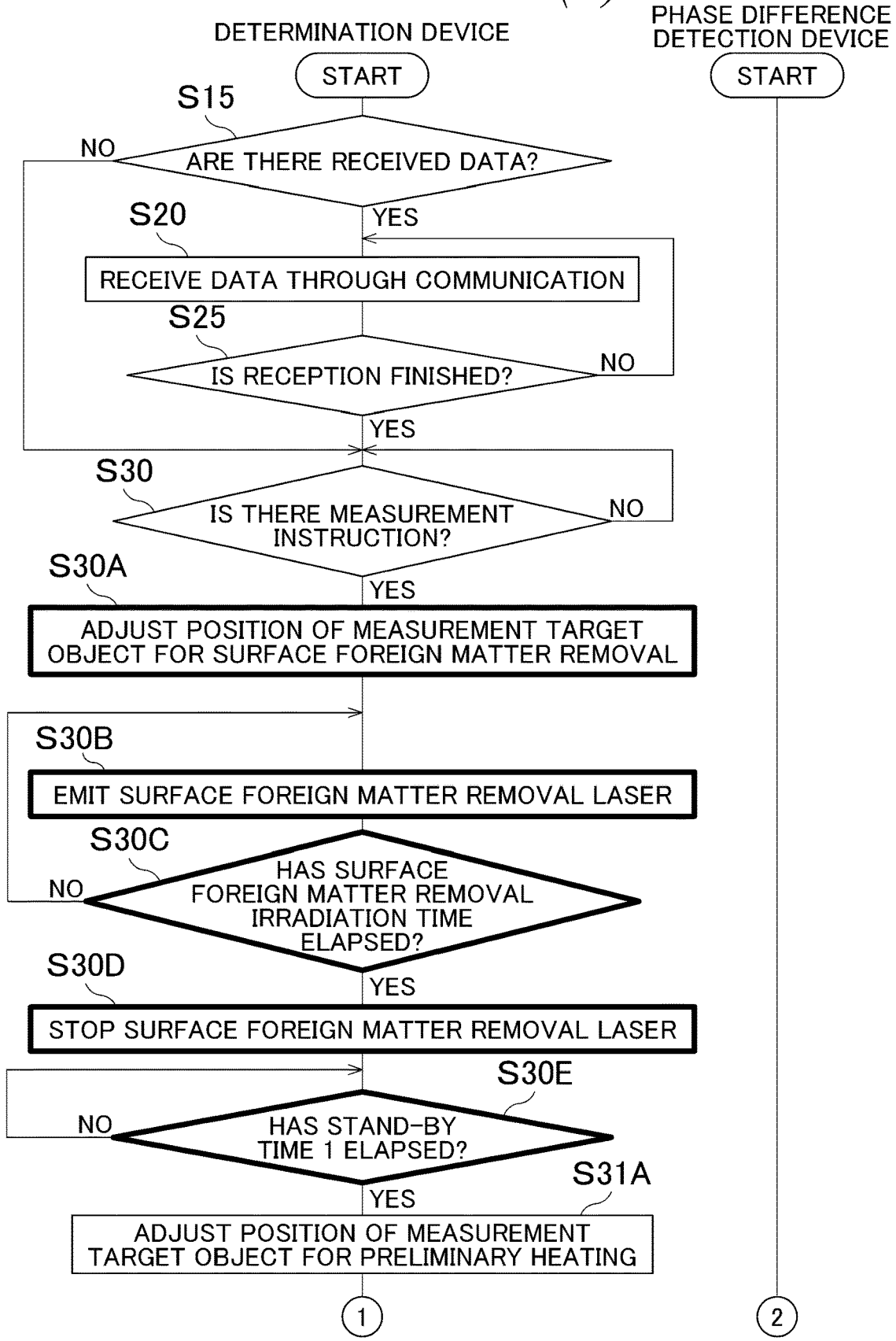
FIG. 36(a) and FIG. 36(b) are a flowchart illustrating an example of the process procedure for a determination device and a phase difference detection device according to the sixth embodiment.
Figure 36B:
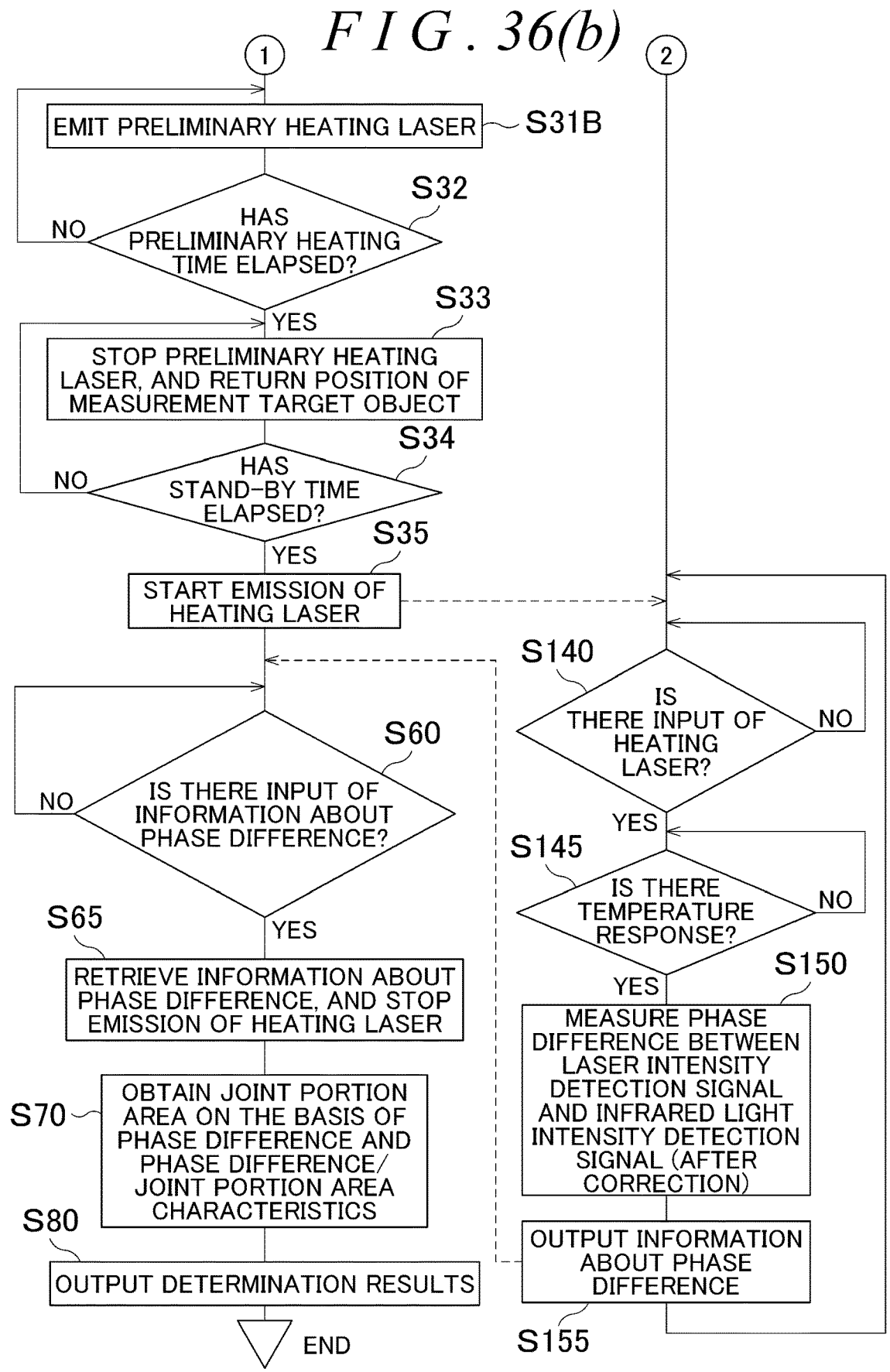

As described above, with the sixth embodiment, in which the "surface foreign matter removal process" in steps S30A to S30E of FIG. 36(a) is added before the preliminary heating process, foreign matter such as flux and an organic solvent can be removed appropriately from the measurement point and an area around the measurement point even in the case where the foreign matter adheres to the surface at the measurement point SP. Consequently, noise due to the foreign matter can be removed appropriately (see the signal SGb in FIG. 38) from the temperature at the measurement point compared to FIG. 33 in which the "surface foreign matter removal process" is not performed. Thus, the joint state can be determined more appropriately.

Next, an optical non-destructive inspection apparatus and an optical non-destructive inspection method according to a seventh embodiment will be described with reference to FIGS. 39(a) to 41. An overall configuration of the optical non-destructive inspection apparatus according to the seventh embodiment is the same as that of the optical non-destructive inspection apparatus according to the second embodiment illustrated in FIGS. 19 and 20, and thus will not be described. The seventh embodiment differs from the second embodiment, in which the preliminary heating laser is emitted before the heating laser is emitted, in that surface foreign matter removal laser is emitted further before the preliminary heating laser is emitted. Differences from the second embodiment will be mainly described below.

The seventh embodiment is the same as the sixth embodiment in the foreign matter which adheres to the surface at the measurement point SP, in the fact that noise is superposed on the temperature at the measurement point because of the foreign matter, and in the output intensity, the irradiation diameter, the irradiation time, etc. of the surface foreign matter removal laser, and thus such features will not be described.

Figure 39B:
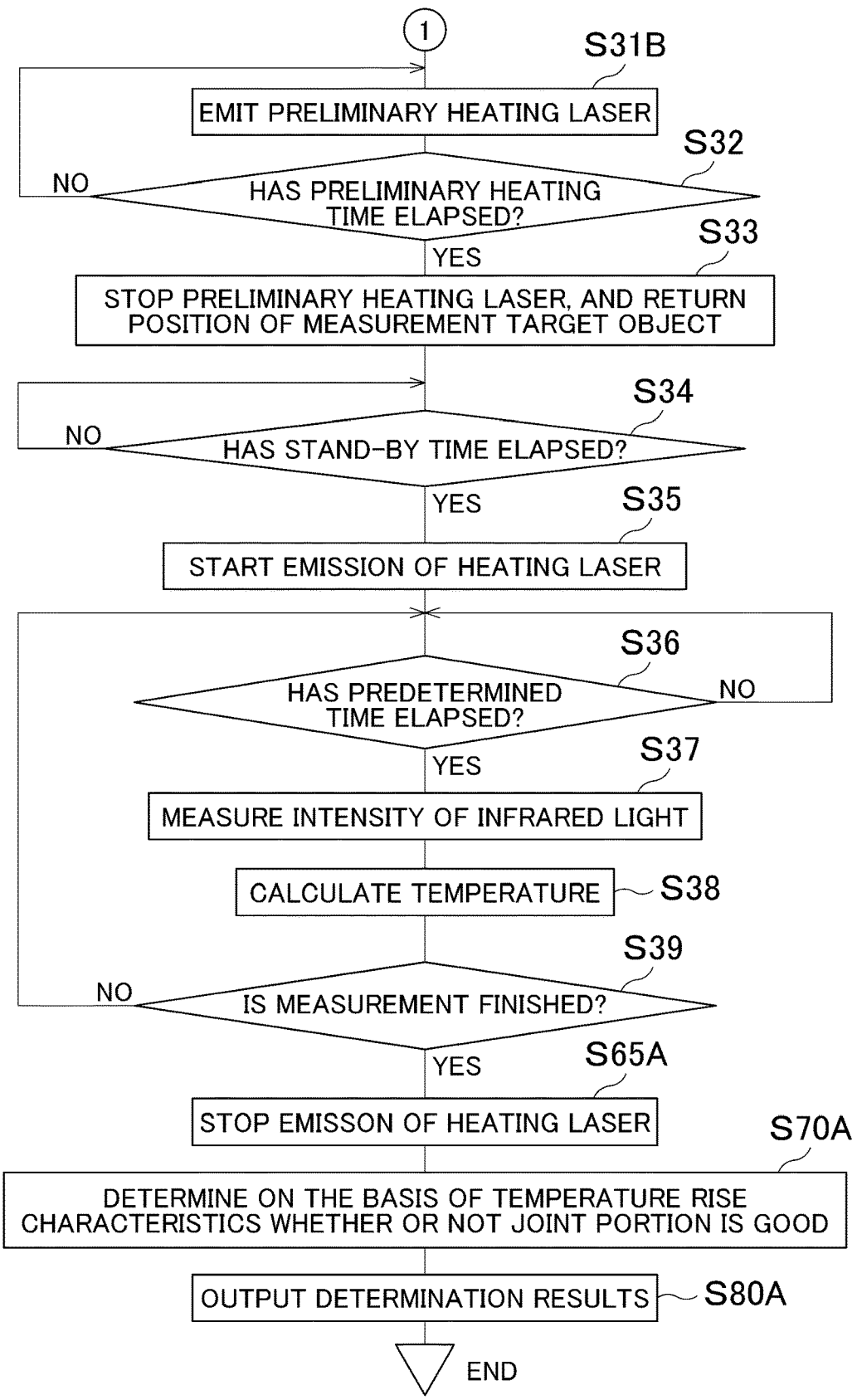

Next, an example of the process procedure for the determination device 70 will be described with reference to the flowchart illustrated in FIG. 39(a) and FIG. 39(b). The flowchart according to the seventh embodiment illustrated in FIG. 39(a) and FIG. 39(b) differs from the flowchart according to the second embodiment illustrated in FIG. 21(a) and FIG. 21(b) in that steps S30A to 530E (surface foreign matter removal process) have been added, and the other steps in the flowchart according to the seventh embodiment are the same as those in the flowchart according to the second embodiment. The differences will be mainly described below.

In the case where the process proceeds to step S30, the determination device 70 determines the presence or absence of a measurement instruction from the operator. In the case where there is a measurement instruction (Yes), the process proceeds to step S30A. In the case where there is no measurement instruction (No), the process returns to step S30.

In the case where the process proceeds to step S30A, the determination device 70 reads the "surface foreign matter removal laser irradiation diameter" corresponding to the product number using determination information H02 (see FIG. 40). The determination device 70 adjusts the position of the measurement target object with respect to the light condensing unit 10 by controlling the Z-axis direction moving unit 77Z (see FIGS. 19 and 20) so as to achieve the read "surface foreign matter removal laser irradiation diameter". Then, the process proceeds to step S30B. The determination information H02 (see FIG. 40) according to the seventh embodiment is obtained by adding "surface foreign matter removal laser output", "surface foreign matter removal laser irradiation time", "surface foreign matter removal laser irradiation diameter", and "stand-by time 1" (symbol H02A in FIG. 40) to the determination information H2 according to the second embodiment indicated in FIG. 22.

In step S30B, the determination device 70 reads the "surface foreign matter removal laser output" and the "surface foreign matter removal laser irradiation time" corresponding to the product number using the determination information H02 (see FIG. 40). The determination device 70 causes the laser output device to emit laser (surface foreign matter removal laser) with an output intensity set to the "surface foreign matter removal laser output". Then, the process proceeds to step S30C.

In step S30C, the determination device 70 determines whether or not the "surface foreign matter removal laser irradiation time" (surface foreign matter removal irradiation time) has elapsed since radiation of the surface foreign matter removal laser is started. In the case where the surface foreign matter removal laser irradiation time has elapsed (Yes), the process proceeds to step S30D. In the case where the surface foreign matter removal laser irradiation time has not elapsed (No), the process returns to step S30B.

In the case where the process proceeds to step S30D, the determination device 70 stops radiation of the surface foreign matter removal laser. Then, the process proceeds to step S30E.

In step S30E, the determination device 70 reads the "stand-by time 1" corresponding to the product number using the determination information H02 (see FIG. 40). The determination device 70 determines whether or not the "stand-by time 1" has elapsed since the surface foreign matter removal laser is stopped. In the case where the stand-by time 1 has elapsed (Yes), the process proceeds to step S31A. In the case where the stand-by time 1 has not elapsed (No), the process returns to step S30E. The subsequent processes are the same as those in the flowchart according to the second embodiment illustrated in FIG. 21(a) and FIG. 21(b), and thus will not be described.

Steps S30A to S30E described above correspond to a surface foreign matter removal step, which is performed before the preliminary heating step, of removing foreign matter adhering to the measurement point and an area around the measurement point by radiating, toward the measurement point SP, surface foreign matter removal laser at an output intensity that is lower than the output intensity of the preliminary heating laser for a surface foreign matter removal irradiation time that is shorter than the irradiation time of the preliminary heating laser such that the irradiation diameter of the surface foreign matter removal laser is larger than the irradiation diameter of the heating laser.

Figure 41:
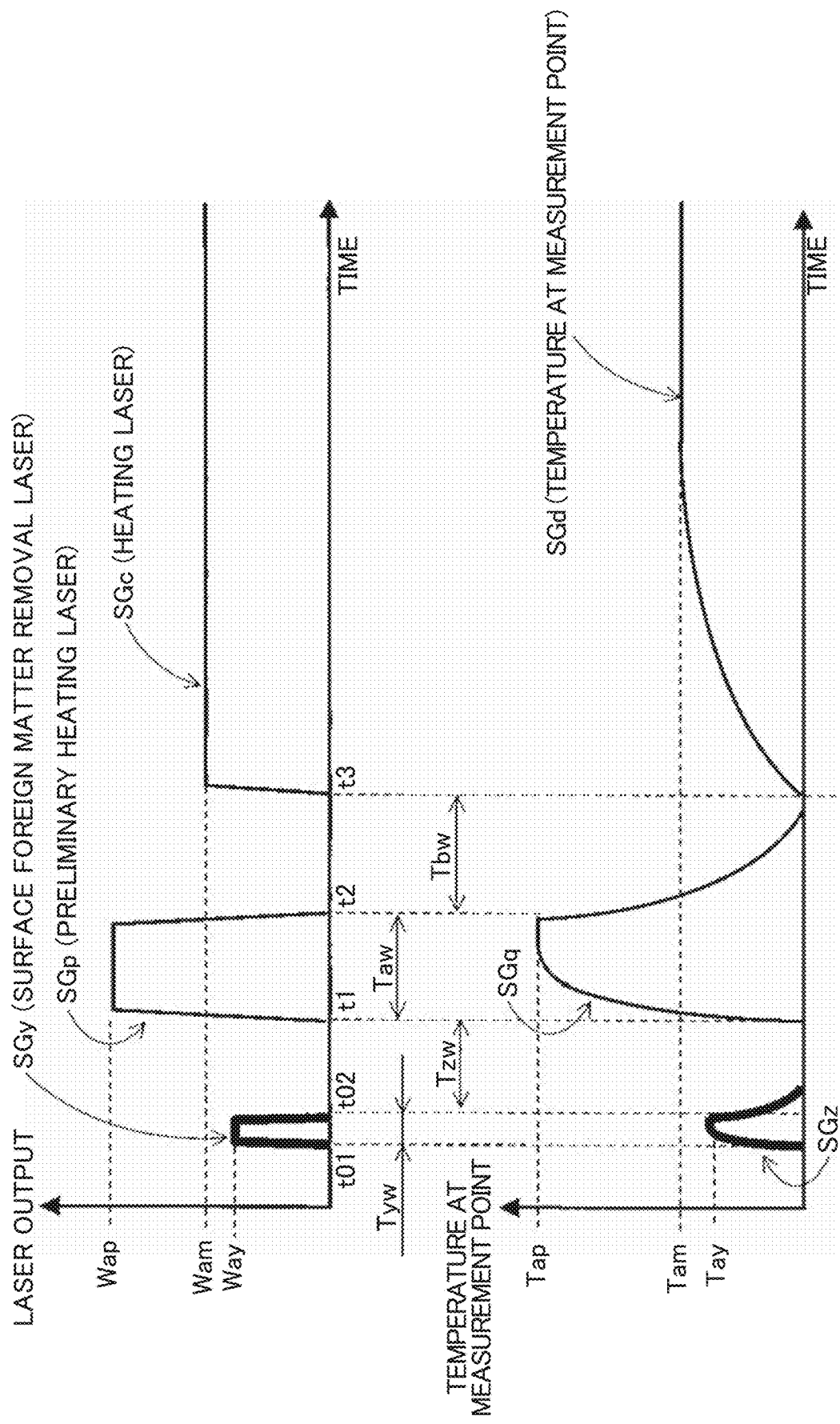
FIG. 41 illustrates an example of the state of irradiation of the measurement point with laser and temperature variations at the measurement point according to the seventh embodiment.

Through the process procedure described above, the surface foreign matter removal laser (SGy) is radiated before the preliminary heating laser (SGp) is radiated as indicated in FIG. 41. The output intensity Way of the surface foreign matter removal laser (SGy) is lower than the output intensity Wap of the preliminary heating laser (SGp), and lower than the (maximum) output intensity Wam of the heating laser (SGc). The irradiation time (surface foreign matter removal irradiation time Tyw) of the surface foreign matter removal laser (SGy) is shorter than the irradiation time (preliminary heating time Taw) of the preliminary heating laser (SGp). An appropriate stand-by time Tzw is set since radiation of the surface foreign matter removal laser (SGy) is finished until radiation of the preliminary heating laser (SGp) is started.

In the seventh embodiment, as described above, the "surface foreign matter removal process" in steps S30A to S30E of FIG. 39(a) is added before the preliminary heating process. As a result, even in the case where foreign matter such as flux and an organic solvent adheres to the surface at the measurement point, the foreign matter can be removed appropriately from the measurement point and an area around the measurement point. Consequently, noise due to the foreign matter can be removed appropriately (see the signal SGd in FIG. 41) from the temperature at the measurement point. Thus, the joint state can be determined more appropriately.

In the seventh embodiment, steps S30A to S30E (surface foreign matter removal process) have been added to the processes according to the second embodiment. However, a similar addition may be made to the processes according to the fifth embodiment (see FIG. 31).

The configuration, the appearance, etc. of the optical non-destructive inspection apparatus and the process procedure etc. of the optical non-destructive inspection method according to the present invention may be modified, added, and deleted in various ways without departing from the scope and spirit of the present invention.

In the description of the embodiments, the measurement target object includes the wire 91 as the first member and the electrode 92 as the second member which are joined to each other by wire bonding. The present invention is also applicable to a variety of measurement target objects such as a measurement target object in which an electronic chip part as the first member and a printed substrate electrode as the second member are joined to each other by soldering (a joint member) and a measurement target object in which a bonding wire as the first member and a semiconductor chip frame as the second member are joined to each other by ultrasonic welding. That is, the present invention is applicable to determine whether or not the joint state is good for a variety of measurement target objects irrespective of the material of the first member, the material of the second member, the presence or absence of a joint member, the joint method, etc.

A variety of types of laser such as infrared light laser, ultraviolet laser, and visible laser can be used as the heating laser. In the description of the embodiments, the phase difference detection device 60 and the determination device 70 are constituted as separate devices. However, the phase difference detection device and the determination device may be constituted as an integrated device.

In the second and fourth embodiments, two infrared light intensity detection units are provided. In the fifth embodiment, one infrared light intensity detection unit is provided. Thus, it is only necessary that at least one infrared light intensity detection unit should be provided.

The numerical values used in the description of the embodiments are exemplary, and the present invention is not limited to such values.

What is claimed is:

1. An optical non-destructive inspection method of determining a joint state of a joint portion on a joint interface between a first member and a second member of a measurement target object on the basis of measurement point information acquired from a measurement point set on a surface of the first member by irradiating the measurement point with heating laser, or on the basis of heating laser information about the heating laser and the measurement point information, the first member and the second member being joined to each other on the joint interface or being joined to each other with a joint member interposed between the first member and the second member on the joint interface, the optical non-destructive inspection method comprising:

a heating laser emission step of emitting the heating laser toward the measurement point to heat the measurement point;
    an information acquisition step of acquiring the measurement point information which includes an intensity of infrared light radiated from the measurement point, or an information acquisition step of acquiring the measurement point information which includes an intensity of infrared light radiated from the measurement point and the heating laser information which includes an intensity of the heating laser which is radiated toward the measurement point;
    a joint state determination step of determining the joint state of the joint portion on the joint interface using acquisition-associated information based on the measurement point information, or the measurement point information and the heating laser information, acquired in the information acquisition step; and
    a preliminary heating step, which is performed before the heating laser emission step, of causing thermal distortion in the first member by irradiating the measurement point, or a preliminary heating range that includes the measurement point, or one or a plurality of preliminary heating points set in advance in the preliminary heating range, with preliminary heating laser adjusted to a thermal distortion generation intensity, which is a constant output intensity, and an irradiation time such that thermal distortion is caused in the first member without destroying the first member.

2. The optical non-destructive inspection method according to claim 1, further comprising:

a surface foreign matter removal step, which is performed before the preliminary heating step, of removing foreign matter adhering to the measurement point and an area around the measurement point by radiating, toward the measurement point, surface foreign matter removal laser at an output intensity that is lower than the output intensity of the preliminary heating laser for a surface foreign matter removal irradiation time that is shorter than the irradiation time of the preliminary heating laser in the preliminary heating step such that an irradiation diameter of the surface foreign matter removal laser is larger than an irradiation diameter of the heating laser at the measurement point.

3. The optical non-destructive inspection method according to claim 2, wherein:

a laser output device, a laser intensity detection unit, an infrared light intensity detection unit, a phase difference detection device, and a determination device are used;
    the heating laser emission step includes the laser output device emitting the heating laser such that the intensity of the heating laser at the measurement point is varied sinusoidally;
    the information acquisition step includes
        the phase difference detection device retrieving a laser intensity detection signal which is the heating laser information which is output from the laser intensity detection unit on the basis of the intensity of the heating laser which is varied sinusoidally at the measurement point, and
        the phase difference detection device retrieving an infrared light intensity detection signal which is the measurement point information which is output from the infrared light intensity detection unit on the basis of the intensity of the infrared light which is radiated from the measurement point and varied sinusoidally; and
    the joint state determination step includes
        the phase difference detection device obtaining a phase difference between the laser intensity detection signal and the infrared light intensity detection signal and outputting the acquisition-associated information which includes the obtained phase difference to the determination device so that the determination device retrieves the acquisition-associated information, and
        the determination device determining the joint state of the joint portion on the joint interface on the basis of the phase difference which is included in the acquisition-associated information.

4. The optical non-destructive inspection method according to claim 2, wherein:

a laser output device, an infrared light intensity detection unit, and a determination device are used;
    the heating laser emission step includes the laser output device emitting, toward the measurement point, the heating laser at a heating intensity which is a constant output intensity;
    the information acquisition step includes the determination device retrieving an infrared light intensity detection signal which is the measurement point information which is output from the infrared light intensity detection unit on the basis of the intensity of the infrared light which is radiated from the measurement point; and
    the joint state determination step includes the determination device determining the joint state of the joint portion on the joint interface on the basis of temperature rise characteristics at the measurement point which are the acquisition-associated information which is obtained from the infrared light intensity detection signal.

5. The optical non-destructive inspection method according to claim 1, wherein:
   a laser output device, a laser intensity detection unit, an infrared light intensity detection unit, a phase difference detection device, and a determination device are used;
   the heating laser emission step includes the laser output device emitting the heating laser such that the intensity of the heating laser at the measurement point is varied sinusoidally;
   the information acquisition step includes
      the phase difference detection device retrieving a laser intensity detection signal which is the heating laser information which is output from the laser intensity detection unit on the basis of the intensity of the heating laser which is varied sinusoidally at the measurement point, and
      the phase difference detection device retrieving an infrared light intensity detection signal which is the measurement point information which is output from the infrared light intensity detection unit on the basis of the intensity of the infrared light which is radiated from the measurement point and varied sinusoidally; and
   the joint state determination step includes
      the phase difference detection device obtaining a phase difference between the laser intensity detection signal and the infrared light intensity detection signal and outputting the acquisition-associated information which includes the obtained phase difference to the determination device so that the determination device retrieves the acquisition-associated information, and
      the determination device determining the joint state of the joint portion on the joint interface on the basis of the phase difference which is included in the acquisition-associated information.

6. The optical non-destructive inspection method according to claim 1, wherein:
   a laser output device, an infrared light intensity detection unit, and a determination device are used;
   the heating laser emission step includes the laser output device emitting, toward the measurement point, the heating laser at a heating intensity which is a constant output intensity;
   the information acquisition step includes the determination device retrieving an infrared light intensity detection signal which is the measurement point information which is output from the infrared light intensity detection unit on the basis of the intensity of the infrared light which is radiated from the measurement point; and
   the joint state determination step includes the determination device determining the joint state of the joint portion on the joint interface on the basis of temperature rise characteristics at the measurement point which are the acquisition-associated information which is obtained from the infrared light intensity detection signal.

7. An optical non-destructive inspection apparatus that determines a joint state of a joint portion on a joint interface between a first member and a second member of a measurement target object on the basis of information acquired from a measurement point set on a surface of the first member by irradiating the measurement point with heating laser, or on the basis of information about the heating laser and the information which is acquired from the measurement point, the first member and the second member being joined to each other on the joint interface or being joined to each other with a joint member interposed between the first member and the second member on the joint interface, the optical non-destructive inspection apparatus comprising:
   a laser output device that emits the heating laser such that an intensity of the heating laser at the measurement point is varied sinusoidally;
   a laser intensity detection unit that outputs a laser intensity detection signal by detecting the intensity of the heating laser which is varied sinusoidally at the measurement point;
   an infrared light intensity detection unit that outputs an infrared light intensity detection signal by detecting an intensity of infrared light radiated from the measurement point and varied sinusoidally;
   a phase difference detection device that retrieves the laser intensity detection signal from the laser intensity detection unit and the infrared light intensity detection signal from the infrared light intensity detection unit, that detects a phase difference between the laser intensity detection signal which is varied sinusoidally and the infrared light intensity detection signal which is varied sinusoidally, and that outputs acquisition-associated information that includes the detected phase difference to a determination device; and
   the determination device which controls the laser output device and which determines the joint state of the joint portion on the joint interface on the basis of the phase difference which is included in the acquisition-associated information which is input from the phase difference detection device, wherein
   before the laser output device emits the heating laser, the determination device controls the laser output device so as to cause thermal distortion in the first member by irradiating the measurement point, or a preliminary heating range that includes the measurement point, or one or a plurality of preliminary heating points set in advance in the preliminary heating range, with preliminary heating laser adjusted to a thermal distortion generation intensity, which is a constant output intensity, and an irradiation time such that thermal distortion is caused in the first member without destroying the first member.

8. The optical non-destructive inspection apparatus according to claim 7, wherein
   before the laser output device emits the preliminary heating laser, the determination device controls the laser output device so as to remove foreign matter adhering to the measurement point and an area around the measurement point by radiating, toward the measurement point, surface foreign matter removal laser at an output intensity that is lower than the output intensity of the preliminary heating laser for a surface foreign matter removal irradiation time that is shorter than the irradiation time of the preliminary heating laser such that an irradiation diameter of the surface foreign matter removal laser is larger than an irradiation diameter of the heating laser at the measurement point.

9. An optical non-destructive inspection apparatus that determines a joint state of a joint portion on a joint interface between a first member and a second member of a measurement target object on the basis of information acquired from a measurement point set on a surface of the first member by irradiating the measurement point with heating laser, the first member and the second member being joined to each other on the joint interface or being joined to each other with a joint member interposed between the first member and the second member on the joint interface, the optical non-destructive inspection apparatus comprising:

- a laser output device that emits the heating laser at a heating intensity, which is a constant output intensity, toward the measurement point;
- at least one infrared light intensity detection unit that outputs an infrared light intensity detection signal by detecting an intensity of infrared light radiated from the measurement point; and
- a determination device that controls the laser output device and that determines the joint state of the joint portion on the joint interface on the basis of temperature rise characteristics at the measurement point obtained from the infrared light intensity detection signal which is retrieved from the infrared light intensity detection unit, wherein before the laser output device emits the heating laser, the determination device controls the laser output device so as to cause thermal distortion in the first member by irradiating the measurement point, or a preliminary heating range which is a range that includes the measurement point, or one or a plurality of preliminary heating points set in advance in the preliminary heating range, with preliminary heating laser adjusted to a thermal distortion generation intensity, which is a constant output intensity, and an irradiation time such that thermal distortion is caused in the first member without destroying the first member.

10. The optical non-destructive inspection apparatus according to claim 9, wherein before the laser output device emits the preliminary heating laser, the determination device controls the laser output device so as to remove foreign matter adhering to the measurement point and an area around the measurement point by radiating, toward the measurement point, surface foreign matter removal laser at an output intensity that is lower than the output intensity of the preliminary heating laser for a surface foreign matter removal irradiation time that is shorter than the irradiation time of the preliminary heating laser such that an irradiation diameter of the surface foreign matter removal laser is larger than an irradiation diameter of the heating laser at the measurement point.

* * * * *